US011450665B2

(12) United States Patent
Chiang et al.

(10) Patent No.: US 11,450,665 B2
(45) Date of Patent: Sep. 20, 2022

(54) SEMICONDUCTOR STRUCTURE WITH SELF-ALIGNED BACKSIDE POWER RAIL

(71) Applicant: Taiwan Semiconductor Manufacturing Co., Ltd., Hsin-Chu (TW)

(72) Inventors: Kuo-Cheng Chiang, Hsinchu County (TW); Shi Ning Ju, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/082,329

(22) Filed: Oct. 28, 2020

(65) Prior Publication Data
US 2021/0305252 A1 Sep. 30, 2021

Related U.S. Application Data

(60) Provisional application No. 63/001,819, filed on Mar. 30, 2020.

(51) Int. Cl.
*H01L 27/092* (2006.01)
*H01L 29/78* (2006.01)
(Continued)

(52) U.S. Cl.
CPC .. *H01L 27/0924* (2013.01); *H01L 21/823418* (2013.01); *H01L 21/823431* (2013.01);
(Continued)

(58) Field of Classification Search
CPC ........ H01L 27/0924; H01L 21/823418; H01L 21/823431; H01L 29/66795; H01L 29/7848; H01L 29/7851; H01L 21/823425; H01L 21/823481; H01L 21/76897; H01L 21/823475; H01L 21/84; H01L 27/088; H01L 29/0847; H01L 29/456; H01L 29/66545; H01L 29/66439; H01L 23/528;
(Continued)

(56) References Cited

U.S. PATENT DOCUMENTS 10,020,261 B2 7/2018 Wu et al.
10,269,715 B2 4/2019 Wu et al.
(Continued)

*Primary Examiner* — Karen Kusumakar
*Assistant Examiner* — Adam S Bowen
(74) *Attorney, Agent, or Firm* — Haynes and Boone, LLP

(57) ABSTRACT

The present disclosure provides a semiconductor structure that includes a substrate having a frontside and a backside; an active region extruded from the substrate and surrounded by an isolation feature; a gate stack formed on the front side of the substrate and disposed on the active region; a first and a second source/drain (S/D) feature formed on the active region and interposed by the gate stack; a frontside contact feature disposed on a top surface of the first S/D feature; a backside contact feature disposed on and electrically connected to a bottom surface of the second S/D feature; and a semiconductor layer disposed on a bottom surface of the first S/D feature with a first thickness and a bottom surface of the gate stack with a second thickness being greater than the first thickness.

20 Claims, 46 Drawing Sheets

(51) Int. Cl.
*H01L 21/8234* (2006.01)
*H01L 29/66* (2006.01)

(52) U.S. Cl.
CPC .... *H01L 29/66795* (2013.01); *H01L 29/7848* (2013.01); *H01L 29/7851* (2013.01)

(58) Field of Classification Search
CPC ........... H01L 29/0673; H01L 29/42392; H01L 29/78696
See application file for complete search history.

(56) References Cited

U.S. PATENT DOCUMENTS

| | | |
|---|---|---|
| 10,282,504 B2 | 5/2019 | Wu et al. |
| 2013/0231824 A1 | 9/2013 | Wilson et al. |
| 2018/0151450 A1* | 5/2018 | Ching ............... H01L 29/42392 |
| 2019/0157310 A1 | 5/2019 | Glass et al. |
| 2019/0288004 A1* | 9/2019 | Smith ............... H01L 27/11807 |
| 2020/0044087 A1* | 2/2020 | Guha ................ H01L 29/42392 |

* cited by examiner

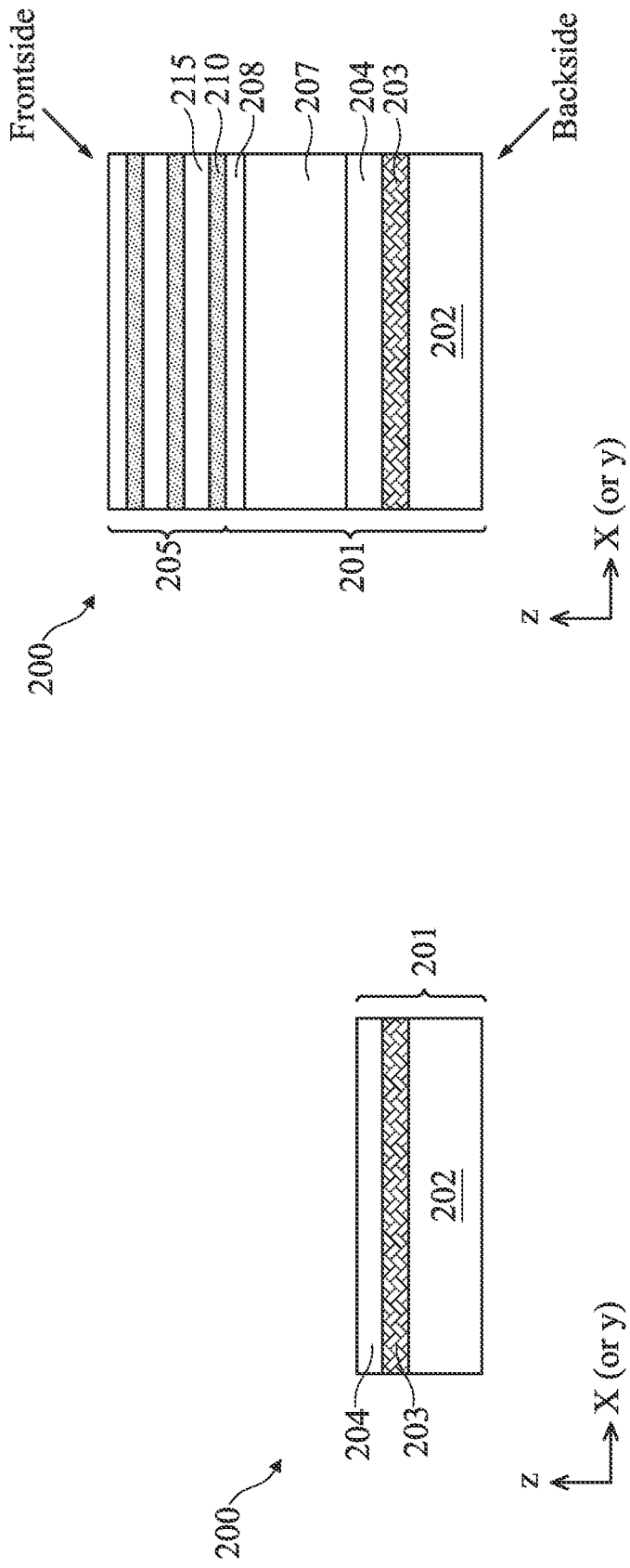

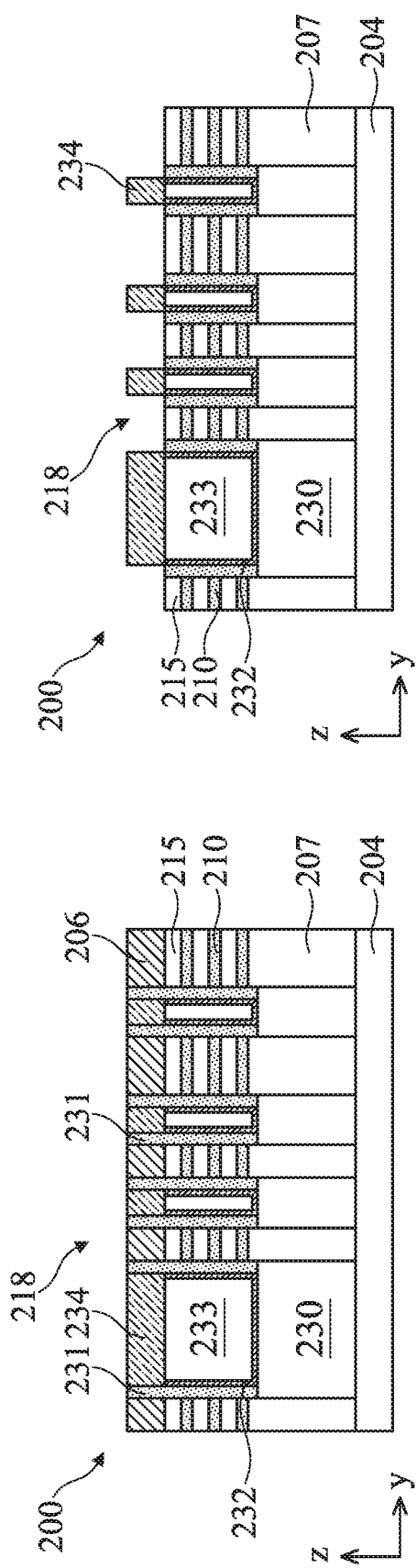
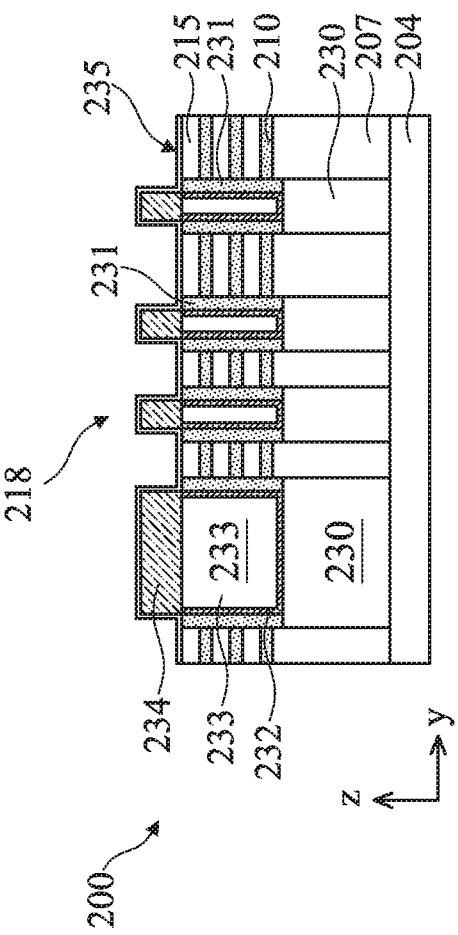
FIG. 5E
FIG. 5F
FIG. 5G

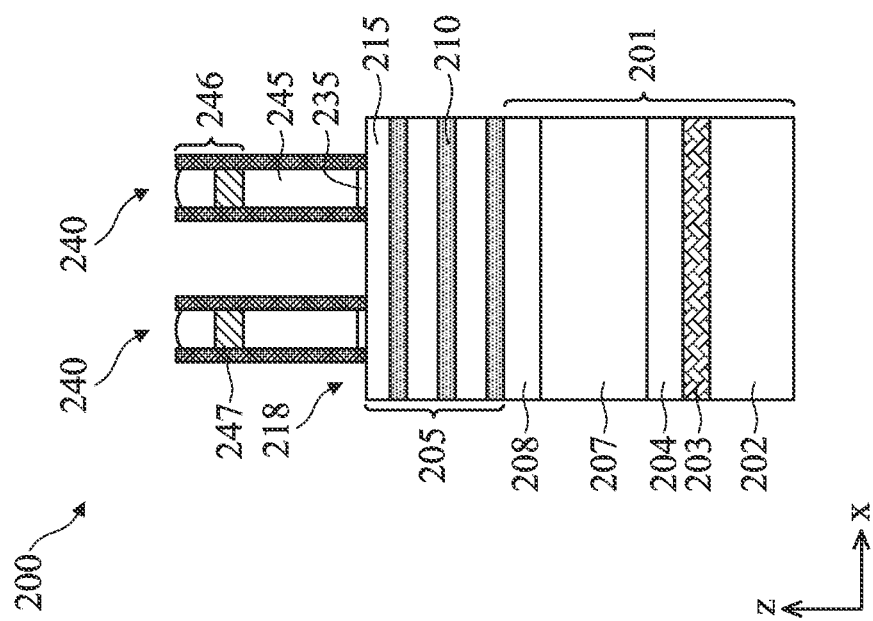
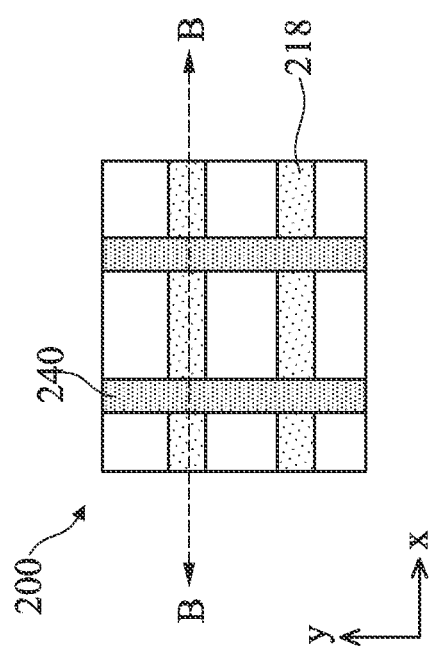
FIG. 6A
FIG. 6B

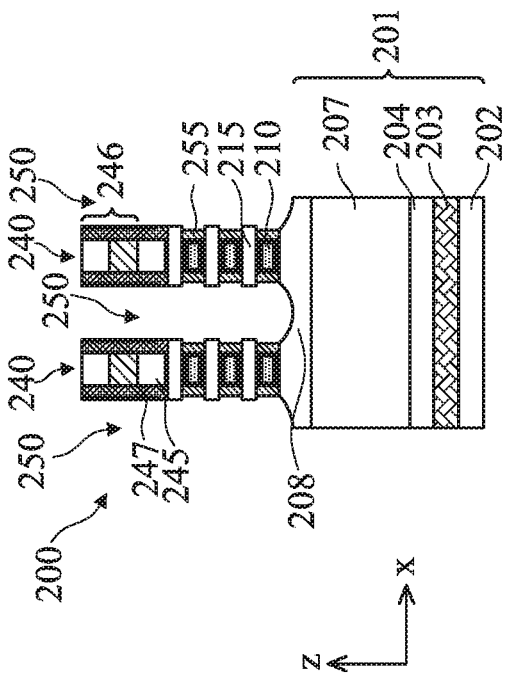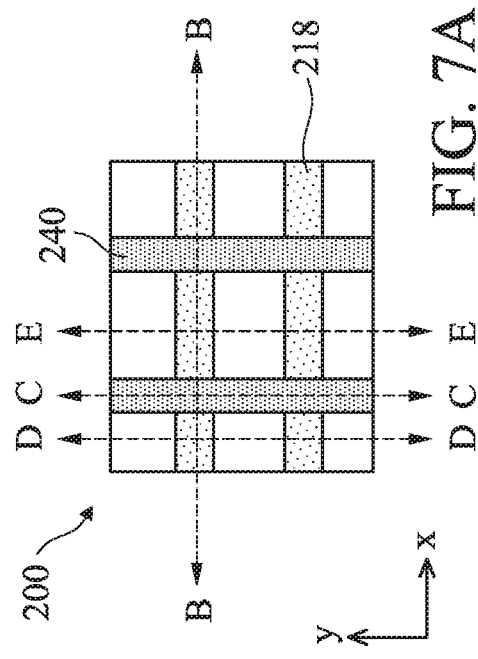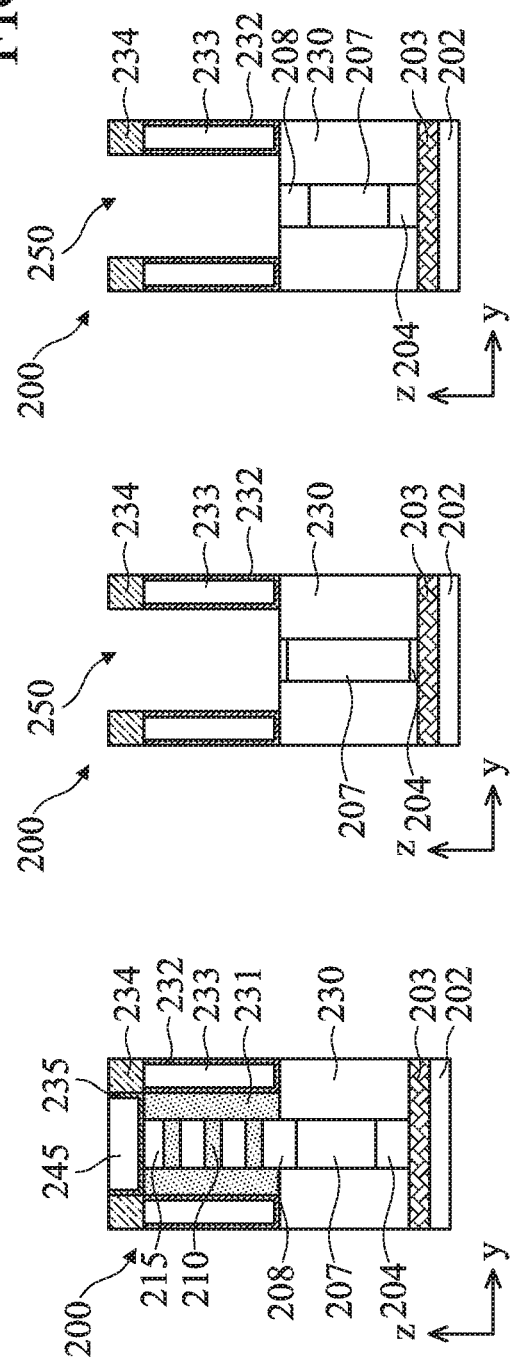

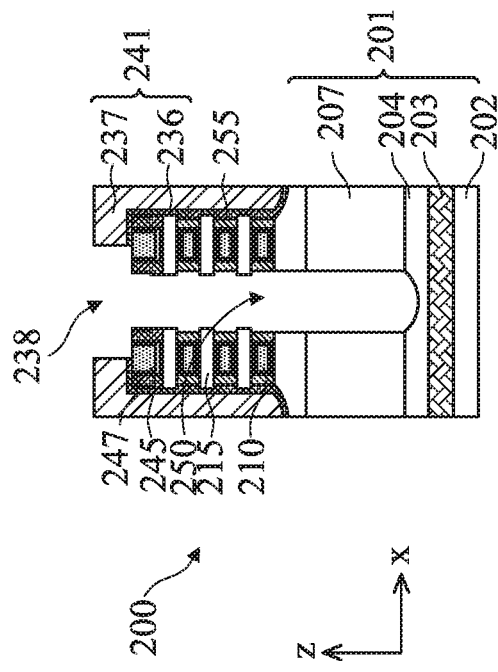
FIG. 8A
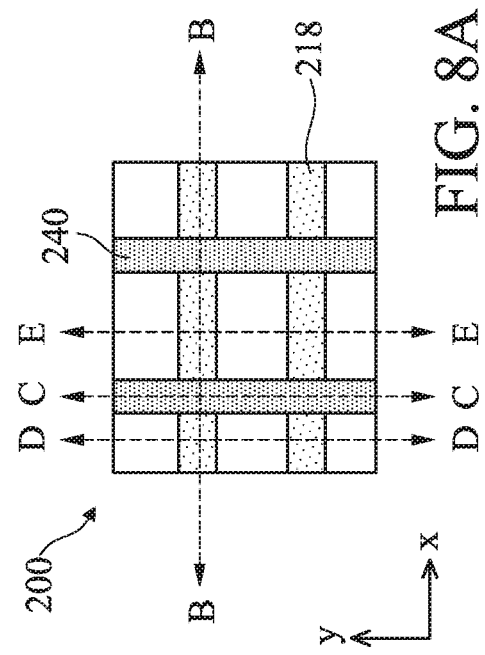
FIG. 8B
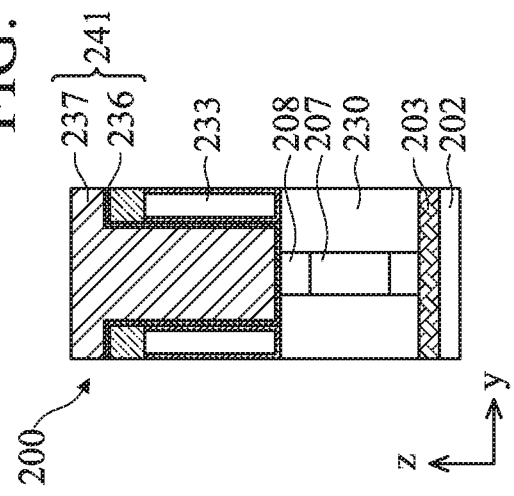
FIG. 8E
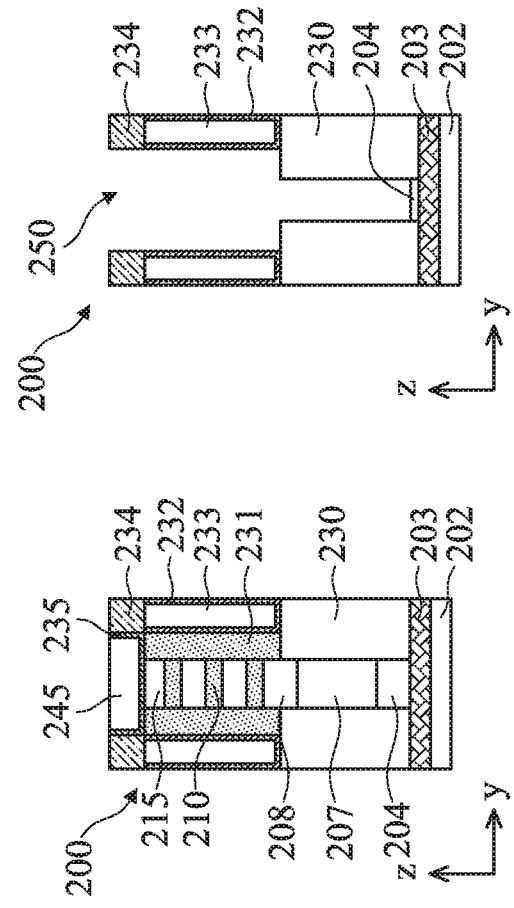
FIG. 8C
FIG. 8D

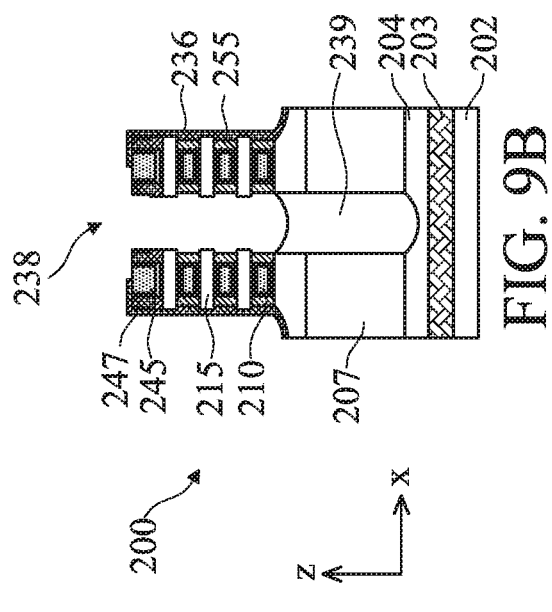
FIG. 9A
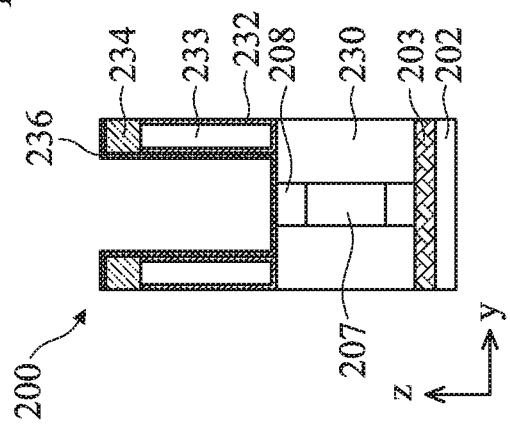
FIG. 9B
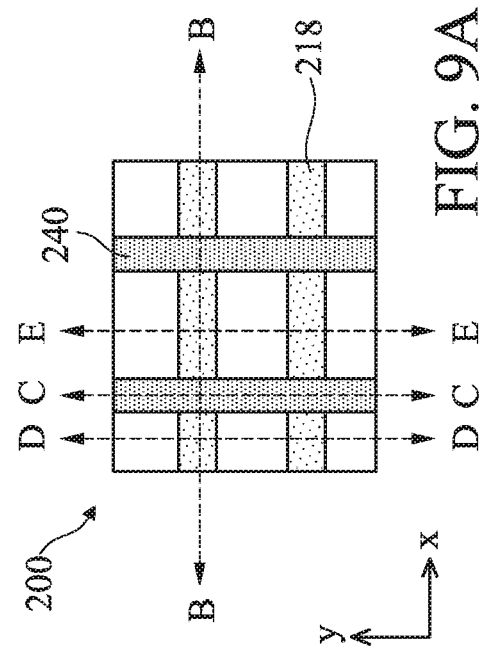
FIG. 9C
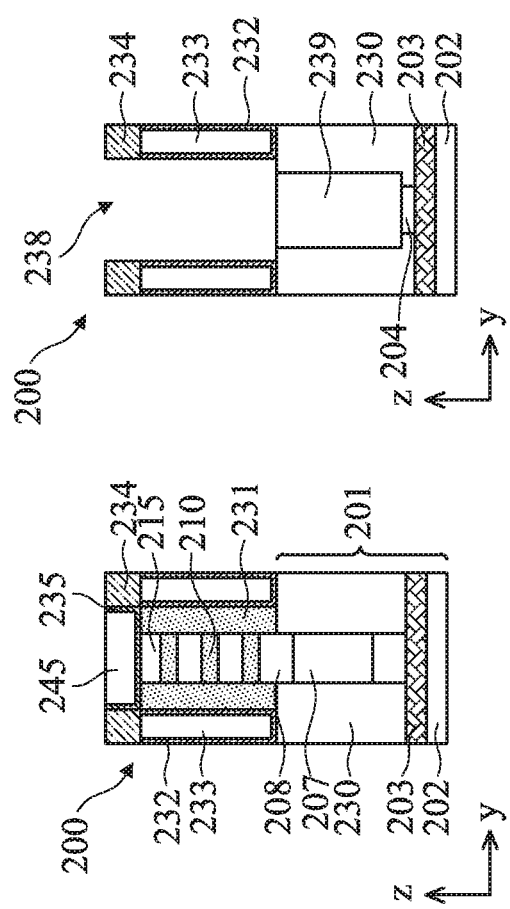
FIG. 9D
FIG. 9E

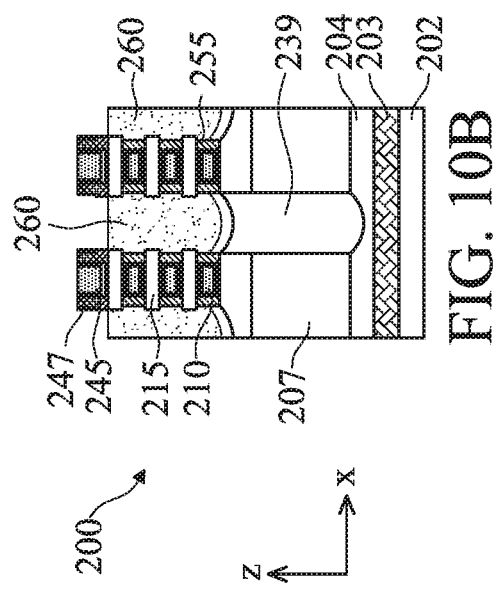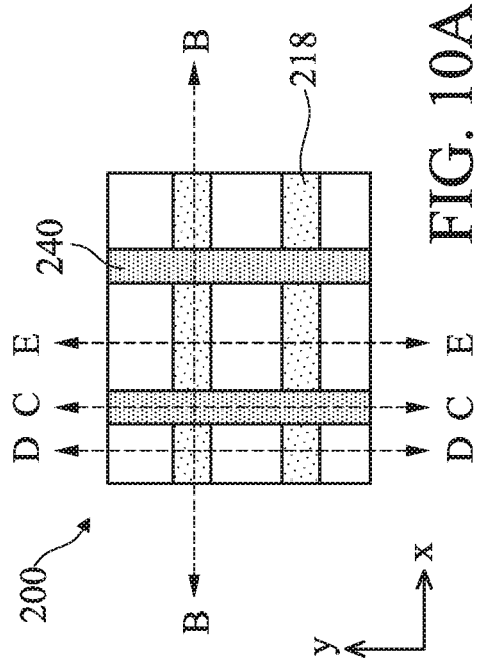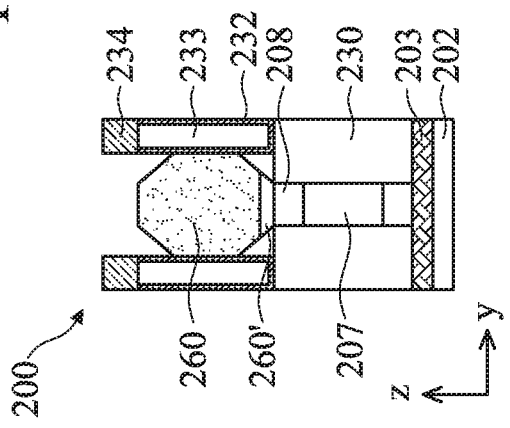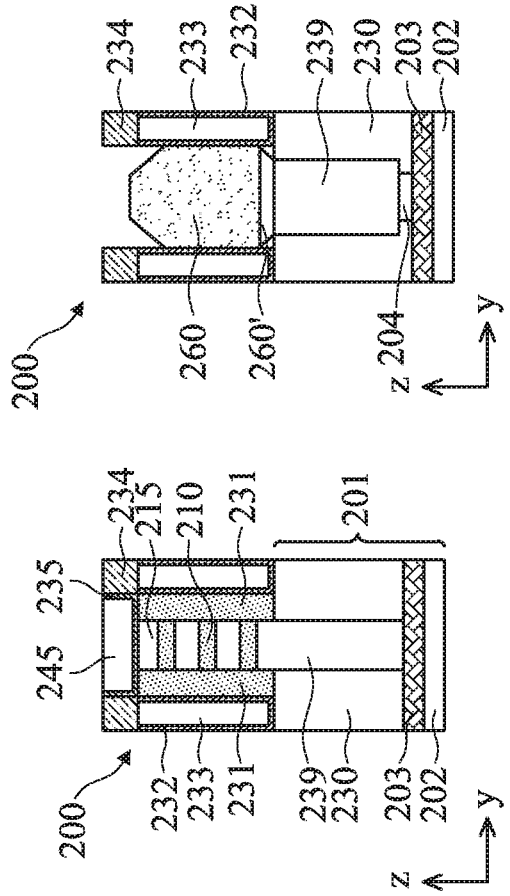
FIG. 10A
FIG. 10B
FIG. 10C
FIG. 10D
FIG. 10E

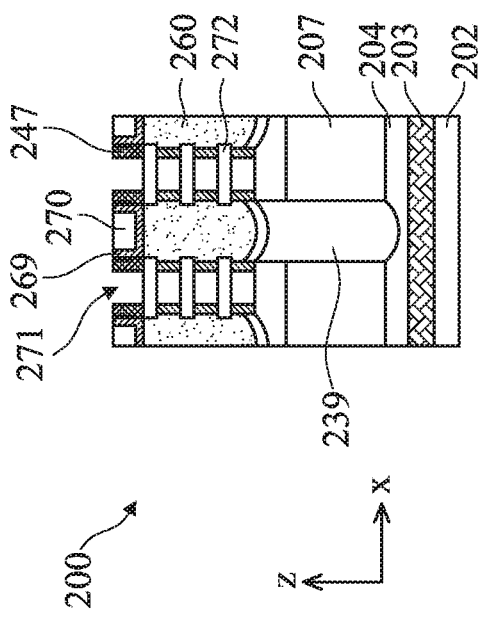
FIG. 11A
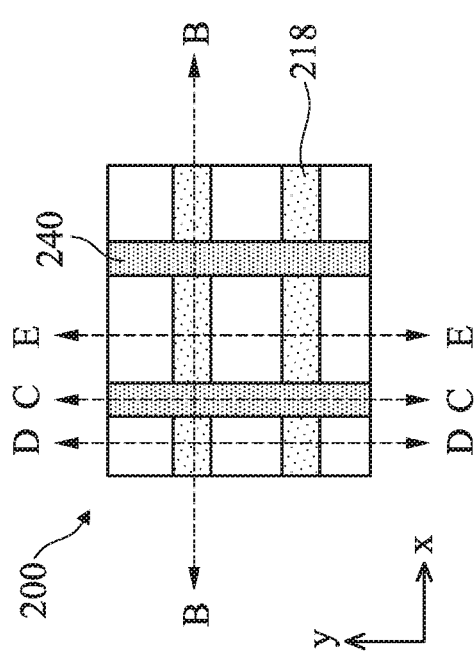
FIG. 11C
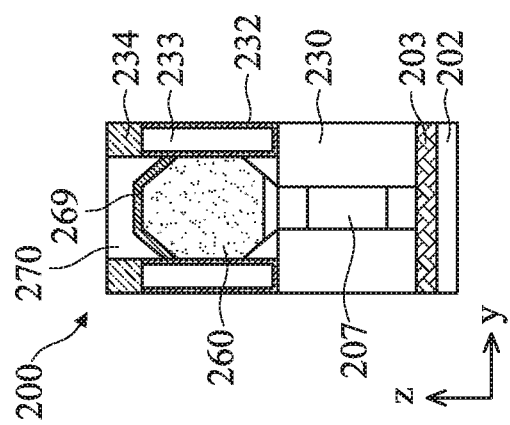
FIG. 11B
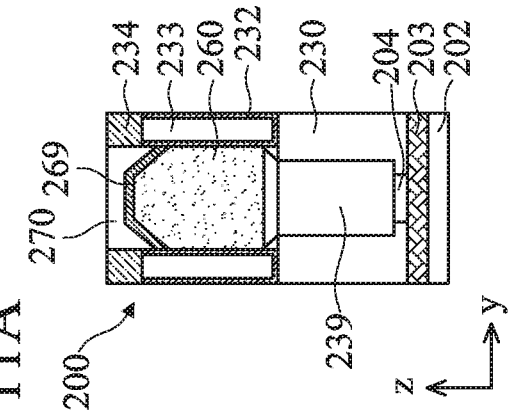
FIG. 11D
FIG. 11E

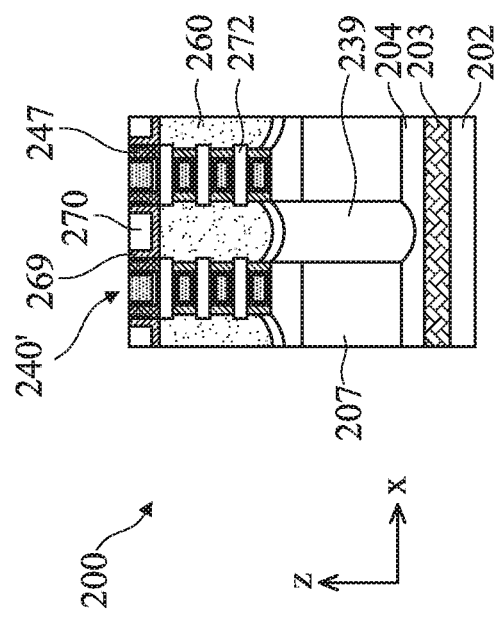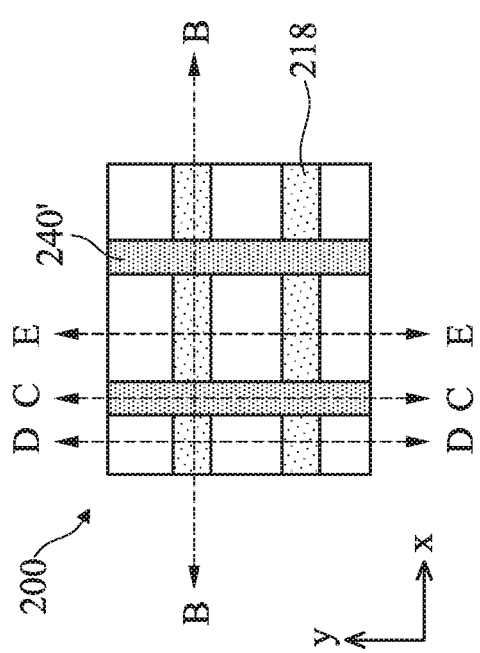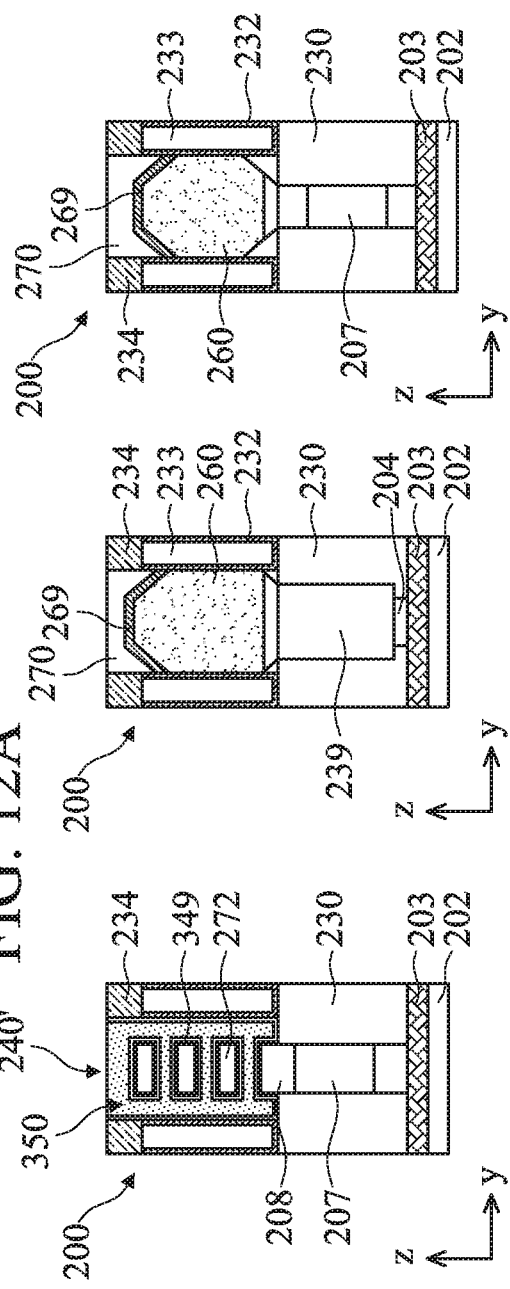
FIG. 12A
FIG. 12B
FIG. 12C
FIG. 12D
FIG. 12E

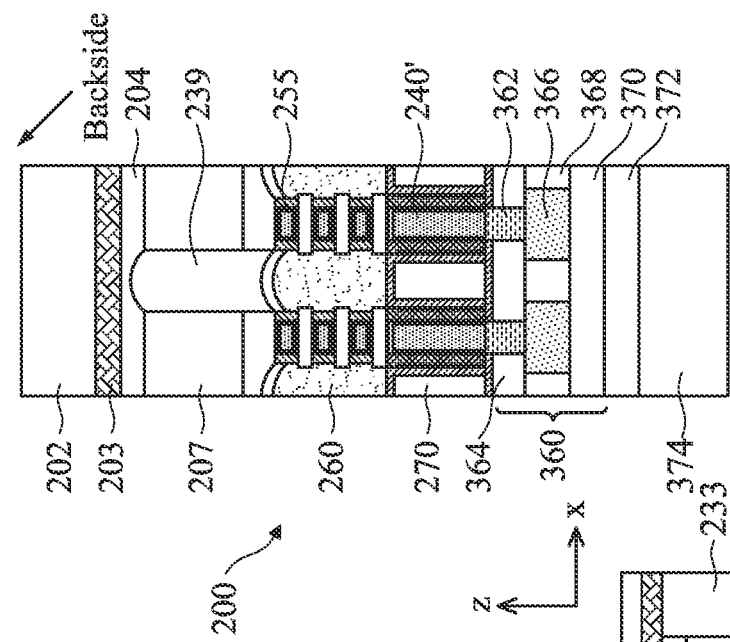
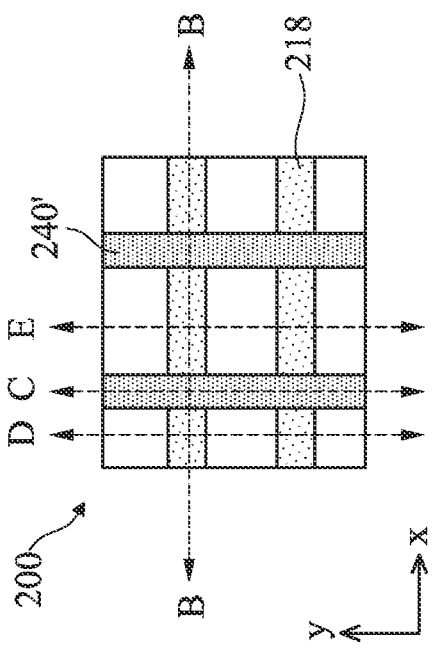
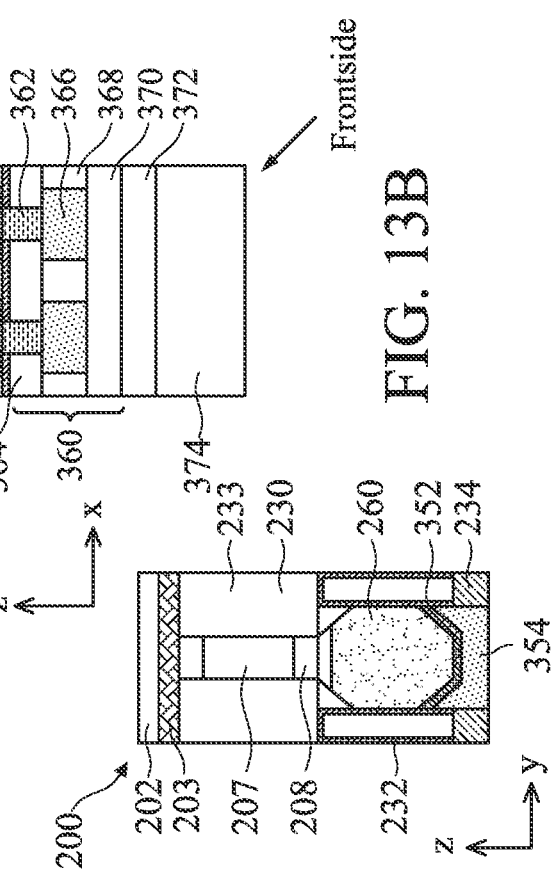
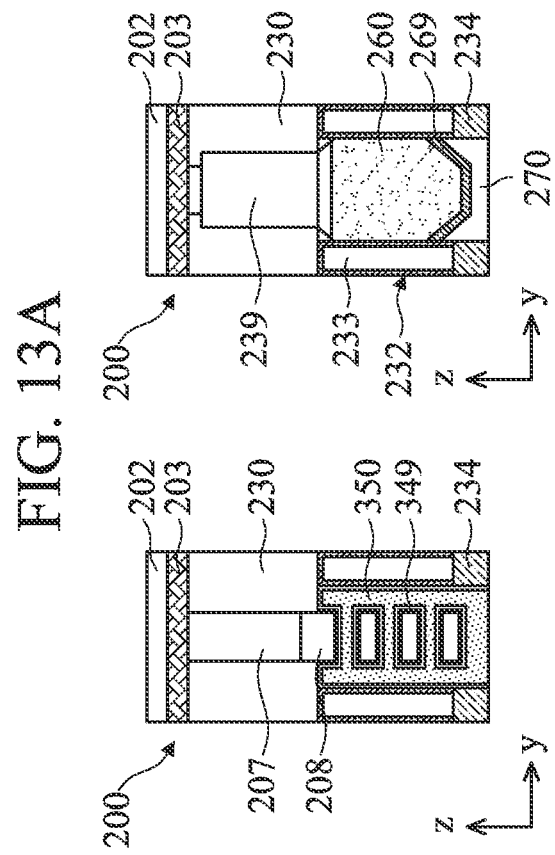
FIG. 13A
FIG. 13B
FIG. 13C
FIG. 13D
FIG. 13E

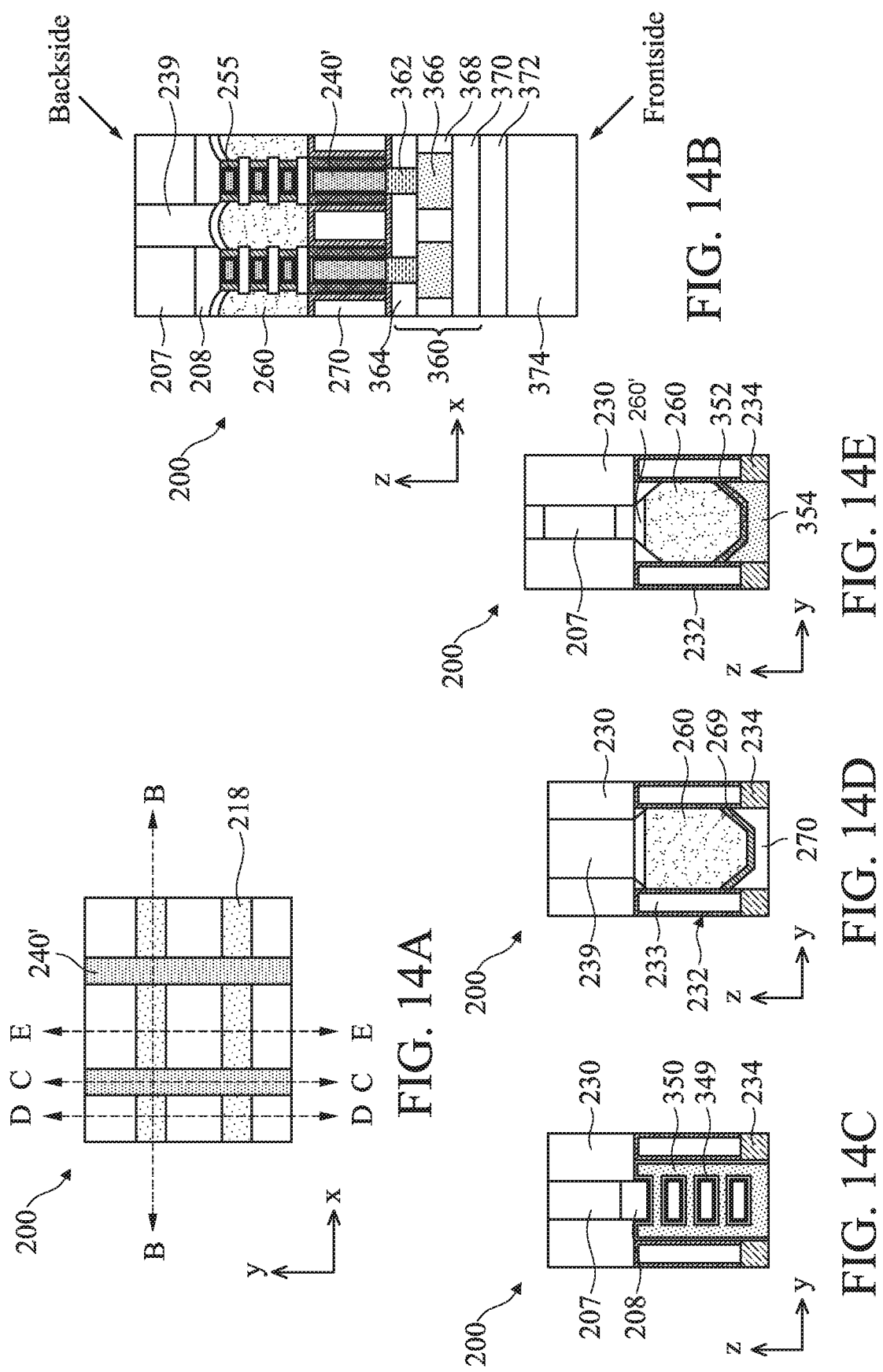

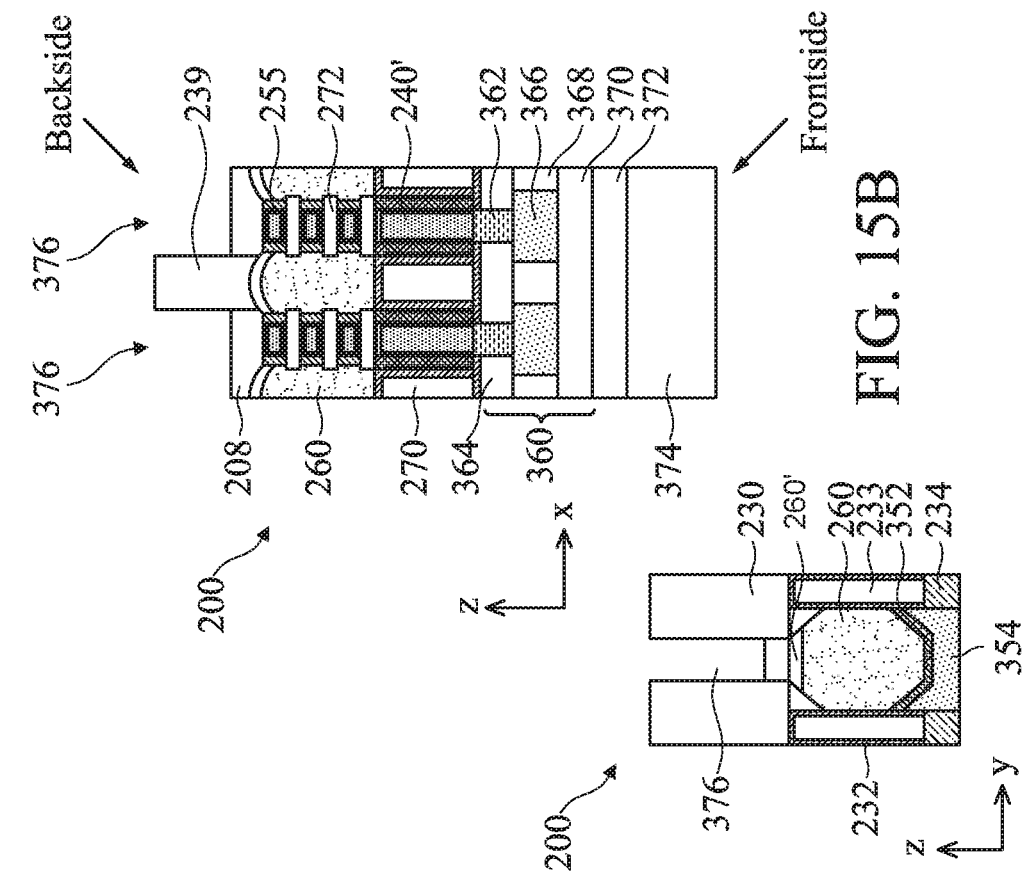
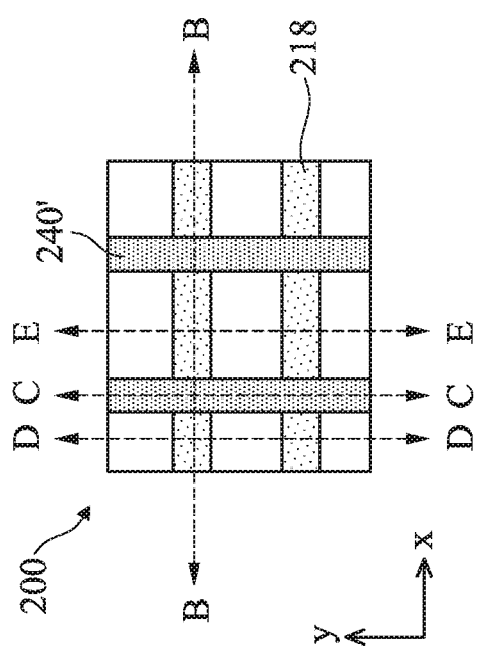
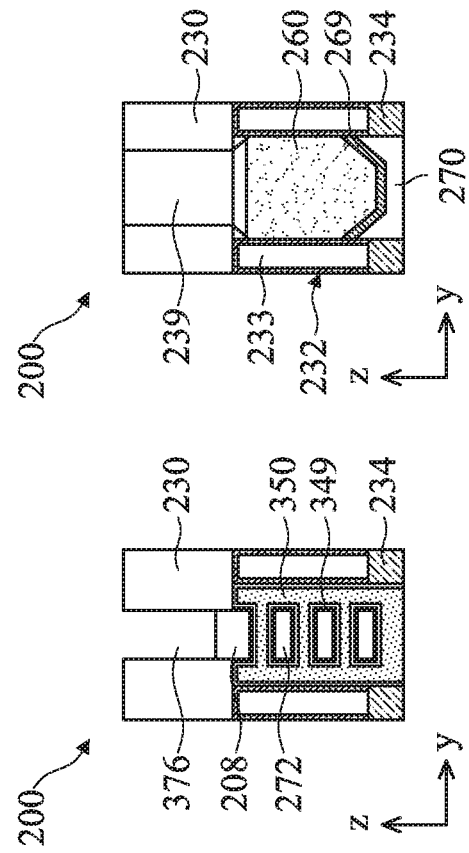
FIG. 15A
FIG. 15B
FIG. 15C
FIG. 15D
FIG. 15E

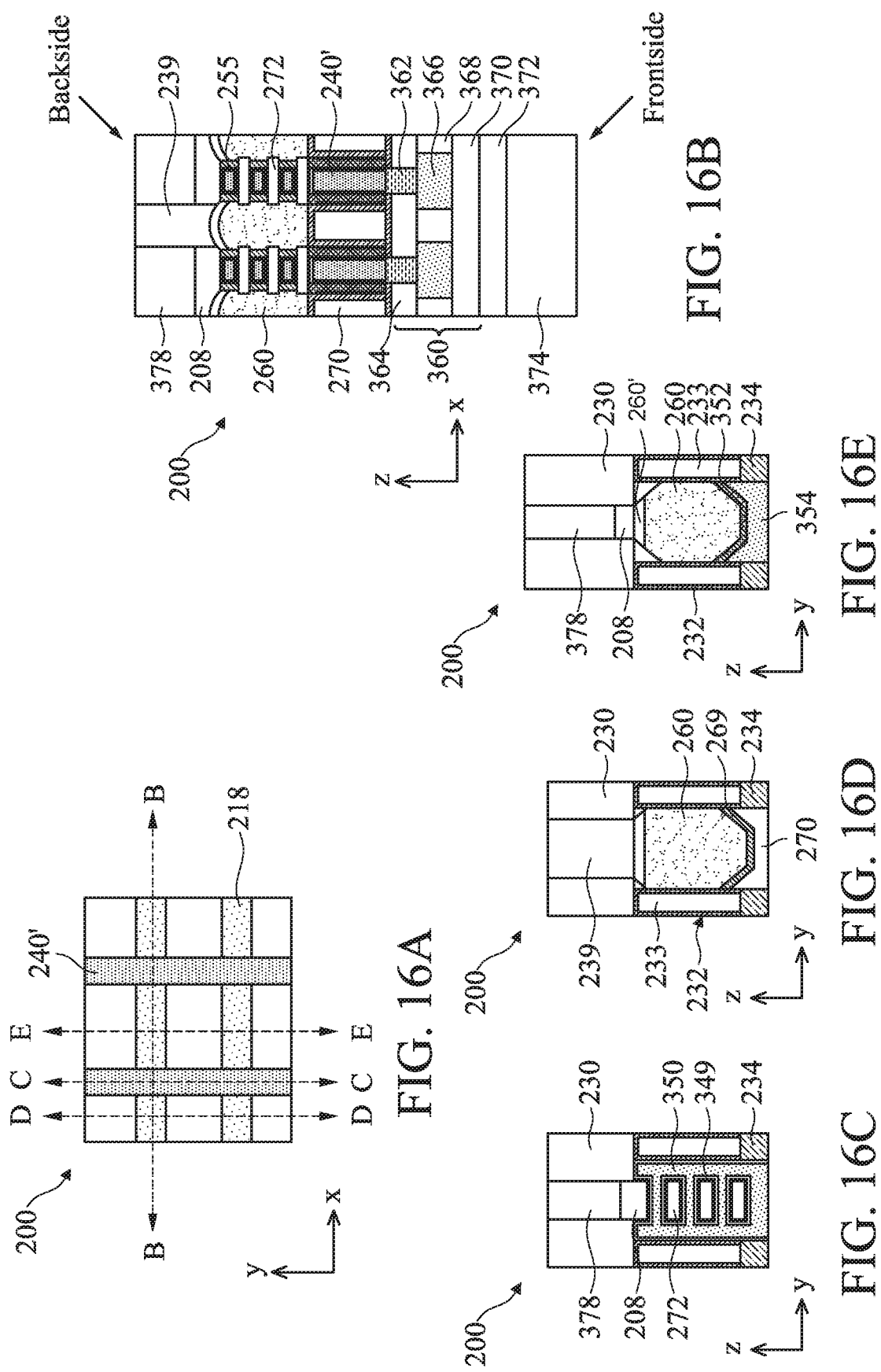

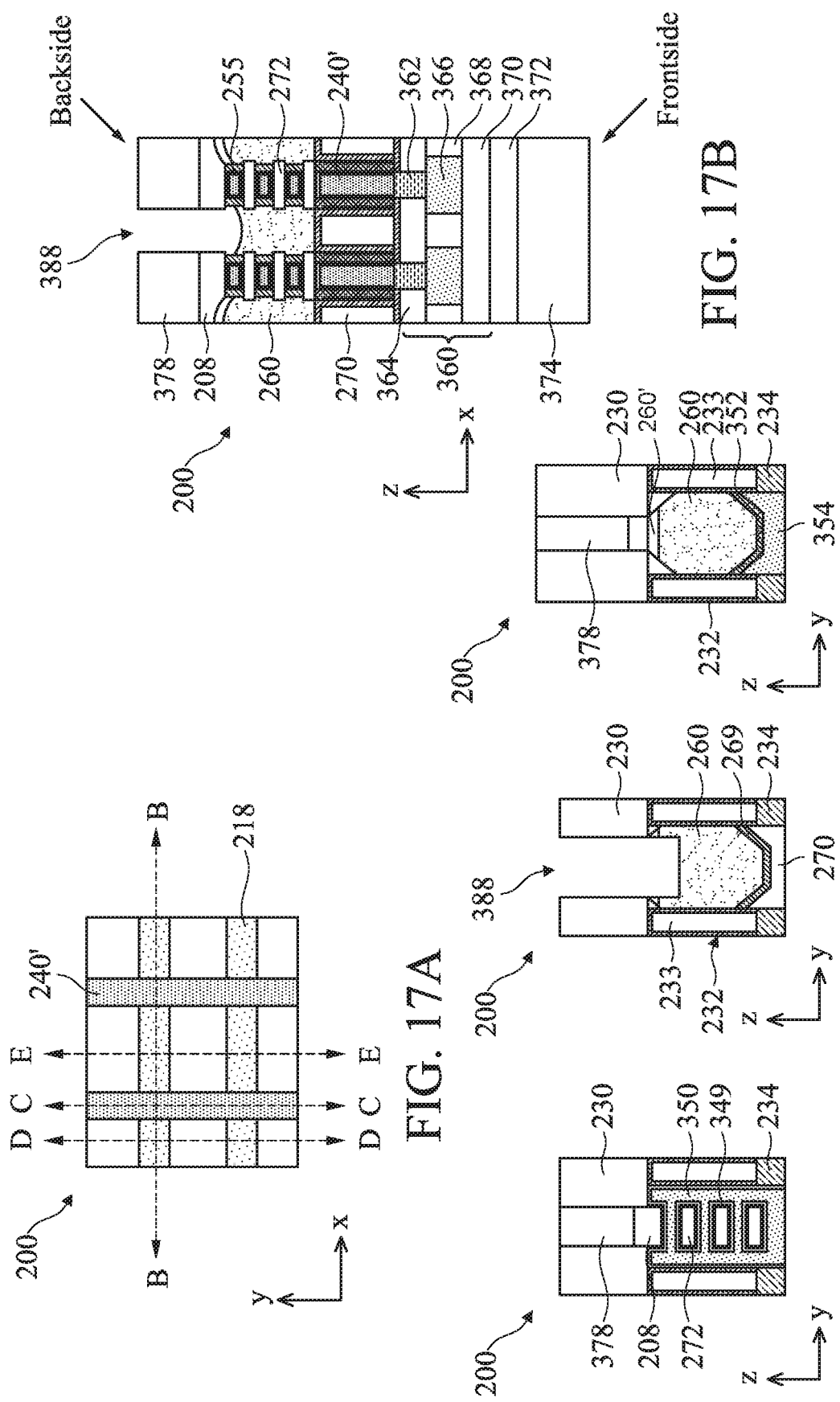

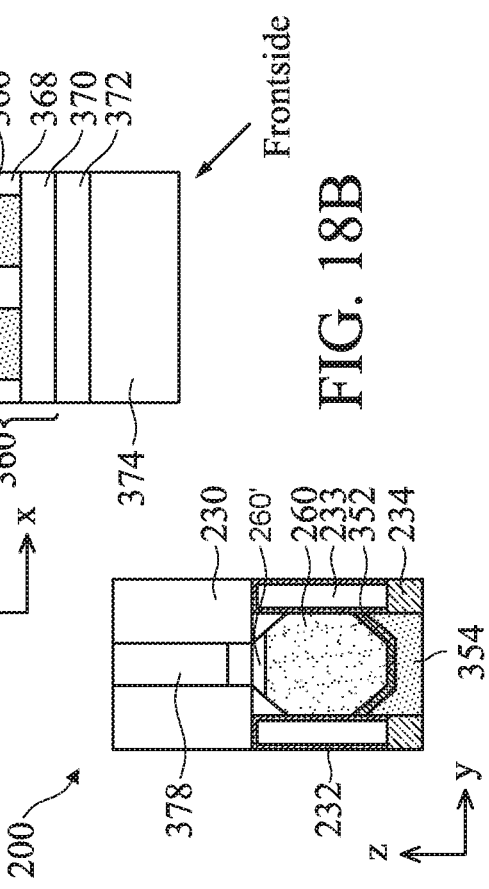
FIG. 18B
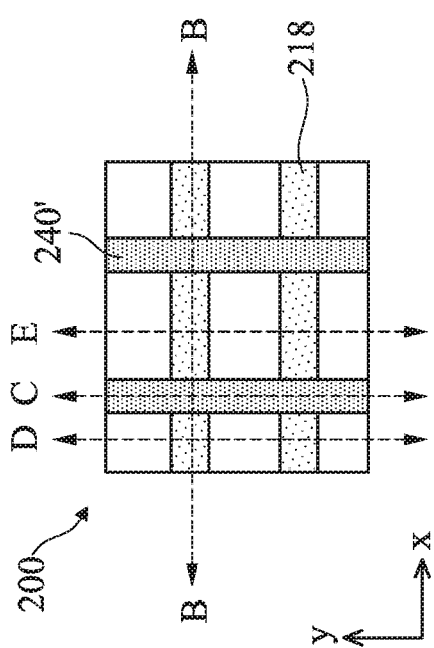
FIG. 18A
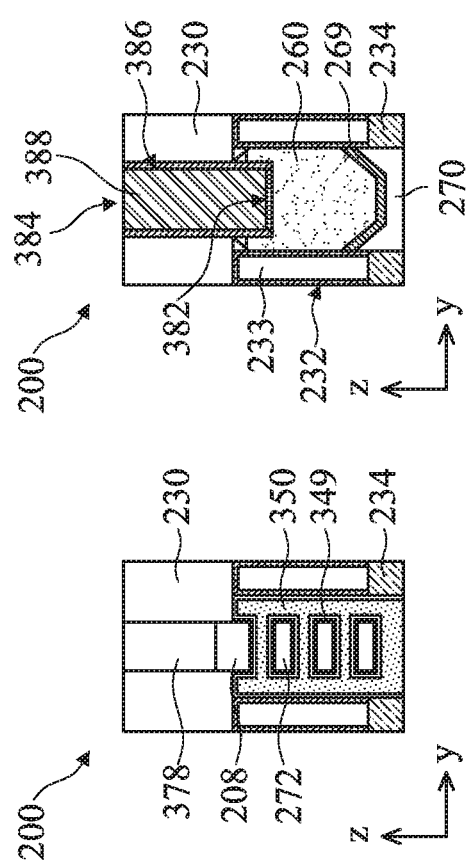
FIG. 18E
FIG. 18D
FIG. 18C

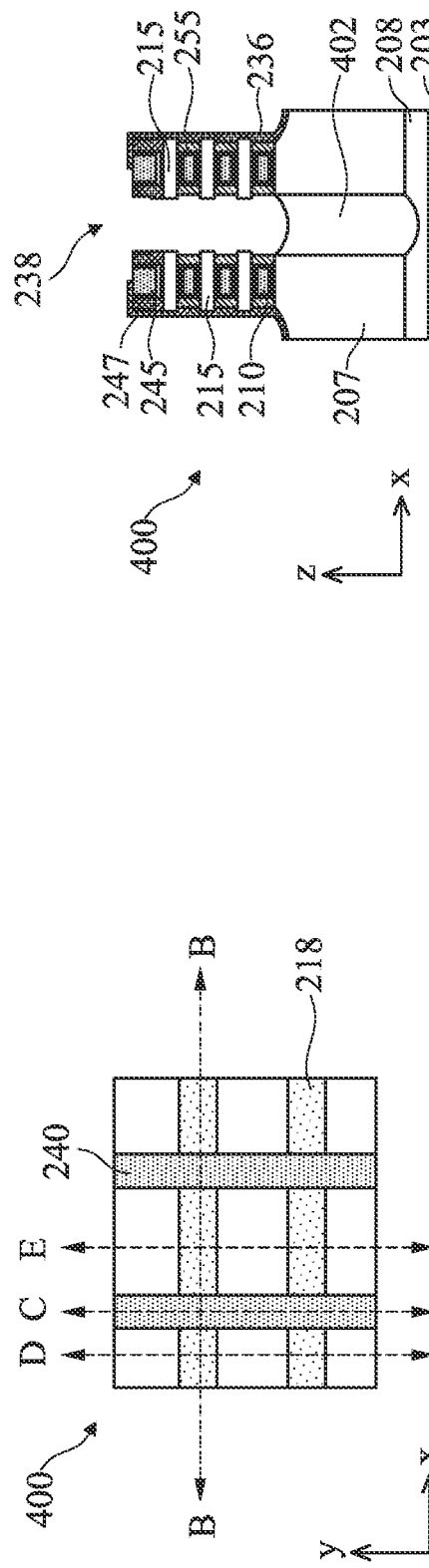

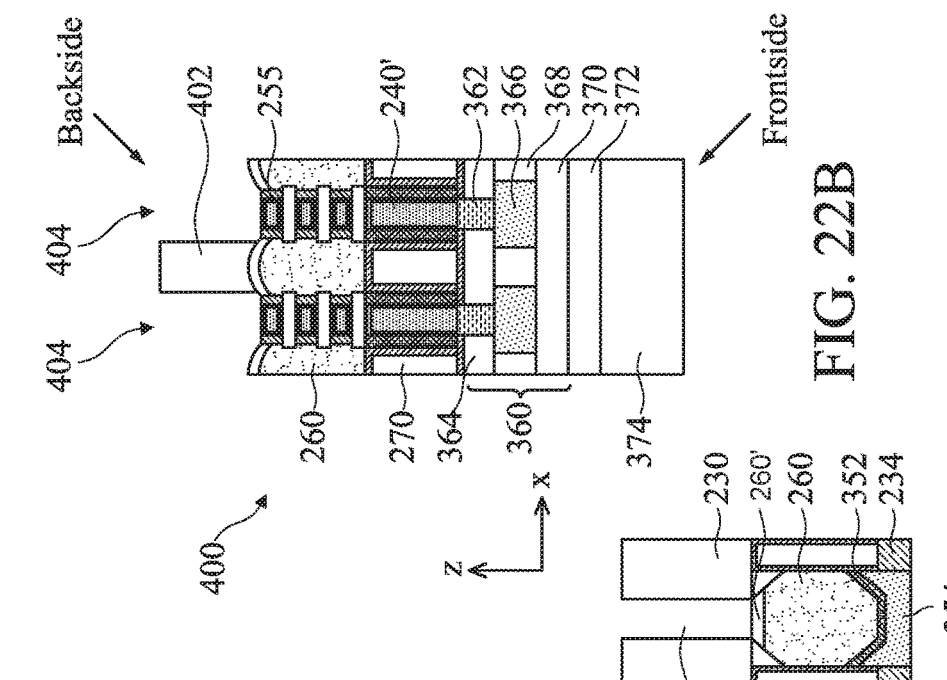
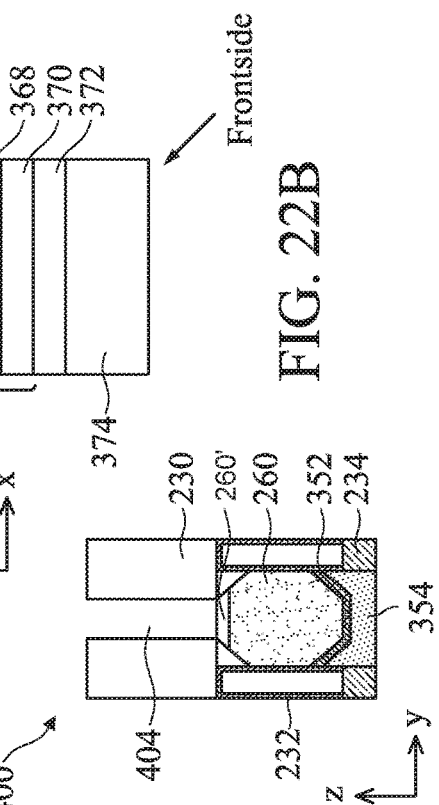
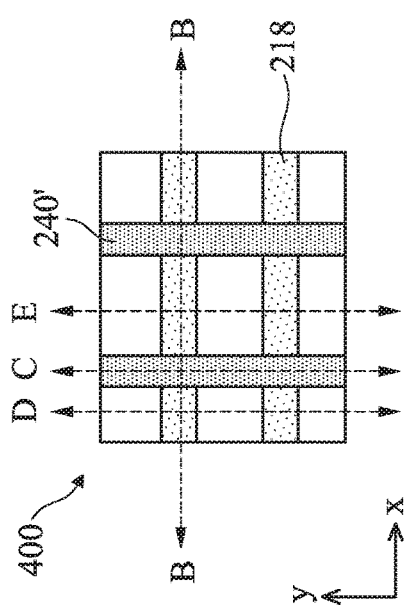
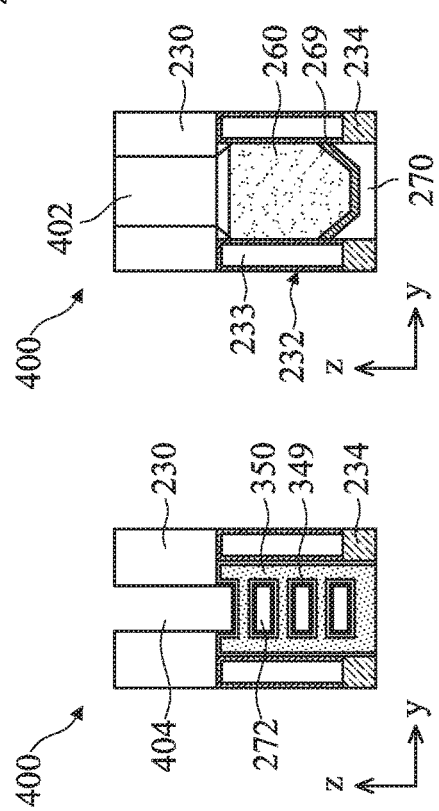

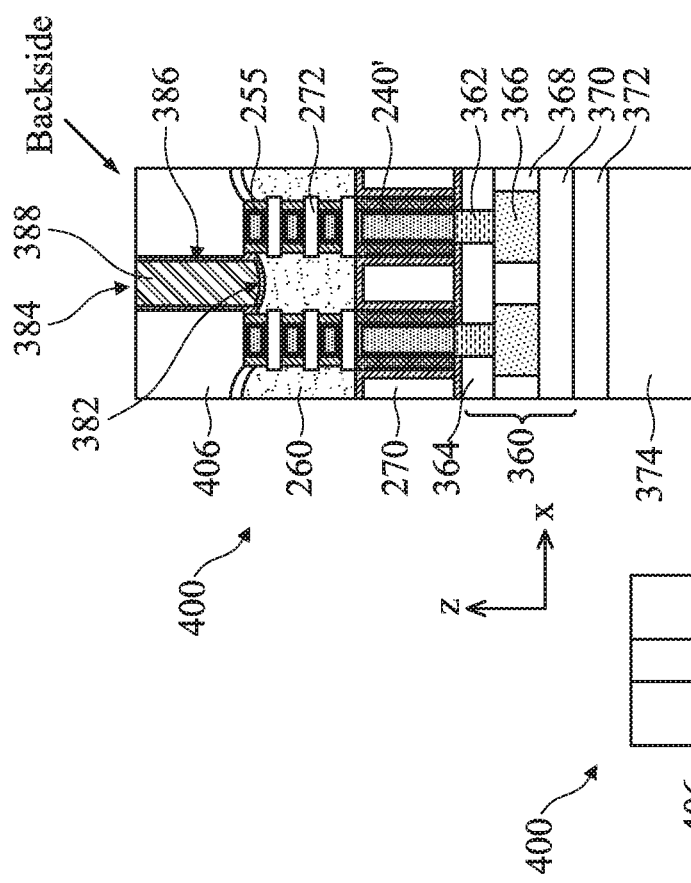
FIG. 23A
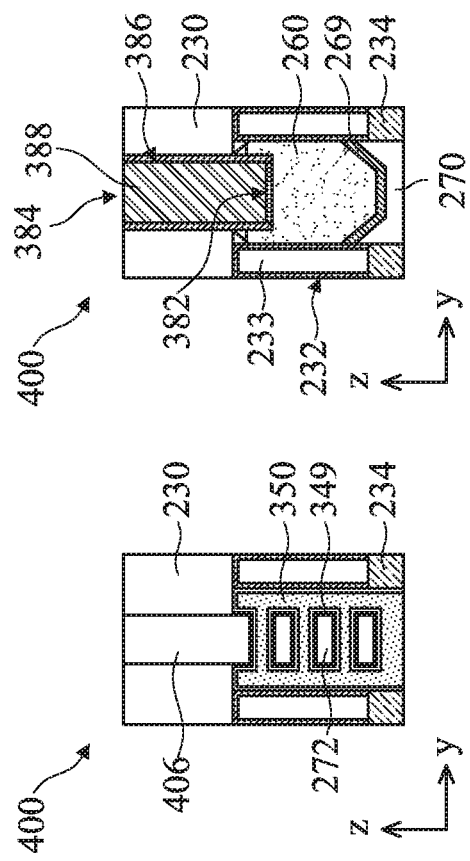
FIG. 23B
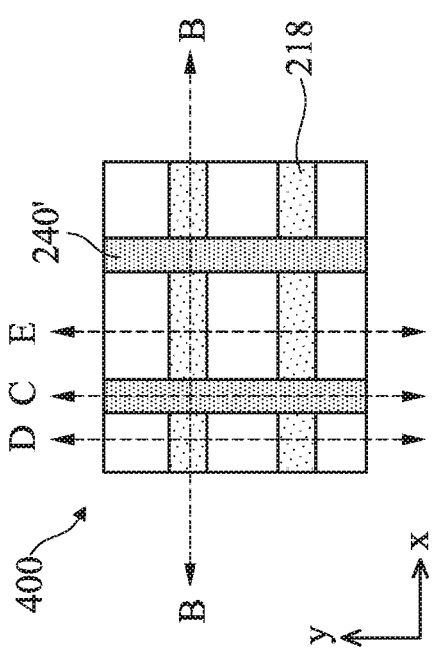
FIG. 23C
FIG. 23D
FIG. 23E

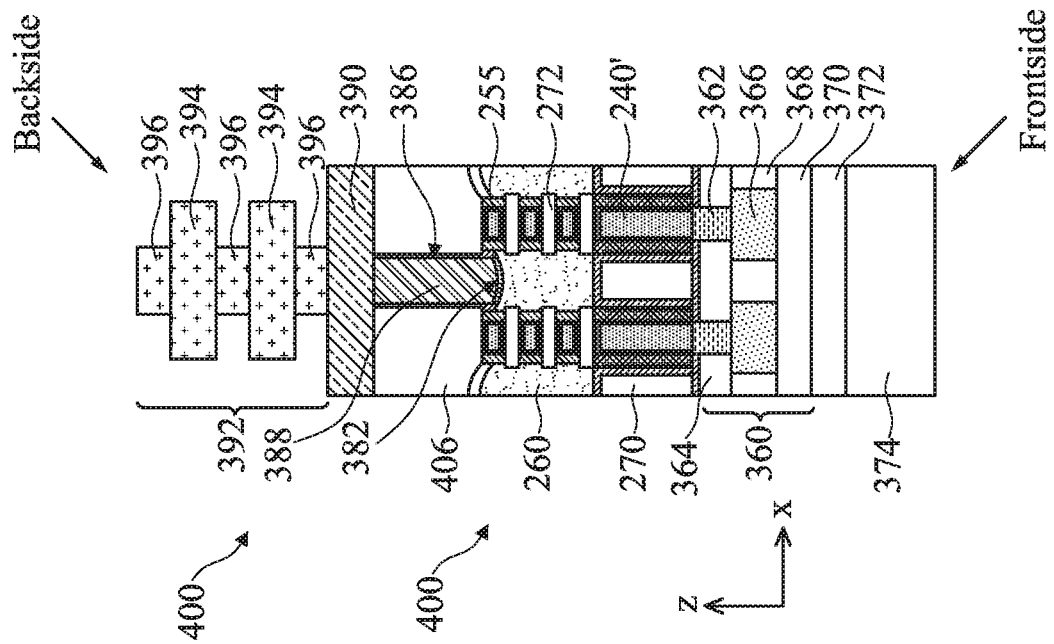
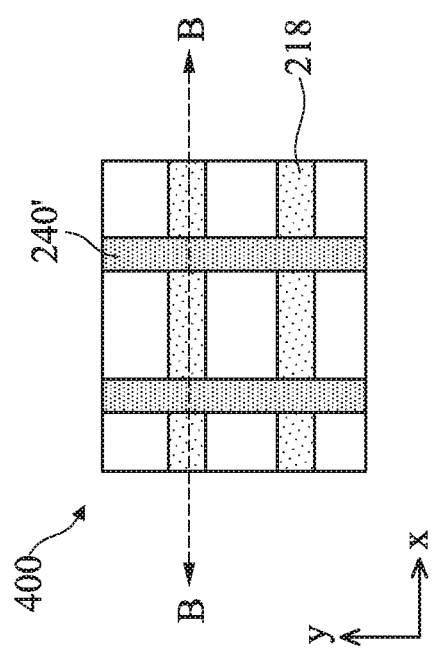
FIG. 24B
FIG. 24A

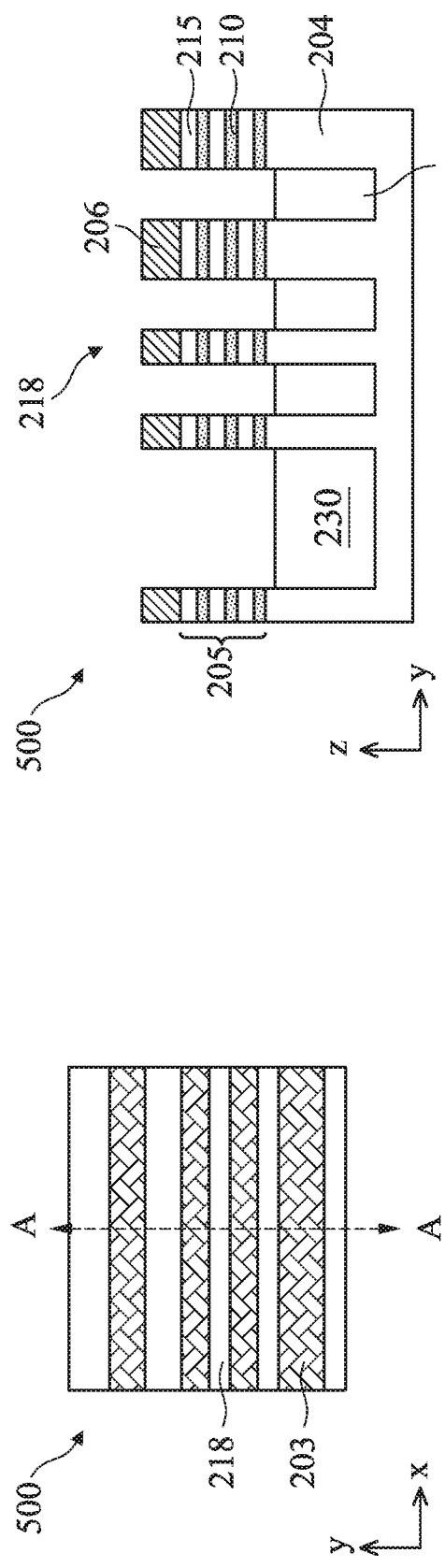
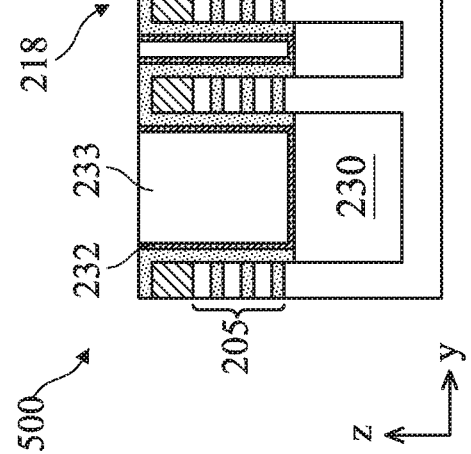
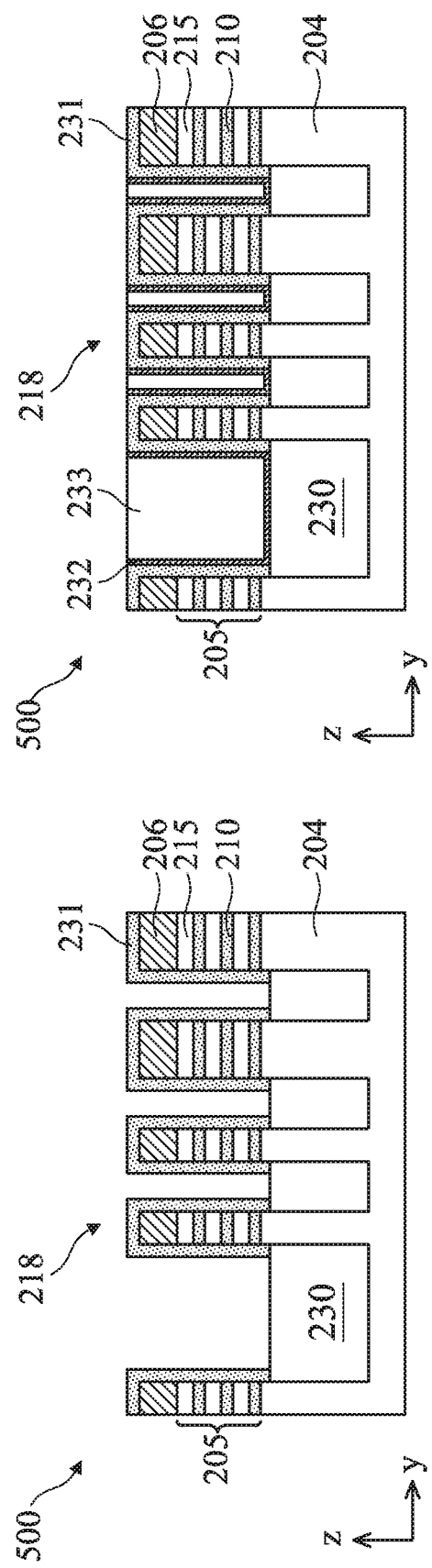
FIG. 29A
FIG. 29B
FIG. 29C
FIG. 29D

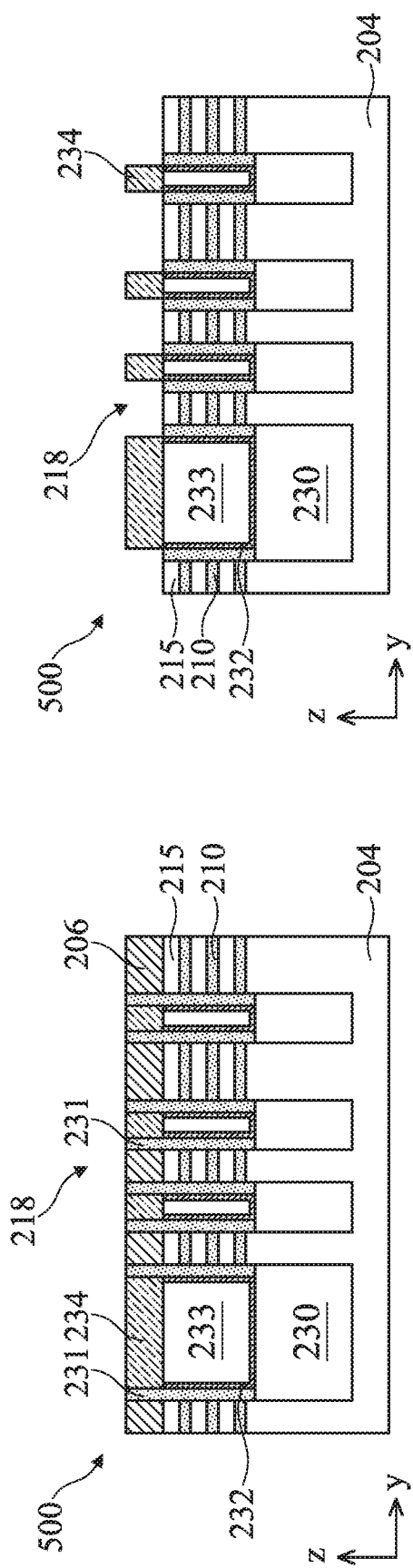
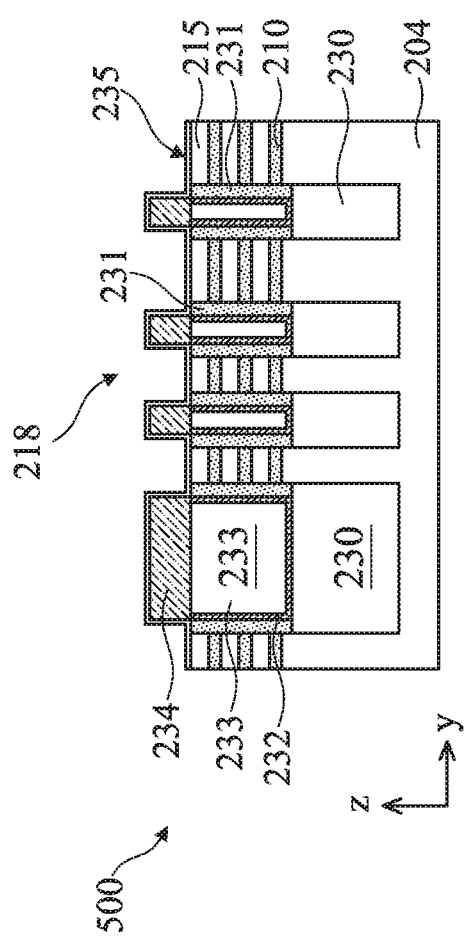
FIG. 29E
FIG. 29F
FIG. 29G

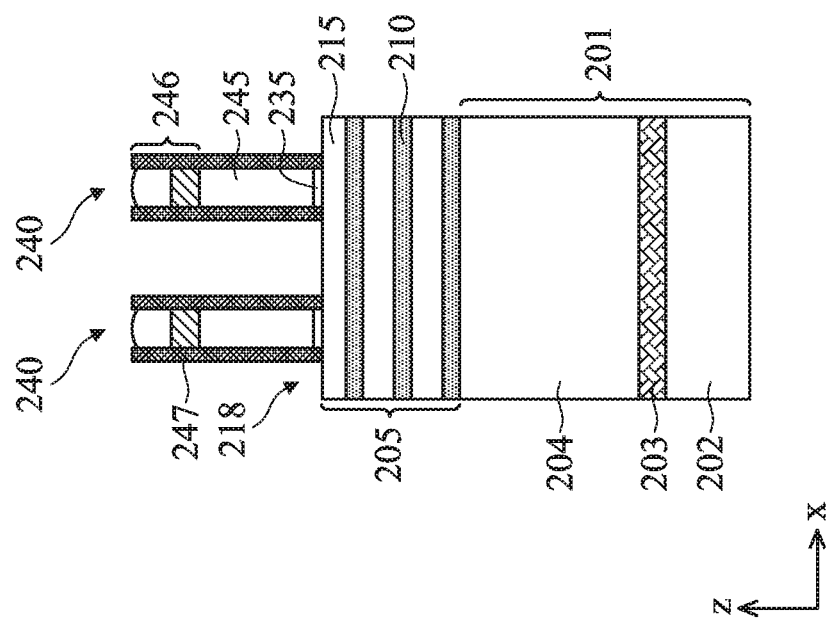
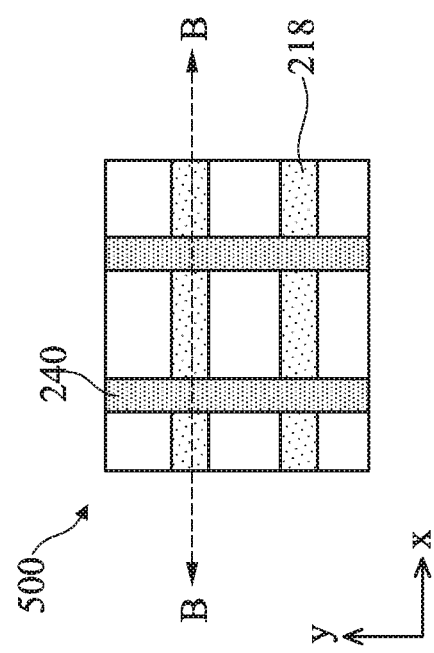
FIG. 30A
FIG. 30B

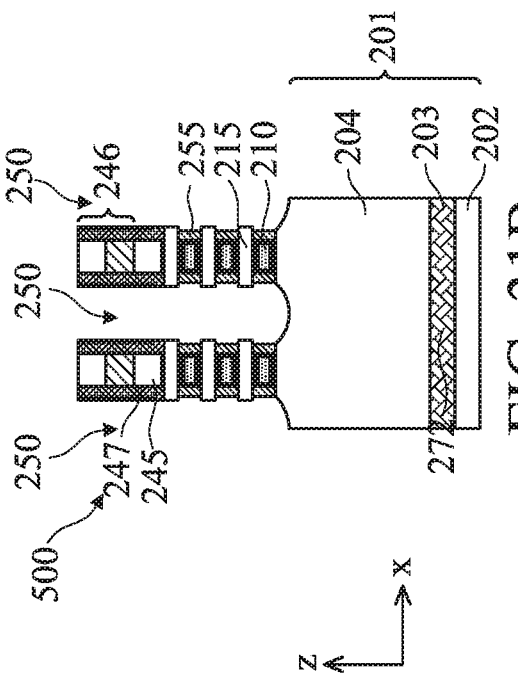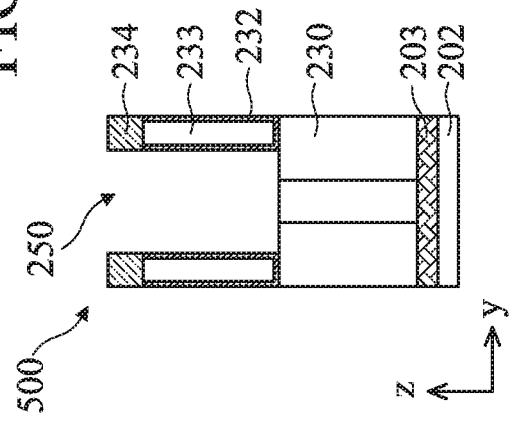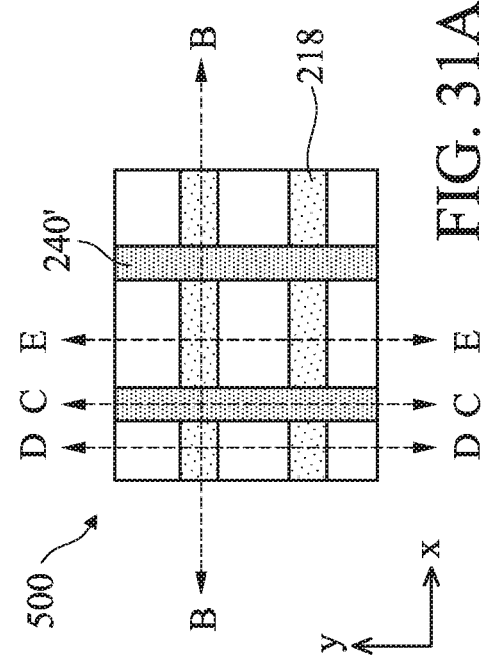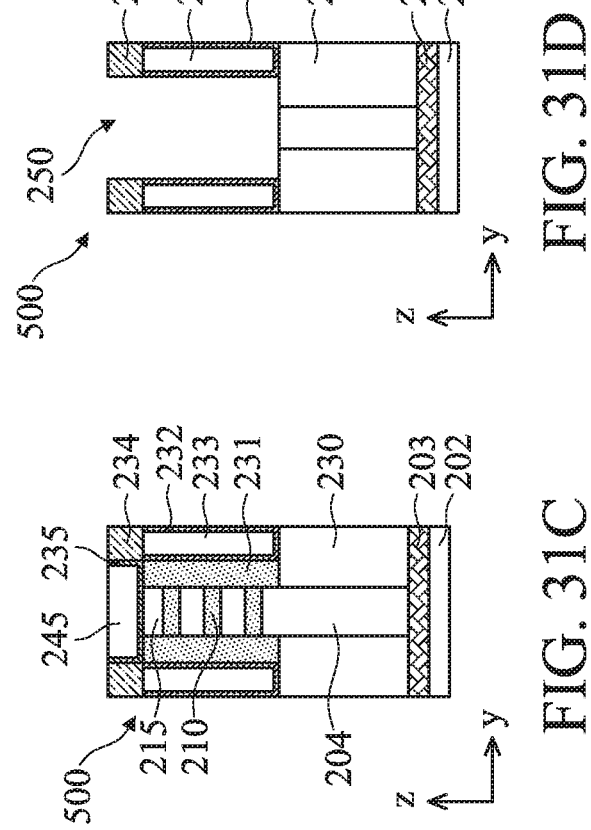
FIG. 31A
FIG. 31B
FIG. 31C
FIG. 31D
FIG. 31E

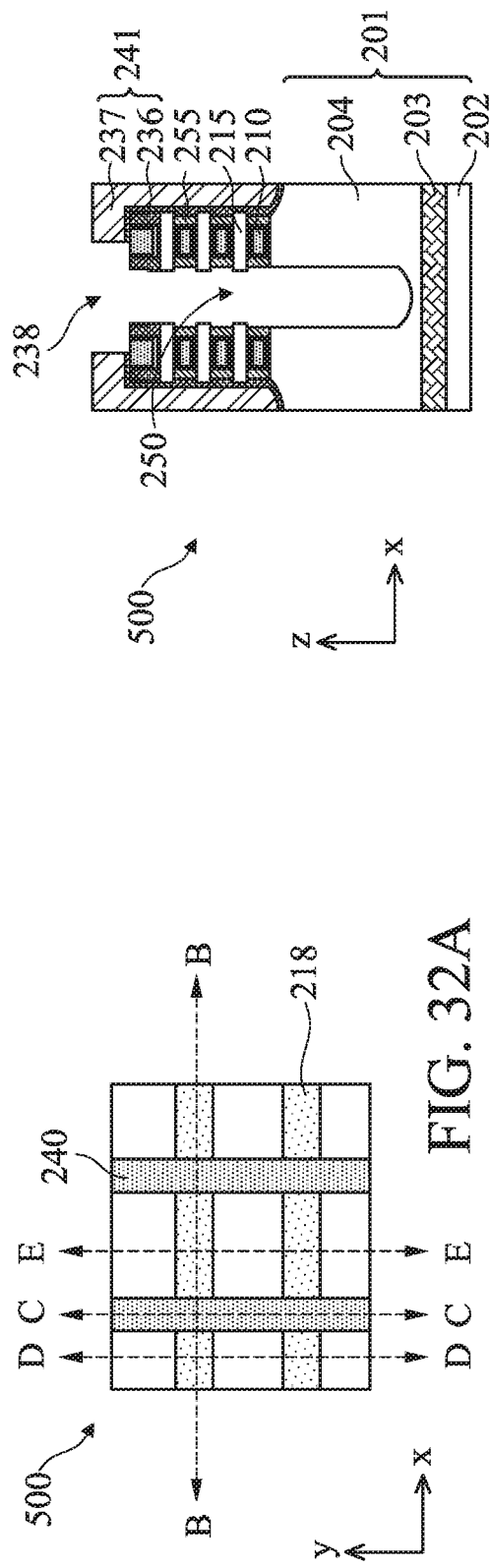

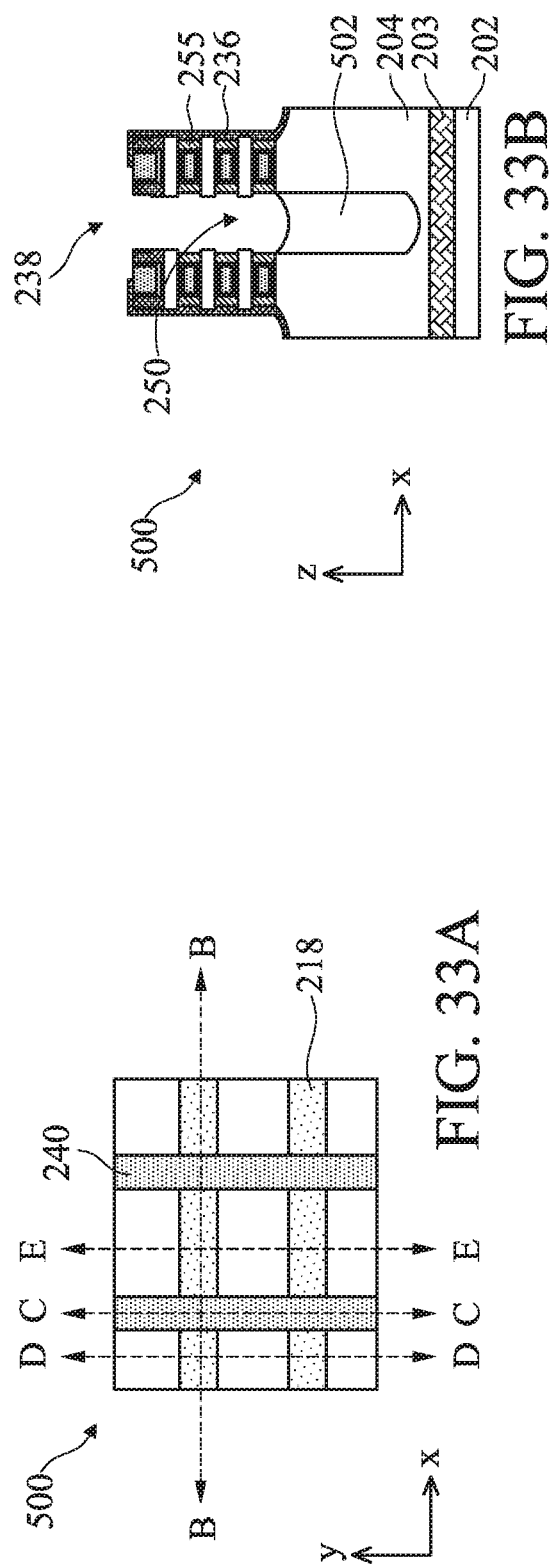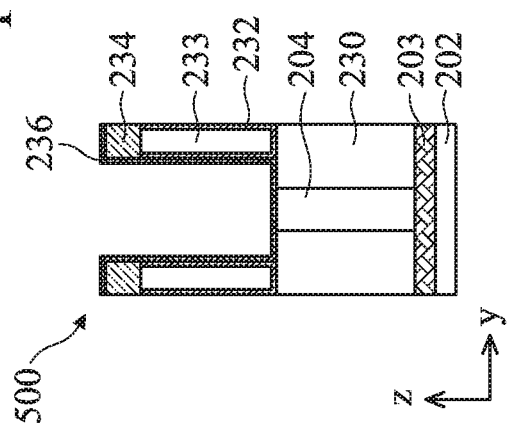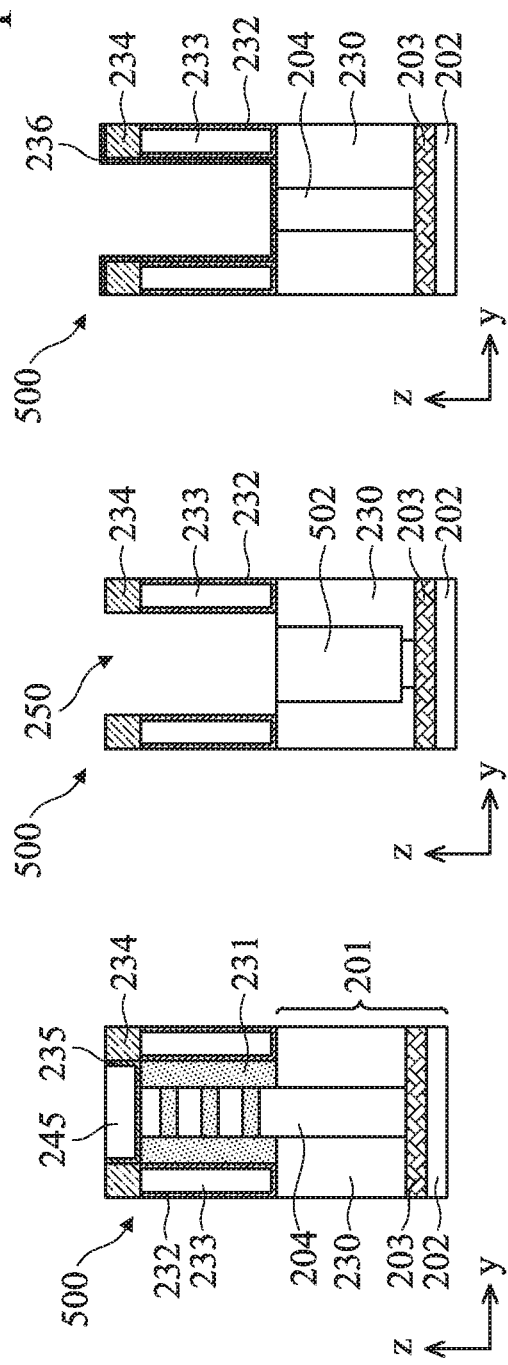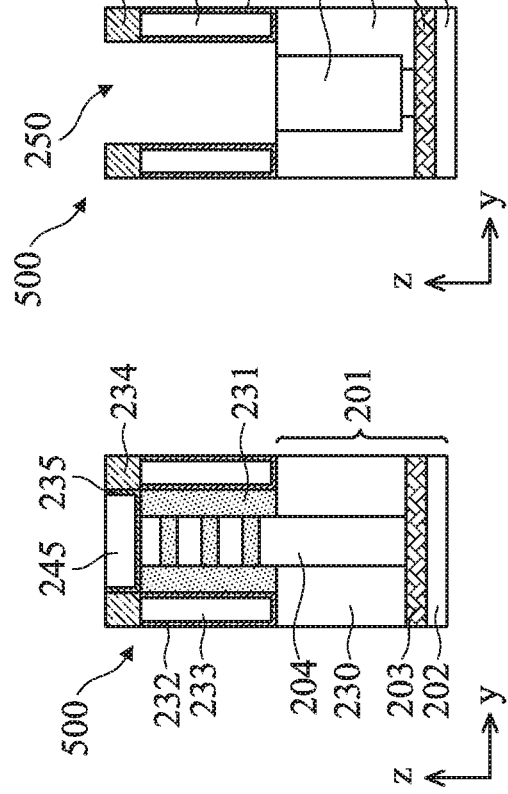
FIG. 33A  FIG. 33B  FIG. 33C  FIG. 33D  FIG. 33E

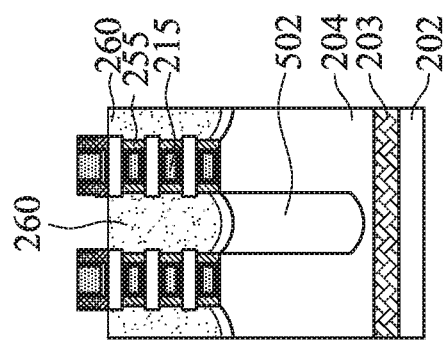
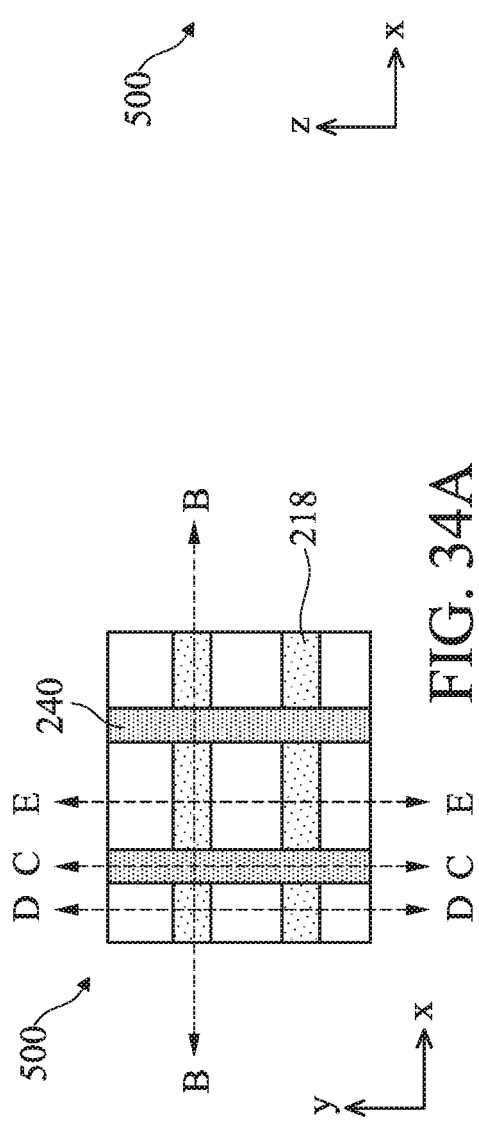
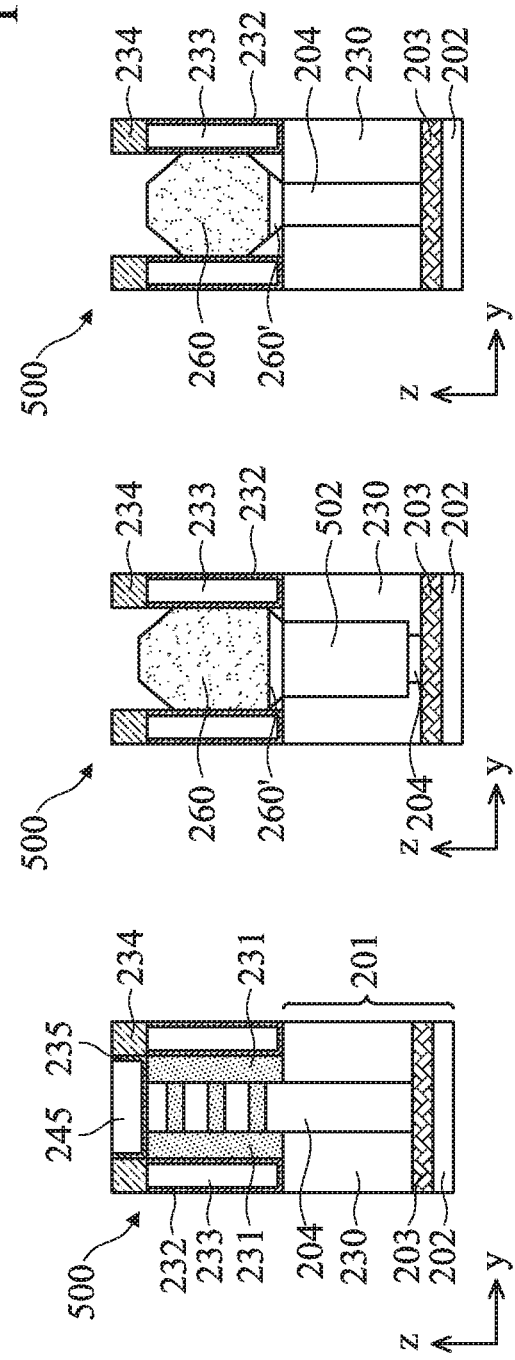
FIG. 34A
FIG. 34B
FIG. 34C
FIG. 34D
FIG. 34E

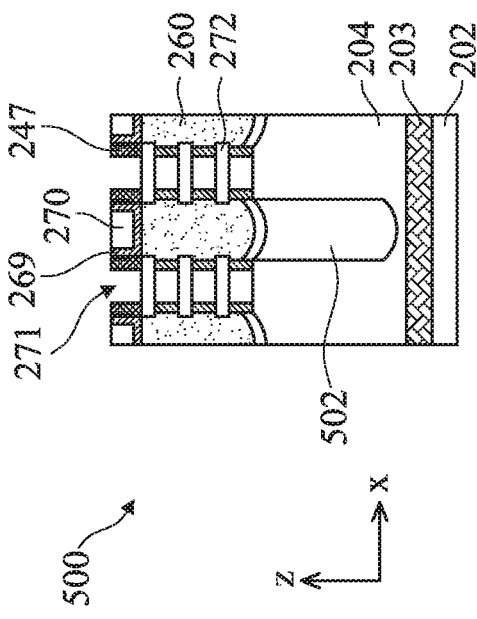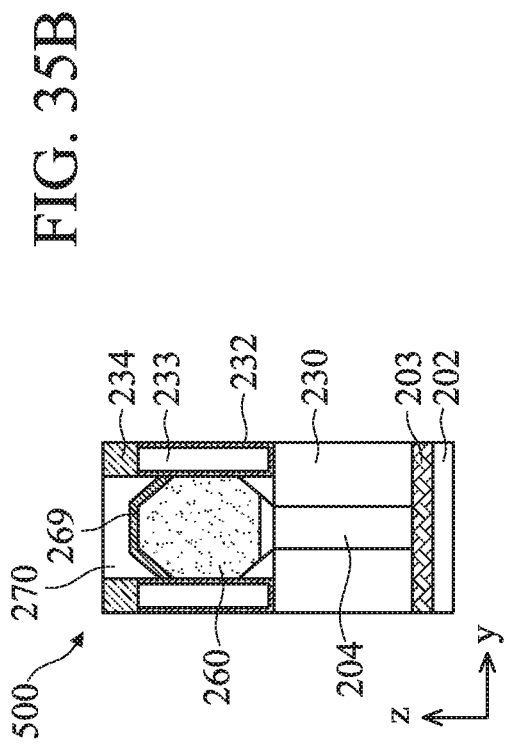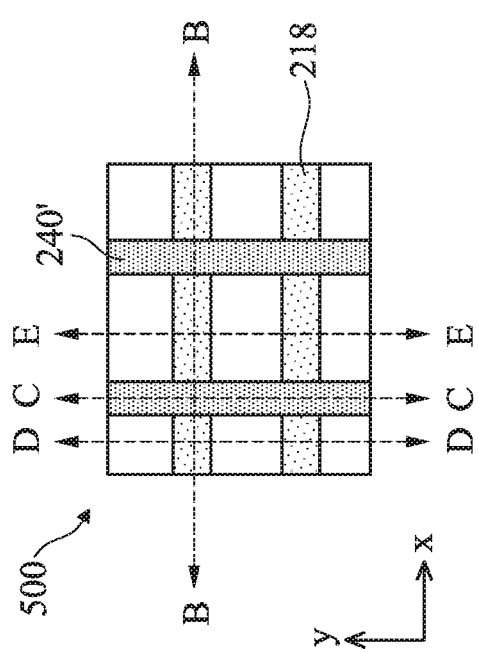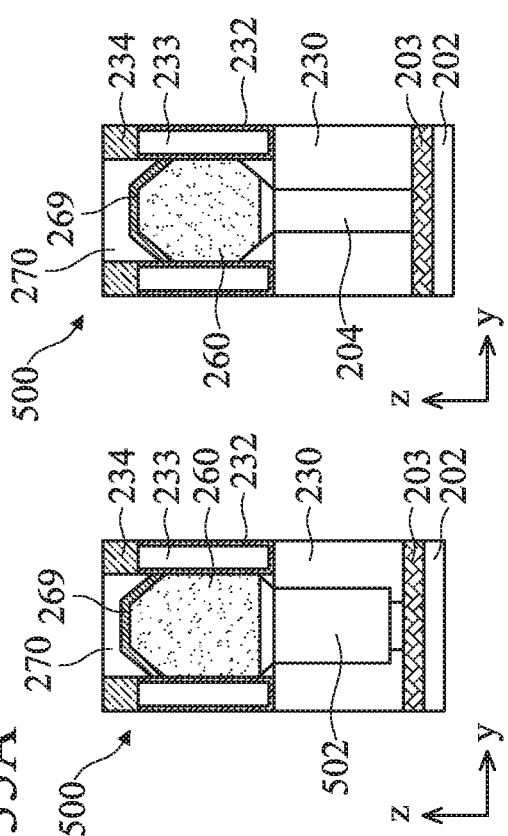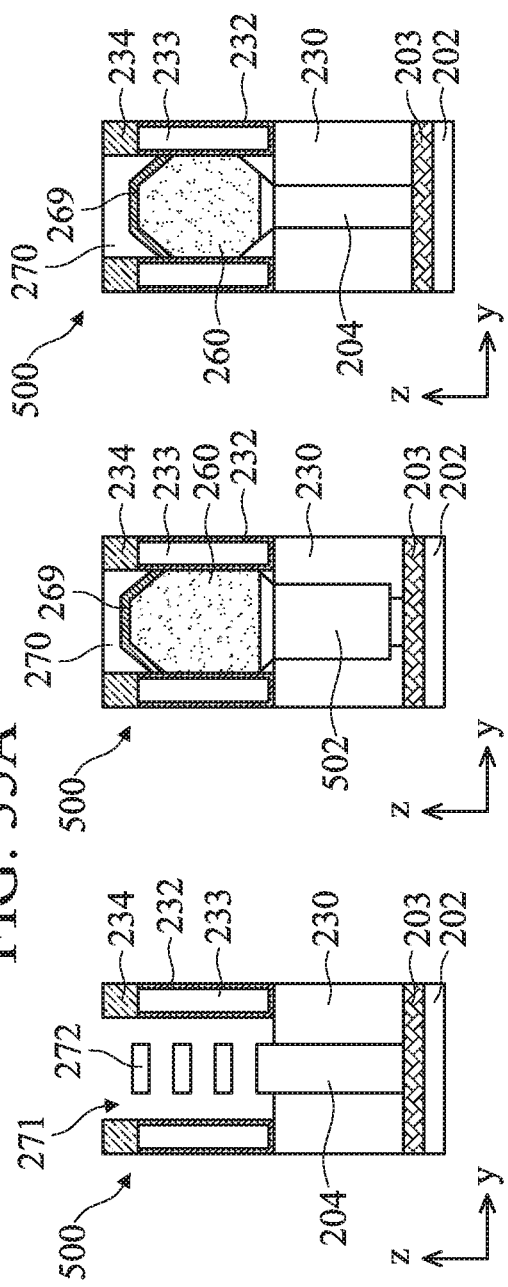
FIG. 35A
FIG. 35B
FIG. 35C
FIG. 35D
FIG. 35E

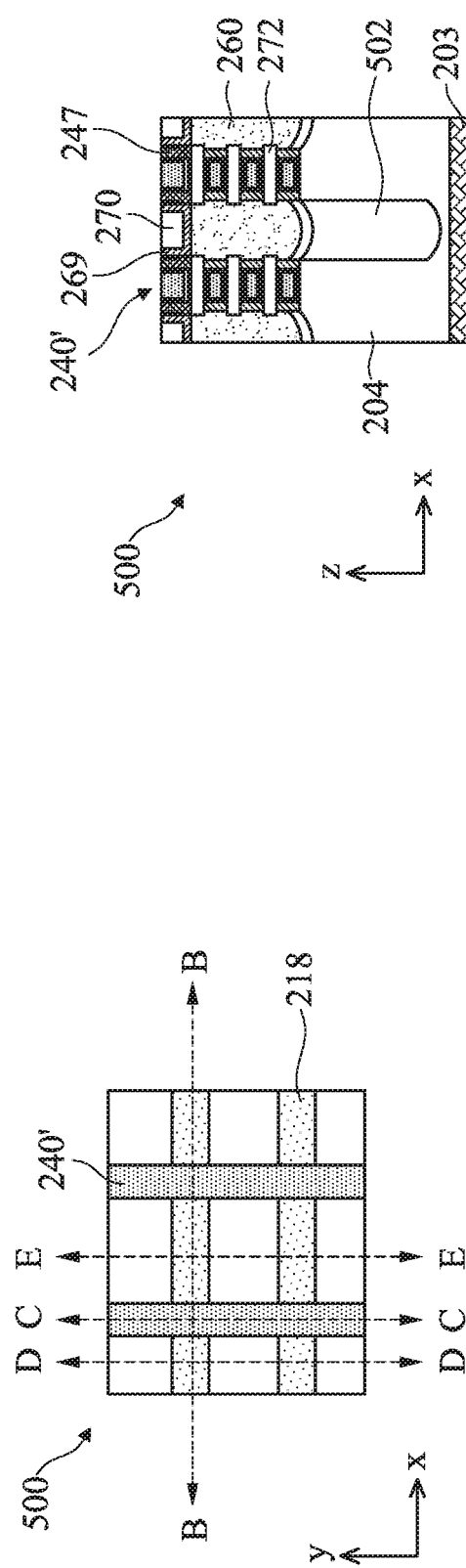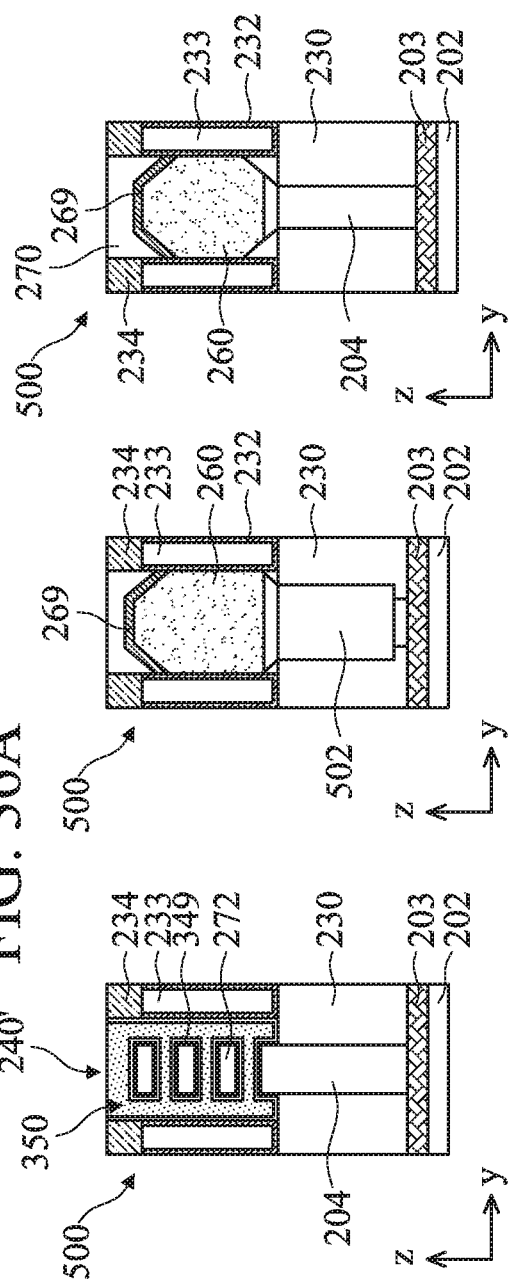
FIG. 36A
FIG. 36B
FIG. 36C
FIG. 36D
FIG. 36E

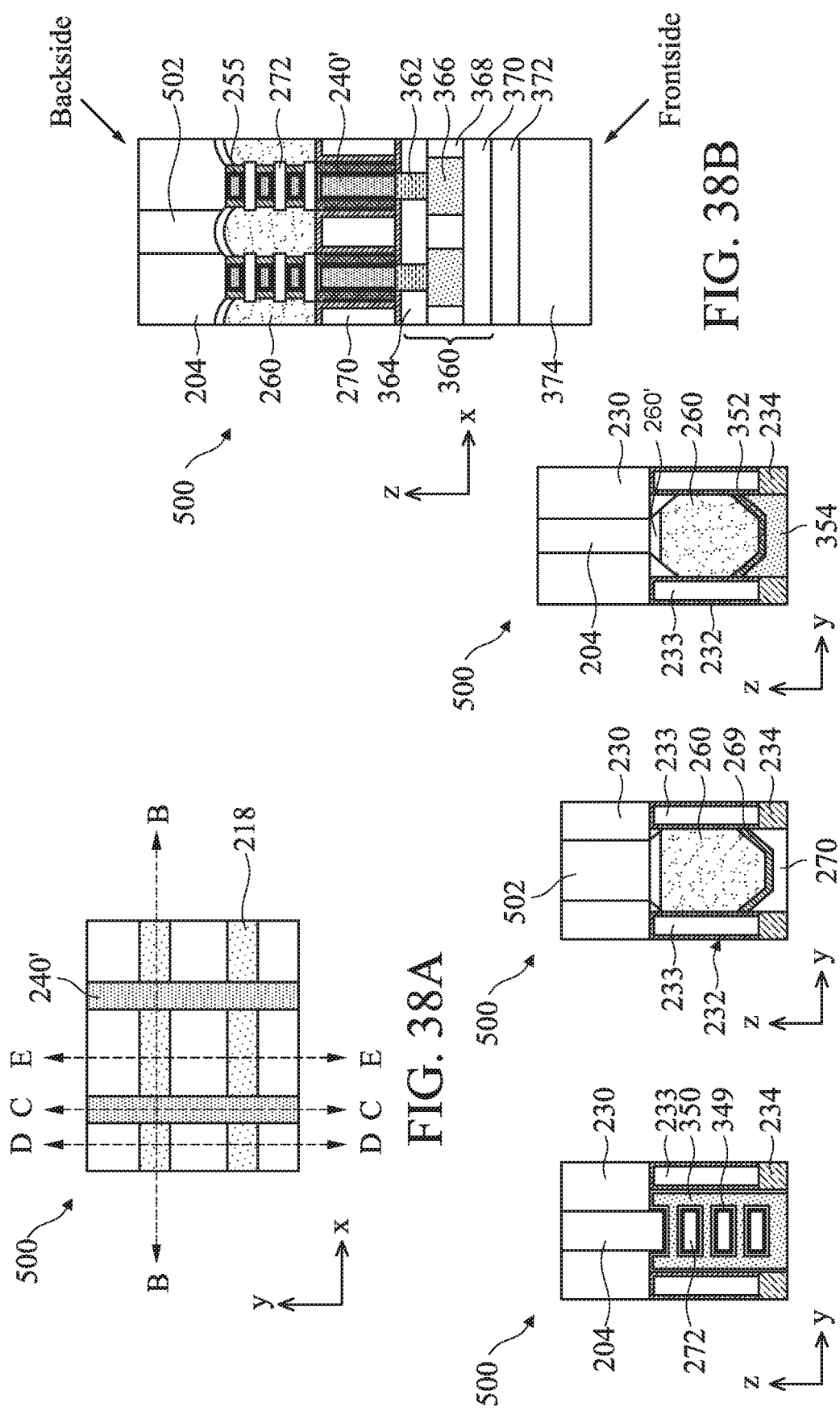

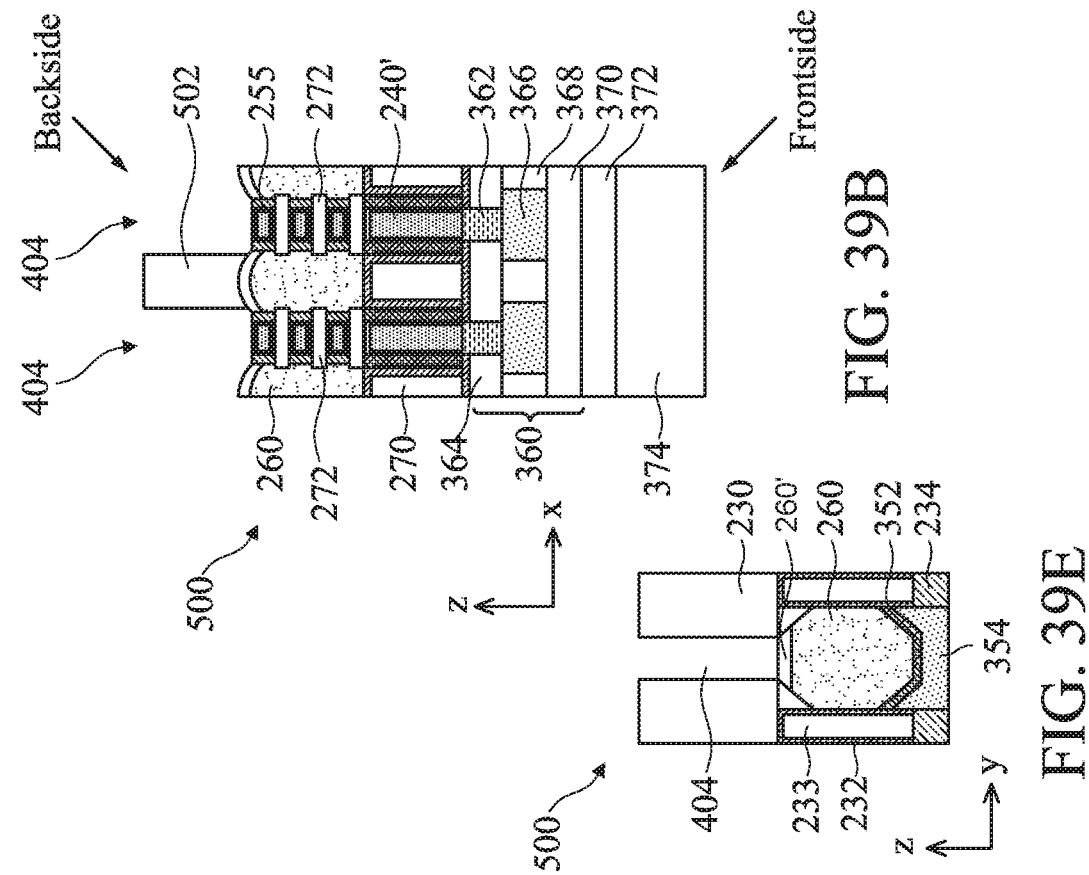
FIG. 39A
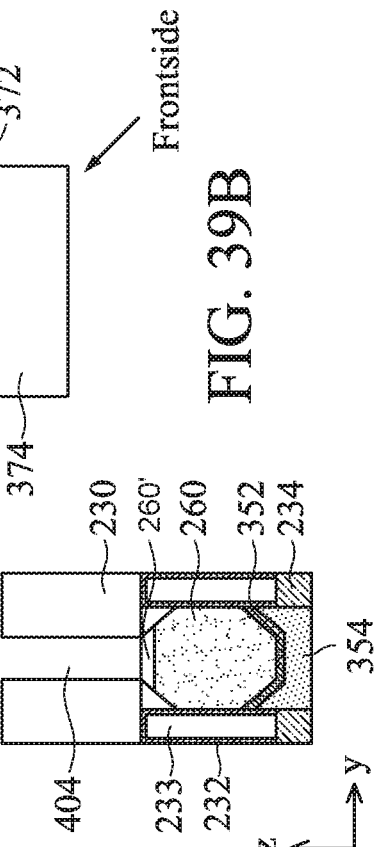
FIG. 39B
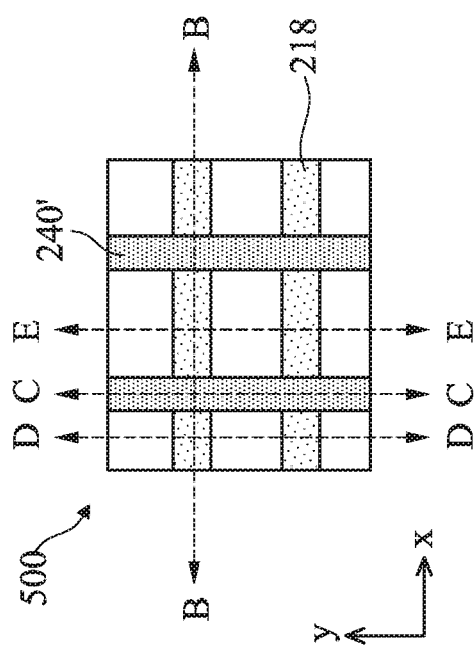
FIG. 39C
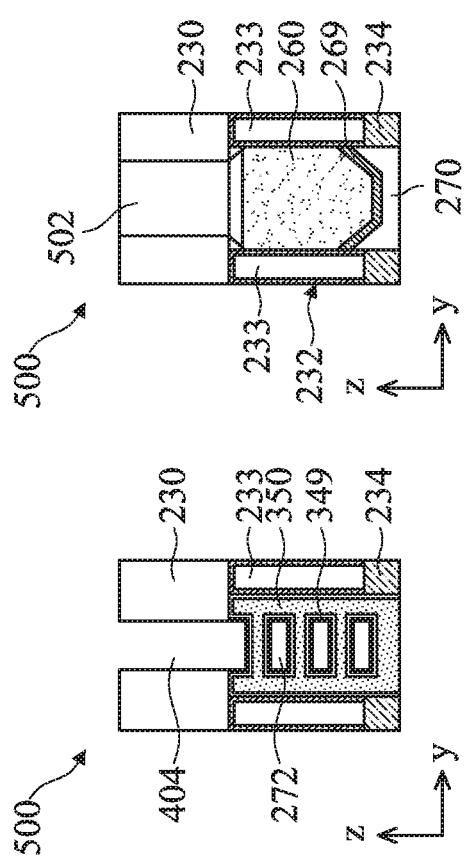
FIG. 39D
FIG. 39E

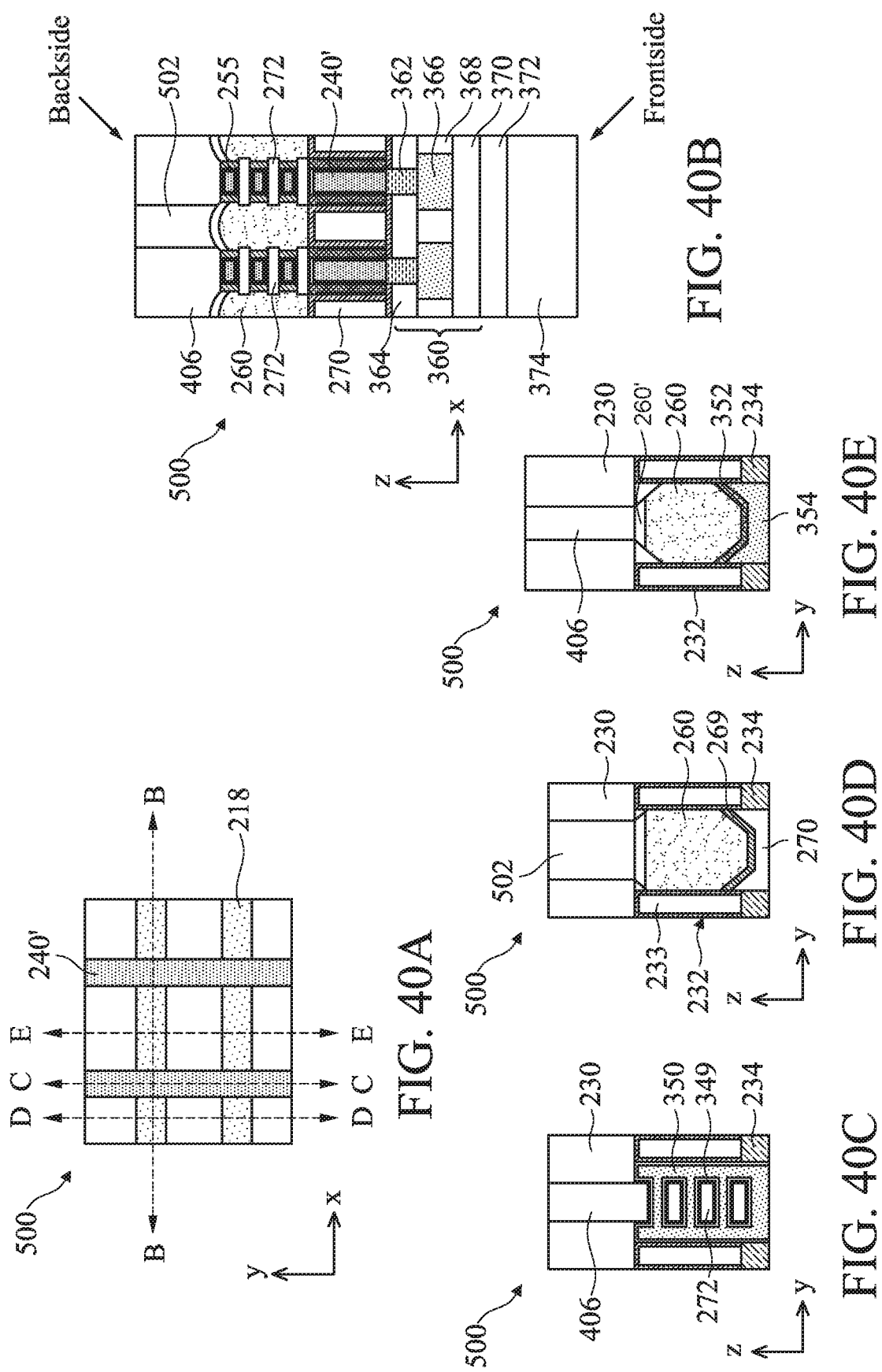

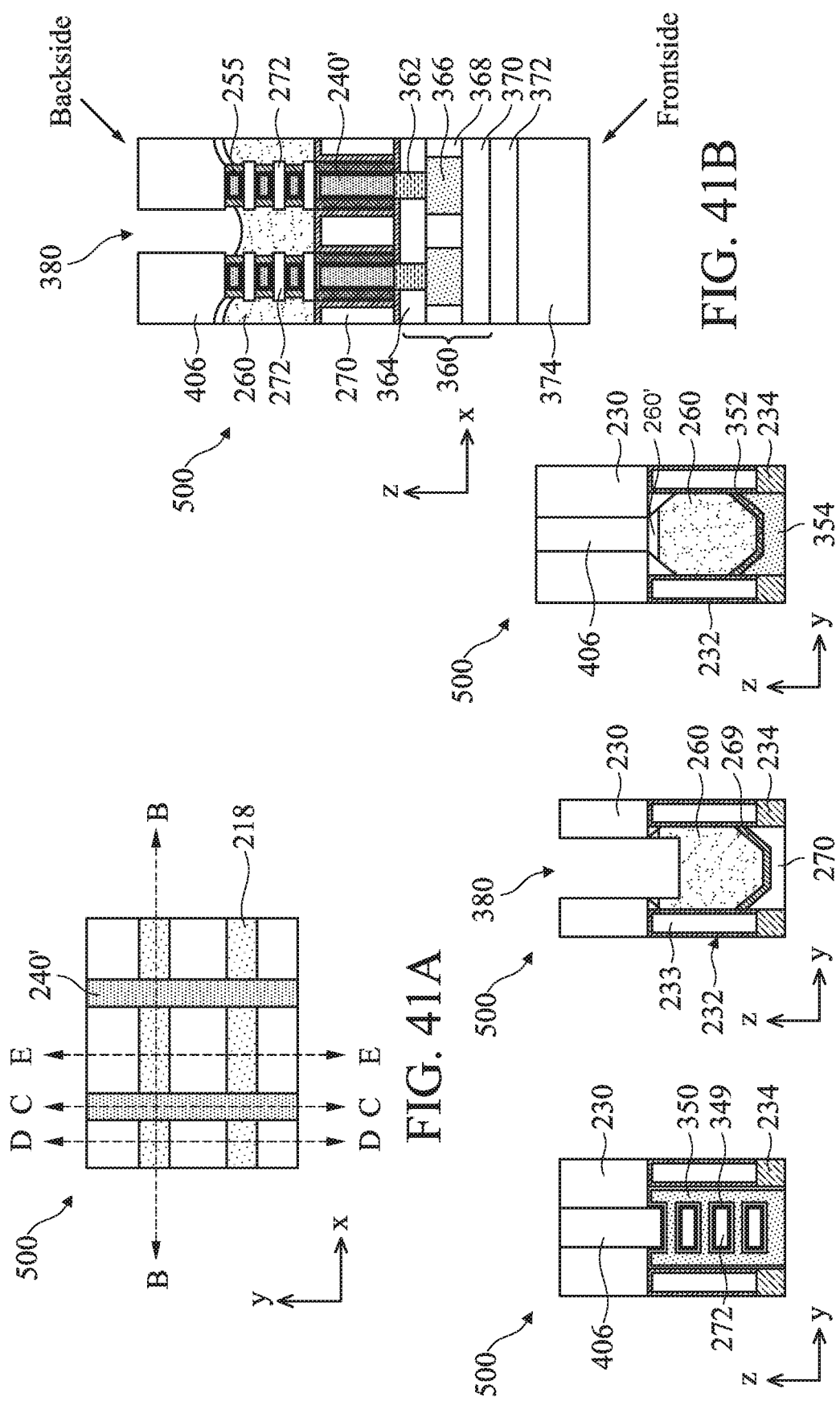

US 11,450,665 B2

SEMICONDUCTOR STRUCTURE WITH SELF-ALIGNED BACKSIDE POWER RAIL

PRIORITY DATA

This application claims priority to U.S. Provisional Patent Application Ser. No. 63/001,819 filed Mar. 30, 2020, the entire disclosure of which is hereby incorporated herein by reference.

BACKGROUND

Integrated circuits have progressed to advanced technologies with smaller feature sizes, such as 7 nm, 5 nm and 3 nm. In these advanced technologies, the gate pitch (spacing) continuously shrinks and therefore induces contact to gate bridge concern. Furthermore, three dimensional transistors, such as those formed on fin-type active regions, are often desired for enhanced device performance. Those three-dimensional field effect transistors (FETs) formed on fin-type active regions are also referred to as FinFETs. Other three-dimensional field-effect transistors include gate-all-around FETs. Those FETs are required narrow fin width for short channel control, which leads to smaller source/drain regions than those of planar FETs. This will reduce the alignment margins and cause issues for further shrinking device pitches and increasing packing density. Along with the scaling down of the device sizes, power lines are formed on the backside of the substrate. However, the existing backside power rails still face various challenges including shorting, leakage, routing resistance, alignment margins, layout flexibility, and packing density. Therefore, there is a need for a structure and method for fin transistors and power rails to address these concerns for enhanced circuit performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2 and 3 illustrate cross-sectional views of a portion of a semiconductor device, according to some embodiments, in intermediate steps of fabrication according to an embodiment of the method of FIGS. 1A-1C.

FIGS. 4A, 5A, 6A, 7A, 8A, 9A, 10A, 11A, 12A, 13A, 14A, 15A, 16A, 17A, 18A, and 19A illustrate top views of a portion of a semiconductor device, according to some embodiments.

FIGS. 4B, 5B, 5C, 5D, 5E, 5F, 5G, 6B, 7B, 7C, 7D, 7E, 8B, 8C, 8D, 8E, 9B, 9C, 9D, 9E, 10B, 10C, 10D, 10E, 11B, 11C, 11D, 11E, 12B, 12C, 12D, 12E, 13B, 13C, 13D, 13E, 14B, 14C, 14D, 14E, 15B, 15C, 15D, 15E, 16B, 16C, 16D, 16E, 17B, 17C, 17D, 17E, 18B, 18C, 18D, 18E, and 19B illustrate cross-sectional views of a portion of a semiconductor device, according to some embodiments.

FIGS. 21A, 22A, 23A, and 24A illustrate top views of a portion of a semiconductor device, according to some embodiments.

FIGS. 21B, 21C, 21D, 21E, 22B, 22C, 22D, 22E, 23B, 23C, 23D, 23E, and 24B illustrate cross-sectional views of a portion of a semiconductor device, according to some embodiments.

FIGS. 28A, 29A, 30A, 31A, 32A, 33A, 34A, 35A, 36A, 37A, 38A, 39A, 40A, 41A, 42A, and 43A illustrate top views of a portion of a semiconductor device, according to some embodiments.

FIGS. 28B, 29B, 29C, 29D, 29E, 29F, 29G, 30B, 31B, 31C, 31D, 31E, 32B, 32C, 32D, 32E, 33B, 33C, 33D, 33E, 34B, 34C, 34D, 34E, 35B, 35C, 35D, 35E, 36B, 36C, 36D, 36E, 37B, 37C, 37D, 37E, 38B, 38C, 38D, 38E, 39B, 39C, 39D, 39E, 40B, 40C, 40D, 40E, 41B, 41C, 41D, 41E, 42B, 42C, 42D, 42E, and 43B illustrate cross-sectional views of a portion of a semiconductor device, according to some embodiments.

DETAILED DESCRIPTION

Figure 1A:
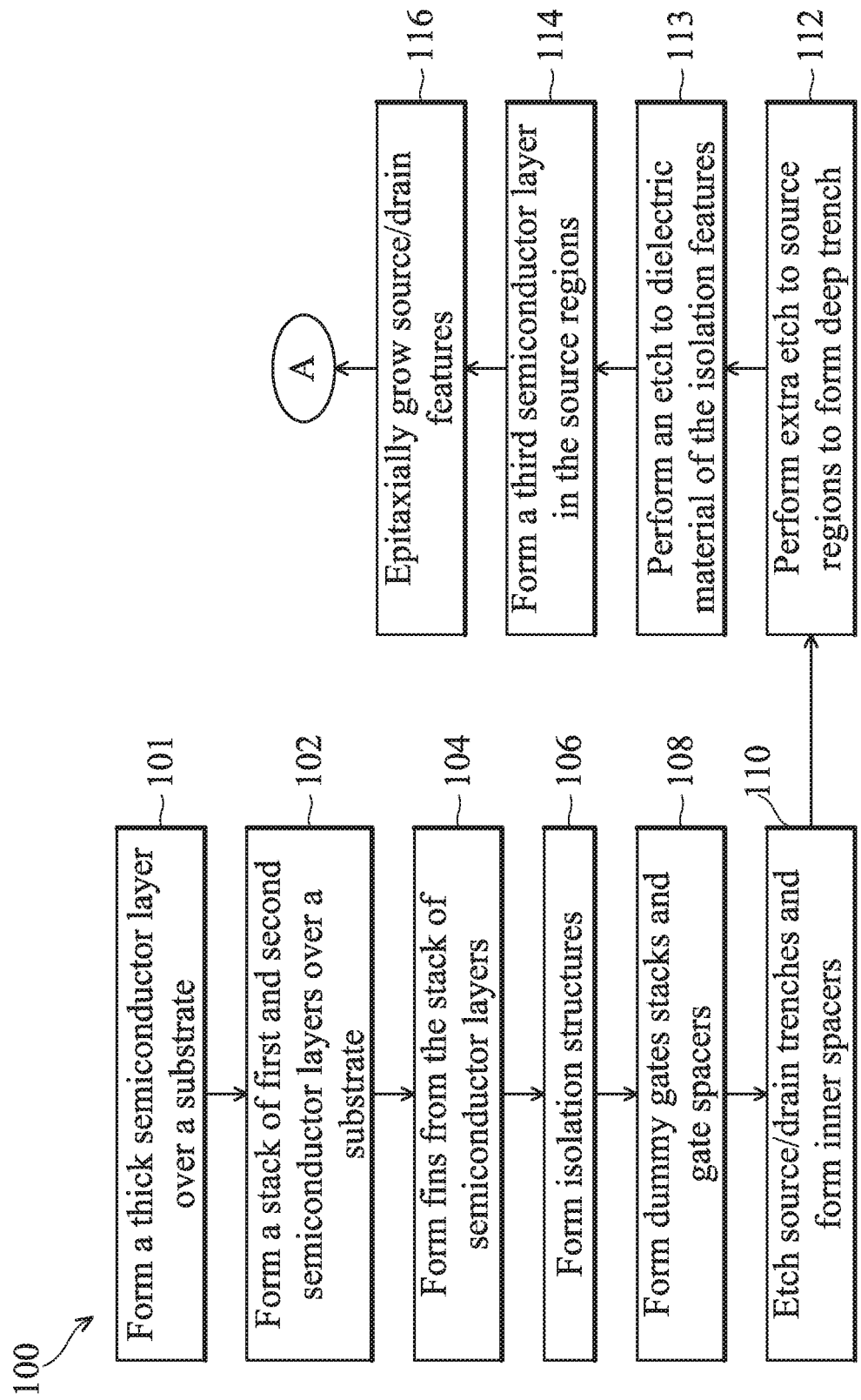
FIGS. 1A, 1B, and 1C show a flow chart of a method of forming a semiconductor device with backside power rails and backside self-aligned vias, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure provides a semiconductor structure with backside power rails and the method of making the same. The semiconductor structure further includes a backside via (also referred to as backside via contact) feature disposed on the back side of the substrate and interposed between the semiconductor active regions (such as fin active regions) and the backside power rail, and electrically connecting the backside power rail to a device feature (such as a source feature of a field-effect transistor (FET)) on the semiconductor active regions. Especially, the backside via feature is self-aligned with the device feature (such as a source feature) to be electrically connected, thus providing the connection without overlay shifting and eliminating the shorting issue, such as shorting between the corresponding metal gate electrode and the backside power rail, which is connected to a source/drain feature though a via feature.

The semiconductor structure also includes an interconnect structure formed on the front side of the substrate. The interconnect structure further includes a front contact feature electrically connected to the FETs, such as landing on and connecting to a drain feature of a transistor, thus distributing power rails to front side and backside of the substrate, reducing the number of power lines from the front side and providing more space for metal routing and processing margin on the front side of the substrate. Such formed semiconductor structure includes backside power rails on the back side and the interconnect structure on the front side to collectively route power lines, such as the drain features being connected to the corresponding power lines through the interconnect structure and source features being connected to the corresponding power lines through the backside power rails. In some embodiments, both front and backside contact features include silicide to reduce contact resistance. The disclosed structure and the method of making the same are applicable to a semiconductor structure having FETs with a three-dimensional structure, such as fin FETs (FinFETs) formed on fin active regions, and FETs with vertically-stacked multiple channels, such as gate-all-around (GAA) structure.

Figure 1B:
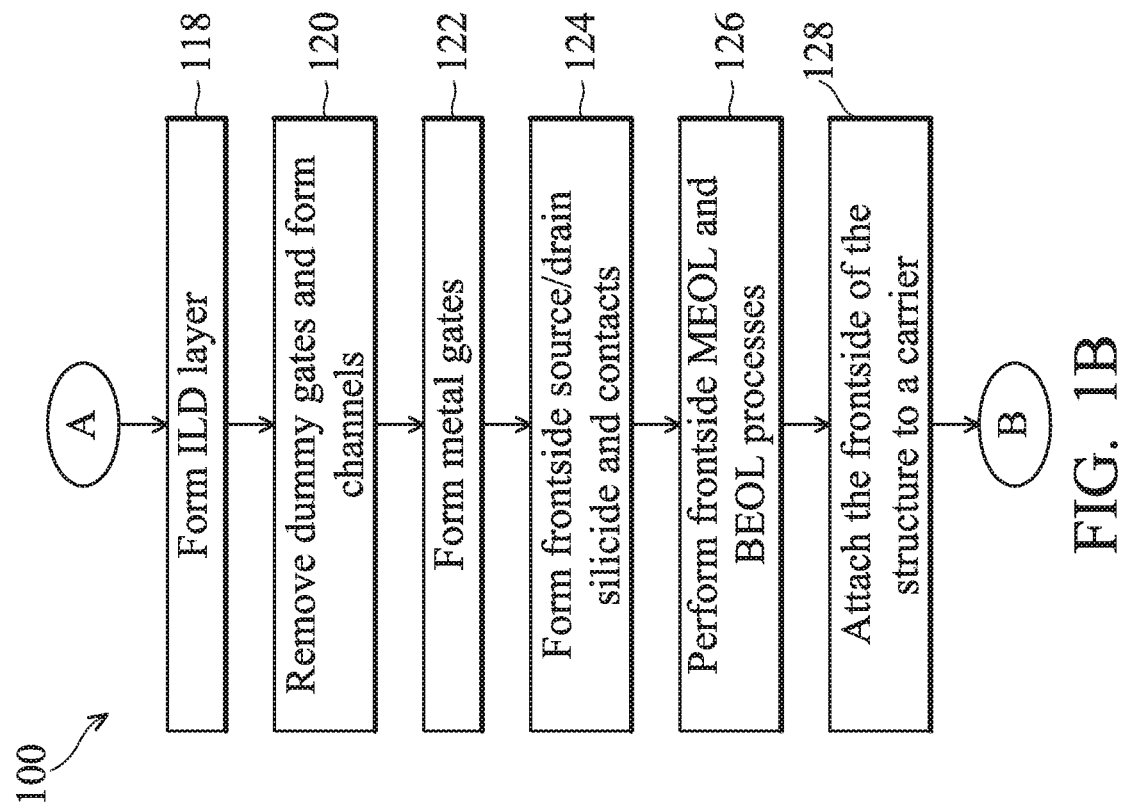
Figure 1C:
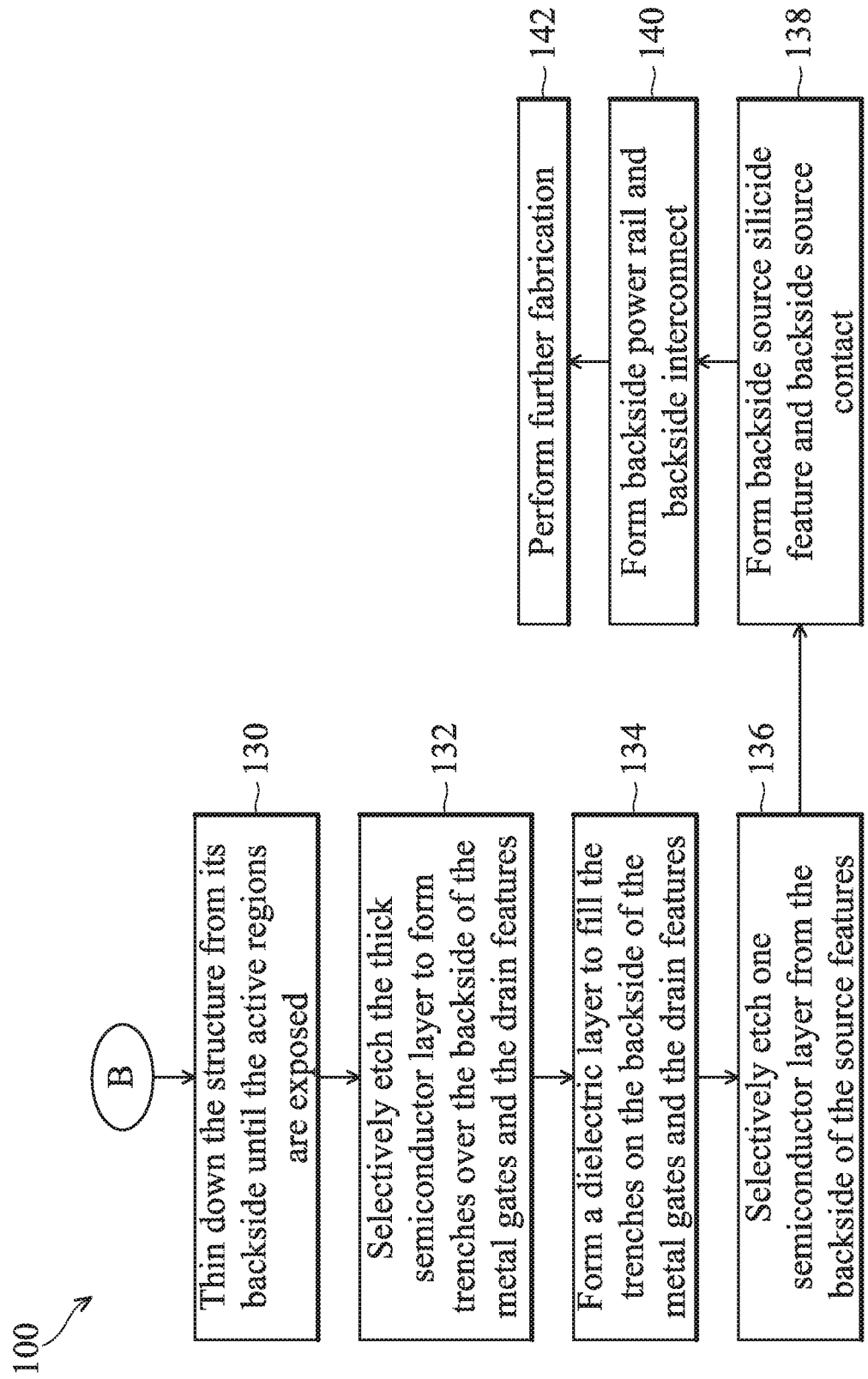

FIGS. 1A, 1B, and 1C are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2 through FIG. 44C that illustrate various top, cross-sectional or perspective views of a semiconductor device (or a semiconductor structure) 200 (or 400 or 500) at different fabrication stages in accordance with various embodiments. In some embodiments, the semiconductor device is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2 through 44C have been simplified for the sake of clarity to better understand the inventive concepts of the present disclosure. Additional features can be added in the semiconductor device 200 (or 400 or 500), and some of the features described below can be replaced, modified, or eliminated in other embodiments of the semiconductor device 200 (or 400 or 500).

FIG. 2 illustrates a substrate 201 according to some embodiments. In the depicted embodiment, the substrate 201 is a semiconductor-on-insulator substrate, such as a silicon-on-insulator (SOI) substrate, a silicon germanium-on-insulator (SGOI) substrate, or a germanium-on-insulator (GOI) substrate. In the depicted embodiment, the substrate 201 includes a semiconductor layer 204, an insulator 203, and a carrier 202. In embodiments, the semiconductor layer 204 can be silicon, silicon germanium, germanium, or other suitable semiconductor; the carrier 202 may be part of a silicon wafer; and the insulator 203 may be silicon oxide. Semiconductor-on-insulator substrates can be fabricated using separation by implantation of oxygen (SIMOX), wafer bonding, and/or other suitable methods. In an alternative embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof.

In some embodiment, the semiconductor layer 204 may include various doped regions depending on design requirements of the device 200. For example, N-type doped regions, can be formed by doping with n-type dopants, such as phosphorus, arsenic, other n-type dopant, or combinations thereof; and P-type doped regions can be formed by doping with p-type dopants, such as boron, indium, other p-type dopant, or combinations thereof. In some implementations, the semiconductor layer 204 includes doped regions formed with a combination of p-type dopants and n-type dopants. In some embodiment, the semiconductor layer 204 is undoped or unintentionally doped with a very low number of dopants.

At operation 101, the method 100 (FIG. 1A) forms a semiconductor layer 207 over the substrate 201, as illustrated in FIG. 3. The semiconductor layer 207 is different from the semiconductor layer 204. In some embodiments, the semiconductor layer 204 is a silicon layer and the semiconductor layer 207 is a silicon germanium (SiGe) layer. An additional semiconductor material 208 may be further grown over the semiconductor layer 207 and may be a silicon layer, such as an undoped silicon layer. In the depicted embodiment, the semiconductor layer 207 of SiGe is embedded in the silicon substrate including silicon layers 204 and 208. The semiconductor layer 207 is formed by a suitable method, such as epitaxial growth. The semiconductor layer 207 has a thickness ranging between 20 nm and 100 nm according to some embodiments, which is greater than above silicon germanium films in the semiconductor stack (to be described below), therefore being referred to as a thick semiconductor layer.

At operation 102, the method 100 (FIG. 1A) forms a stack 205 of first and second semiconductor layers over a substrate 201. The resultant structure is shown in FIG. 3 according to an embodiment. The semiconductor layer stack 205 includes semiconductor layers 210 and semiconductor layers 215 stacked vertically (e.g., along the z-direction) in an interleaving (alternating configuration) from a surface of the substrate 201. In some embodiments, semiconductor layers 210 and semiconductor layers 215 are epitaxially grown in the depicted interleaving and alternating configuration. For example, a first one of semiconductor layers 210 is epitaxially grown over the substrate 201, a first one of semiconductor layers 215 is epitaxially grown on the first one of semiconductor layers 210, a second one of semiconductor layers 210 is epitaxially grown on the first one of semiconductor layers 215, and so on until semiconductor layers stack 205 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different from a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of the device 200. For example, where semiconductor layers 210 include silicon germanium and semiconductor layers 215 include silicon, a silicon etch rate of semiconductor layers 215 is less than a silicon germanium etch rate of semiconductor layers 210 for given etchant. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions of the device 200. In the depicted embodiment, semiconductor layer stack 205 includes three semiconductor layers 210 and three semiconductor layers 215 configured to form three semiconductor layer pairs disposed over substrate 201, each semiconductor layer pair having a respective first semiconductor layer 210 and a respective second semiconductor layer 215. After undergoing subsequent processing, such configuration will result in the device 200 having three channels. However, the present disclosure contemplates embodiments where semiconductor layer stack 205 includes more or less semiconductor layers, for example, depending on a number of channels desired for the device 200 (e.g., a GAA transistor) and/or design requirements of the device 200. For example, semiconductor layer stack 205 can include two to ten semiconductor layers 210 and two to ten semiconductor layers 215. In an alternative embodiment where the device 200 is a FinFET device, the stack 205 is simply one layer of a semiconductor material, such as one layer of Si. As will be discussed, the method 100 will process layers at both sides of the substrate 201. In the present disclosure, the side of the substrate 201 where the stack 205 resides is referred to as the frontside and the side opposite the frontside is referred to as the backside.

In the depicted embodiments, the semiconductor layer 207 and the semiconductor layer 210 include silicon germanium but with different thicknesses and may further include different compositions. For example, the semiconductor layer 207 has a thickness greater than the thickness of each of the semiconductor layers 210. In another example, the semiconductor layer 207 has a different germanium concentration, such as a greater concentration, than that of the semiconductor layers 210. In yet another example, the semiconductor layer 207 has a different germanium concentration and a different thickness than those of the semiconductor layers 210.

Figure 4B:
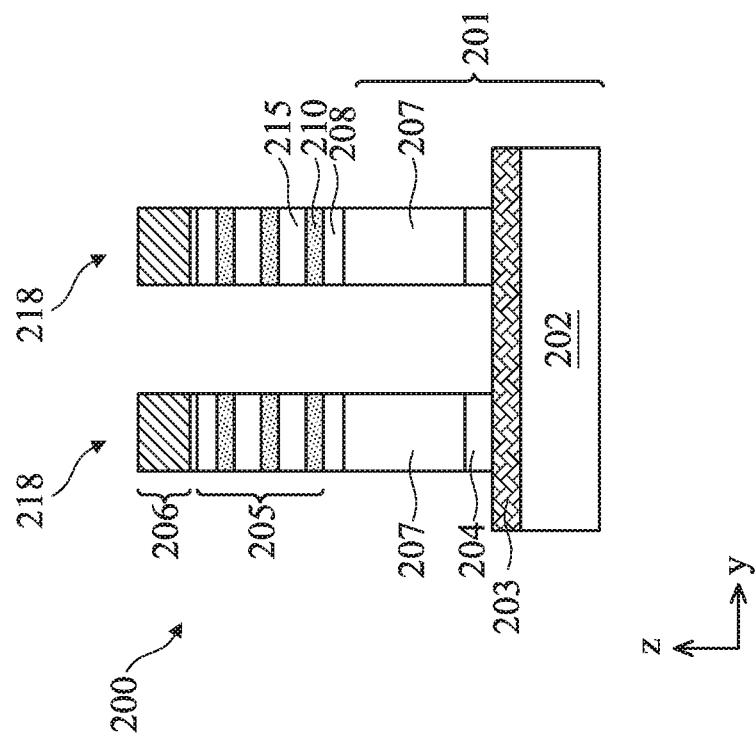
Figure 4A:
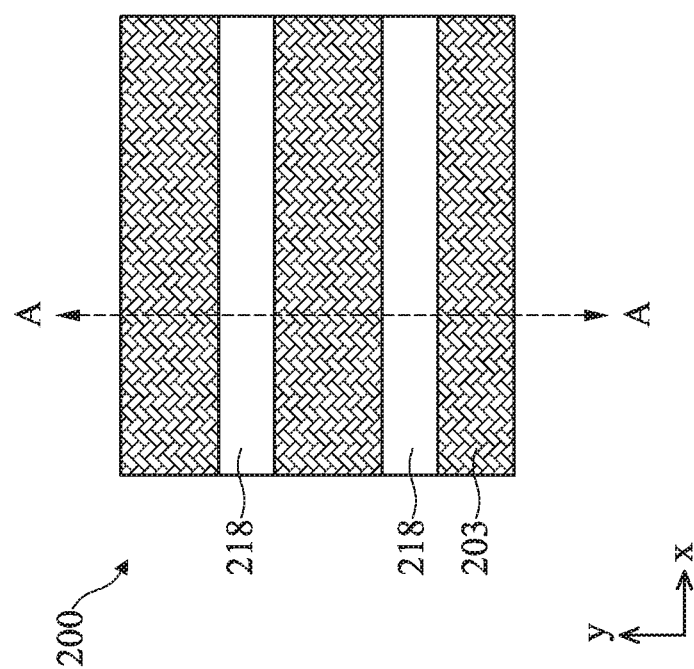

At operation 104, the method 100 (FIG. 1A) forms fins 218 by patterning the stack 205 and the substrate 201. FIG. 4A illustrates a top view of the device 200 with fins 218 oriented along the "x" direction. FIG. 4B illustrates a cross-sectional view of the device 200, in portion, along the A-A line in FIG. 4A. As illustrated in FIG. 4B, the fins 218 include the patterned stack 205 (having layers 210 and 215), patterned semiconductor layers (204 and 207), and one or more patterned hard mask layers 206. The fins 218 may be patterned by any suitable method. For example, the fin 218 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 205 and patterned using a photolithography process. Spacers are formed alongside the patterned sacrificial layer using a self-aligned process. The sacrificial layer is then removed, and the remaining spacers, or mandrels, may then be used as a masking element for patterning the fins 218. For example, the masking element may be used for etching recesses into the stack 205 and the substrate 201, leaving the fins 218 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchants. Numerous other embodiments of methods to form the fins 218 may be suitable.

Figure 5A:
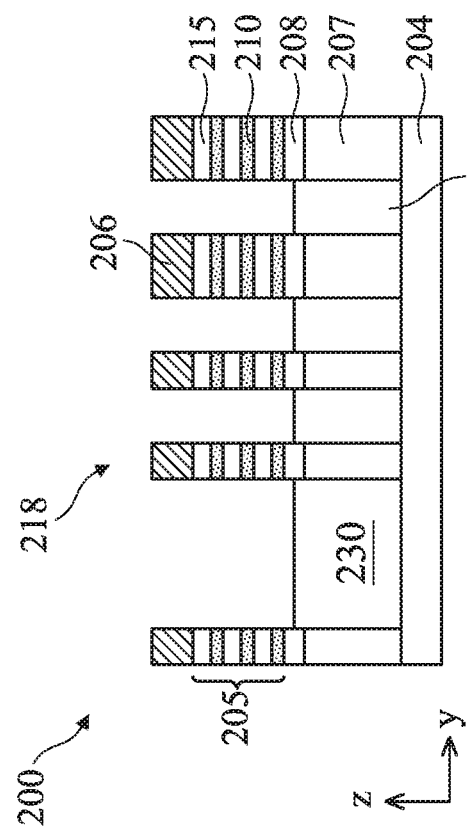

At operation 106, the method 100 (FIG. 1A) forms various isolation structures over the substrate 201 and isolate the fins 218, an embodiment of which is illustrated in FIGS. 5A-5G. FIG. 5A illustrates a top view of the device 200, and FIGS. 5B-5G illustrate cross-sectional views of the device 200, in portion, along the A-A line in FIG. 5A at various steps of the operation 106. Some features are not illustrated in those figures and other figures for simplicity.

Figure 5B:
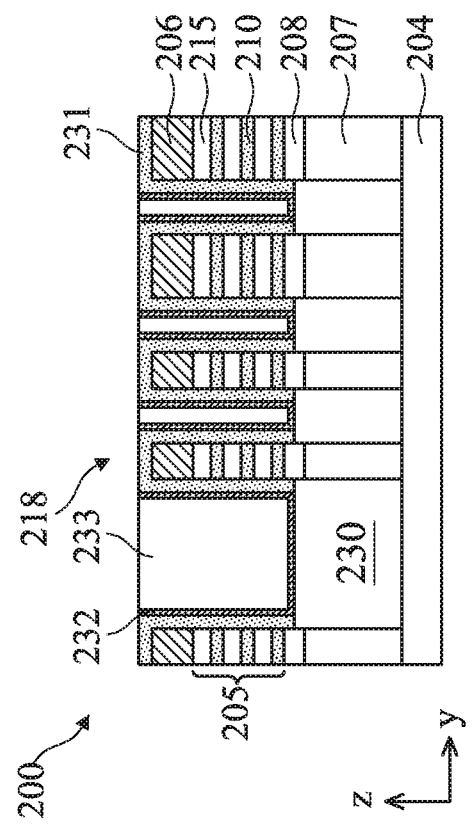

Referring to FIG. 5B, an isolation feature(s) 230 is formed over and/or in substrate 201 to isolate various active regions of the device 200. For example, isolation features 230 surround a bottom portion of fins 218 to separate and isolate fins 218 from each other. The isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In an embodiment, the isolation features 230 can be formed by filling the trenches between fins 218 with dielectric material layer (for example, by using a CVD process or a spin-on glass process), performing a chemical mechanical polishing (CMP) process to remove excessive dielectric material and/or planarize a top surface of the dielectric material layer, and etching back the dielectric material layer to form isolation features 230. In some embodiments, isolation features 230 include a multi-layer structure, such as a silicon nitride layer disposed over a thermal oxide liner layer.

In the depicted embodiments, the isolation features 230 is formed such that the top surface of the isolation features 230 is above the top surface of the semiconductor layer 207. In the depicted embodiments, the isolation features 230 is formed such that the bottom surface of the isolation features 230 is extended to the insulator 203.

Figure 5C:
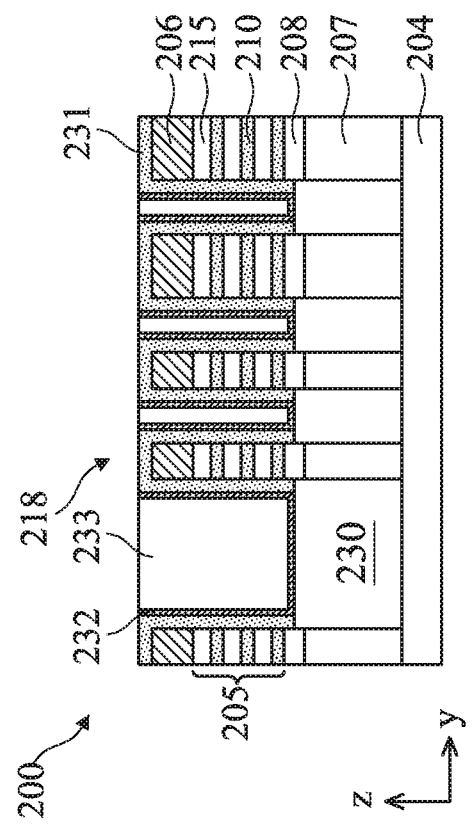

Referring to FIG. 5C, a cladding (semiconductor) layer 231 is deposited over the top and sidewall surfaces of the fins 218 and above the isolation features 230. In an embodiment, the cladding layer 231 includes SiGe. The cladding layer 231 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. After the cladding layer 231 is deposited, operation 106 performs an etching process to remove the portion of the cladding layer 231 from above the isolation features 230, for example, using a plasma dry etching process.

Figure 5D:
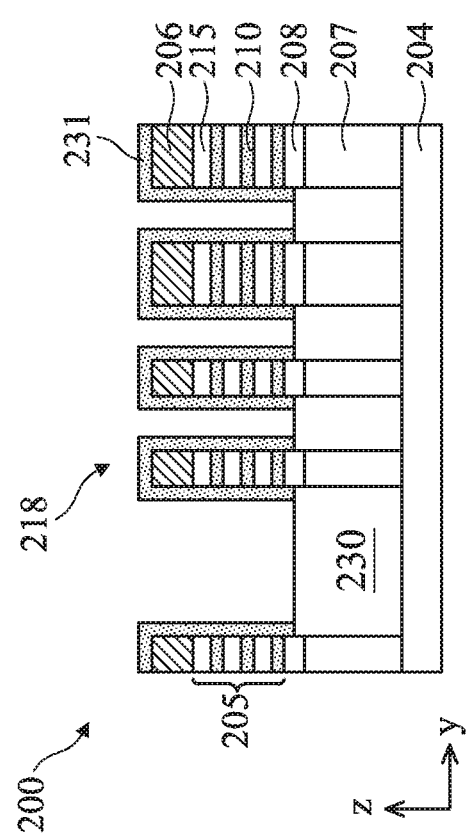

Referring to FIG. 5D, a dielectric liner 232 is deposited over the cladding layer 231 and on top surfaces of the isolation features 230, then a dielectric fill layer 233 is deposited over the dielectric liner 232 and fills the gaps between the fins 218. In an embodiment, the dielectric liner 232 includes a low-k dielectric material such as a dielectric material including Si, O, N, and C. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, or combinations thereof. Low-k dielectric material generally refers to dielectric materials having a low dielectric constant, for example, lower than that of silicon oxide (k≈3.9). The dielectric liner 232 may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233 includes silicon oxide, silicon nitride, silicon oxynitride, TEOS formed oxide, PSG, BPSG, low-k dielectric material, other suitable dielectric material, or combinations thereof. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods. After the layers 232 and 233 are deposited, the operation 106 may perform a CMP process to planarize the top surface of the device 200 and to expose the cladding layer 231.

Referring to FIG. 5E, a dielectric helmet 234 is deposited over the dielectric layers 232 and 233 and between the cladding layer 231 on opposing sidewalls of the fins 218. In an embodiment, the dielectric helmet 234 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The dielectric helmet 234 is formed by any of the processes described herein, such as ALD, CVD, PVD, oxidation-based deposition process, other suitable process, or combinations thereof. In an embodiment, the operation 106 includes recessing the dielectric layers 232 and 233 using a selective etching process that etches the dielectric layers 232 and 233 with no (or minimal) etching to the hard mask 206 and the cladding layer 231. Then, the operation 106 deposits one or more dielectric materials into the recesses and performs a CMP process to the one or more dielectric materials to form the dielectric helmet 234.

Referring to FIG. 5F, the operation 106 recesses the fins 218 (particularly removing the hard mask layers 206) and the cladding layer 231 that are disposed between the dielectric helmet 234. The operation 106 may apply one or more etching processes that are selective to the hard mask layers 206 and the cladding layer 231 and with no (or minimal) etching to the dielectric helmet 234. The selective etching processes can be dry etching, wet drying, reactive ion etching, or other suitable etching methods.

Referring to FIG. 5G, the operation 106 deposits a dielectric layer 235 over the surfaces of the fins 218 and over the dielectric helmet 234. In the present embodiment, the dielectric layer 235 is a dummy (or sacrificial) gate dielectric layer. The dummy gate dielectric 235 includes a dielectric material, such as silicon oxide, a high-k dielectric material, other suitable dielectric material, or combinations thereof and may be deposited using any of the processes described herein, such as ALD, CVD, PVD, other suitable process, or combinations thereof.

At operation 108, the method 100 (FIG. 1A) forms gate stacks 240 over the dummy gate dielectric 235. The resultant structure is shown in FIGS. 6A-6B according to an embodiment. FIG. 6A illustrates a top view of the device 200, and FIG. 6B illustrates a cross-sectional view of the device 200, in portion, along the B-B line in FIG. 6A. From a top view, the gate stacks 240 are oriented lengthwise generally along the "y" direction perpendicular to the "x" direction. In the present embodiment, the gate stacks 240 are dummy (or sacrificial) gate stacks and will be replaced with functional gate stacks 240'. Dummy gate stacks 240 are formed by deposition processes, lithography processes, etching processes, other suitable processes, or combinations thereof. For example, a deposition process is performed to form a dummy gate electrode layer 245 over the dummy gate dielectric layer 235. In some embodiment, one or more hard mask layers 246 (such as silicon oxide film and silicon nitride film) are deposited over the dummy gate electrode layer 245. In some embodiments, the dummy gate electrode layer 245 includes polysilicon or other suitable material and the one or more hard mask layers 246 include silicon oxide, silicon nitride, or other suitable materials. The deposition process may include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. A lithography patterning and etching process is then performed to pattern the one or more hard mask layers 246, the dummy gate electrode layer 245, and the dummy gate dielectric layer 235 to form dummy gate stacks 240, as depicted in FIG. 6B. More particularly, the lithography process forms a patterned photoresist layer with openings, an etching process is applied to transfer the openings to the hard mask layers 246, and then another etching process is applied to the dummy gate layers 245 and 235 to transfer the openings from the hard mask layers to the dummy gate layers. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

The operation 108 further forms gate spacers 247 on sidewalls of the dummy gate stacks 240 (as shown in FIG. 6B). Gate spacers 247 are formed by any suitable process and include one or more dielectric material. The dielectric material may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 240. In such implementations, the various sets of spacers can include materials having different etch rates. For example, a first dielectric layer including silicon and oxygen (e.g., silicon oxide) can be deposited and etched to form a first spacer set adjacent to dummy gate stacks 240, and a second dielectric layer including silicon and nitrogen (e.g., silicon nitride) can be deposited and etched to form a second spacer set adjacent to the first spacer set.

At operation 110, the method 100 (FIG. 1A) forms source/drain (S/D) trenches 250 by etching the fins 218 adjacent the gate spacers 247. The resultant structure is shown in FIGS. 7A-7E according to an embodiment. FIG. 7A illustrates a top view of the device 200, and FIGS. 7B, 7C, 7D, and 7E illustrate cross-sectional views of the device 200, in portion, along the B-B line, the C-C line, the D-D line, and the E-E line in FIG. 7A, respectively. Particularly, the D-D line is cut into the source regions of the transistors and is parallel to the gate stacks 240, and the E-E line is cut into the drain regions of the transistors and is parallel to the gate stacks 240. The D-D lines and the E-E lines in FIGS. 8A through 18A, 21A through 23A, and 31A through 42A are similarly configured.

In the depicted embodiment, an etching process completely removes semiconductor layer stack 205 in source/drain regions of fins 218 thereby exposing the substrate (such as the semiconductor layer 208) in the source/drain regions. Source/drain trenches 250 thus have sidewalls defined by remaining portions of semiconductor layer stack 205, which are disposed in channel regions under the gate stacks 240, and bottoms defined by substrate (such as the semiconductor layer 208). In some embodiments, the etching process removes the semiconductor layer stack 205 such that the isolation features 230 are exposed within the trenches 250. In some embodiments, the etching process removes some, but not all, of semiconductor layer stack 205, such that source/drain trenches 250 have bottoms defined by semiconductor layer 210 or semiconductor layer 215 in source/drain regions. In some embodiments, the etching process further removes some, but not all, of the substrate portion of fins 218, such that source/drain trenches 250 extend below a topmost surface of substrate 201. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of gate stacks 240 and/or isolation features 230. In some embodiments, a lithography process, such as those described herein, is performed to form a patterned mask layer that covers gate stacks 240 and/or isolation features 230, and the etching process uses the patterned mask layer as an etch mask.

The operation 110 further forms inner spacers 255 (see FIG. 7B) along sidewalls of semiconductor layers 210 inside the S/D trenches 250. For example, a first etching process is performed that selectively etches semiconductor layers 210 exposed by source/drain trenches 250 with minimal (to no) etching of semiconductor layers 215, such that gaps are formed between semiconductor layers 215 and between semiconductor layers 215 and semiconductor layer 204 under gate spacers 247. Portions (edges) of semiconductor layers 215 are thus suspended in the channel regions under gate spacers 247. In some embodiments, the gaps extend partially under dummy gate stacks 240. The first etching process is configured to laterally etch (e.g., along the "x" direction) semiconductor layers 210, thereby reducing a length of semiconductor layers 210 along the "x" direction. The first etching process is a dry etching process, a wet etching process, other suitable etching process, or combinations thereof. A deposition process then forms a spacer layer over gate structures 240 and over features defining source/drain trenches 250 (e.g., semiconductor layers 215, semiconductor layers 210, and semiconductor layer 204), such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 250. The deposition process is configured to ensure that the spacer layer fills the gaps between semiconductor layers 215 and between semiconductor layers 215 and substrate 201 under gate spacers 247. A second etching process is then performed that selectively etches the spacer layer to form inner spacers 255 as depicted in FIG. 7B with minimal (to no) etching of semiconductor layers 215, dummy gate stacks 240, and gate spacers 247. In some embodiments, the spacer layer is removed from sidewalls of gate spacers 247, sidewalls of semiconductor layers 215, dummy gate stacks 240, and substrate 201. The spacer layer (and thus inner spacers 255) includes a material that is different than a material of semiconductor layers 215 and a material of gate spacers 247 to achieve desired etching selectivity during the second etching process. In some embodiments, the spacer layer 255 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer layer 255 includes a low-k dielectric material, such as those described herein. In embodiments where the device 200 is a FinFET, the inner spacer 255 is omitted.

At operation 112, the method 100 (FIG. 1A) performs extra etching to a subset of the S/D regions, such as the source regions of the device 200 according to the depicted embodiment, resulting deep trenches in the source regions. The resultant structure is shown in FIGS. 8A-8E according to an embodiment. FIG. 8A illustrates a top view of the device 200, and FIGS. 8B, 8C, 8D, and 8E illustrate cross-sectional views of the device 200, in portion, along the B-B line, the C-C line, the D-D line, and the E-E line in FIG. 8A, respectively.

In the depicted embodiment, the operation 112 forms an etch mask 241 that includes a patterned hard mask 236 and a patterned resist 237. The etch mask 241 covers the device 200 except the source regions, which are exposed through openings 238 in the etch mask 241. Then, the operation 112 etches the source regions deeply in the substrate 201, such as through the semiconductor layer 207 until only a thin layer 204 remains in the source trench 250, thereby extending the source trench 250 into the substrate 201. The etching process may include dry etching, wet etching, reactive ion etching, or other suitable etching. The etching process is substantially anisotropic (i.e., substantially vertical) in this embodiment. Also, the etching process is tuned selective to the material of the semiconductor layer 204 and with no (or minimal) etching to the gate spacers 247 and gate hard mask layers 246. The etching process in the operation 112 may be similar to the etching process in the operation 110. After the etching process finishes, the operation 112 removes the patterned resist 237, for example, by a stripping process.

The method 100 may further include an operation 113 applied to the isolation features 230 in the source trench 250 such that the source trench 250 is wider (as illustrated in FIG. 9D). In the depicted embodiment, the operation 113 is pre-clean process before the epitaxial growth in the operation 114. The pre-clean process applies a cleaning chemical to clean the trench 250 and pull back (partially remove) the isolation features 230 such that the trench 250 is laterally enlarged. In some embodiments, the cleaning chemical includes a dry etch process for cleaning the surface and partially removing the isolation features 230 (such as silicon oxides) using an ammonia ($NH_3$) and nitrogen trifluoride ($NF_3$) gas mixture. The plasma energy dissociates the ammonia and nitrogen trifluoride gases into reactive species that combine to form a highly reactive ammonia fluoride ($NH_4F$) compound and/or ammonium hydrogen fluoride ($NH_4F \cdot HF$) in the gas phase. These molecules react with the isolation features 230 to be cleaned. In the depicted embodiment, the trench 250 is widen such that the lateral dimension increasement ranges between 1 nm and 6 nm, which will lead to greater a size of the backside via feature (will be further described at later stages) and decreased resistance thereof.

At operation 114, the method 100 (FIG. 1A) forms a semiconductor layer 239 in the source trenches 250. The resultant structure is shown in FIGS. 9A-9E according to an embodiment. FIG. 9A illustrates a top view of the device 200, and FIGS. 9B, 9C, 9D, and 9E illustrate cross-sectional views of the device 200, in portion, along the B-B line, the C-C line, the D-D line, and the E-E line in FIG. 9A, respectively.

The semiconductor layer 239 may be deposited using an epitaxial growth process or by other suitable processes. In some embodiments, epitaxial growth of semiconductor layers 239 is achieved by a molecular beam epitaxy (MBE) process, a chemical vapor deposition (CVD) process, a metalorganic chemical vapor deposition (MOCVD) process, other suitable epitaxial growth process, or combinations thereof. The semiconductor layer 239 includes a semiconductor material that is different than the semiconductor material included in the semiconductor layer 207 to achieve etching selectivity during subsequent processing. For example, semiconductor layers 239 and 207 (or additionally semiconductor layer 204) may include different materials, different constituent atomic percentages, different constituent weight percentages, and/or other characteristics to achieve desired etching selectivity during an etching process. In an embodiment, the semiconductor layer 207 includes silicon germanium and the semiconductor layer 239 includes silicon, such as undoped silicon. By using undoped silicon, deep portion of the source/drain features 260 for both nFETs and pFETs can share a same epitaxial process and save the fabrication cost. In alternative embodiment, the semiconductor layer 239 includes silicon doped with boron to enhance etch selectivity to the etching process applied to etch silicon germanium at later stage for backside processing. In another embodiment, semiconductor layers 239 and 207 can both include silicon germanium, but with different silicon atomic percent. The present disclosure contemplates that semiconductor layers 239 and 207 include any combination of semiconductor materials that can provide desired etching selectivity, including any of the semiconductor materials disclosed herein. Since the drain regions (FIG. 9E) are covered by the patterned hard mask layer 236, the semiconductor layer 239 is only deposited in the source regions (FIG. 9D). The semiconductor layer 239 is deposited to a thickness such that it is extending up to the bottom of the stack 205 (FIG. 9B) and is about level with the top surface of the isolation features 230 (FIG. 9D). The operation 114 may include an etching process that recesses the semiconductor layer 239 to the level shown in FIGS. 9B and 9D if the semiconductor layer 239 is initially grown taller than that. After the semiconductor layer 239 is deposited, the operation 114 removes the patterned hard mask layer 236 by one or more etching processes. As will be discussed below, the extra etching in the operation 112 and the growing of the semiconductor layer 239 in the operation 114 can be performed in source regions only, drain regions only, or both source and drain regions in various embodiments.

At operation 116, the method 100 (FIG. 1A) epitaxially grows semiconductor S/D features 260 in the S/D trenches 250. The resultant structure is shown in FIGS. 10A-10E according to an embodiment. FIG. 10A illustrates a top view of the device 200, and FIGS. 10B, 10C, 10D, and 10E illustrate cross-sectional views of the device 200, in portion, along the B-B line, the C-C line, the D-D line, and the E-E line in FIG. 10A, respectively.

As shown in FIGS. 10B, 10D, and 10E, epitaxial S/D features 260 are grown from the semiconductor layers (such as 208 and 239) at the bottom of the S/D trenches 250 and from the semiconductor layers 215 at the sidewalls of the S/D trenches 250. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 208, 239, and 215 (in particular, semiconductor layers 215). Epitaxial S/D features 260 are doped with n-type dopants or p-type dopants for n-type transistors or p-type transistors respectively. In some embodiments, for n-type transistors, epitaxial S/D features 260 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, epitaxial S/D features 260 include silicon germanium or germanium and can be doped with boron, other p-type dopant, or combinations thereof (for example, forming Si:Ge:B epitaxial source/drain features). In some embodiments, epitaxial S/D features 260 include more than one epitaxial semiconductor layer, where the epitaxial semiconductor layers can include the same or different materials and/or dopant concentrations. Further, in an embodiment, the S/D feature 260 (or at least its portion adjoining to the semiconductor layer 239) includes a different material composition than the semiconductor layer 239 to achieve etch selectivity during backside via formation process. For example, in an embodiment, the semiconductor layer 239 include undoped silicon and the S/D feature 260 includes doped silicon (n-type doped for n-type transistor or p-type doped for p-type transistor). In some embodiments, epitaxial source/drain features 260 are doped during deposition by adding impurities to a source material of the epitaxy process (i.e., in-situ). In some embodiments, epitaxial source/drain features 260 are doped by an ion implantation process subsequent to a deposition process. In some embodiments, annealing processes (e.g., rapid thermal annealing (RTA) and/or laser annealing) are performed to activate dopants in epitaxial source/drain features 260. In some embodiments, epitaxial source/drain features 260 are formed in separate processing sequences that include, for example, masking p-type GAA transistor regions when forming epitaxial source/drain features 260 in n-type GAA transistor regions and masking n-type GAA transistor regions when forming epitaxial source/drain features 260 in p-type GAA transistor regions. Further, as shown in FIGS. 10D and 10E, the S/D features 260 are formed into polygon shapes, leaving multiple surfaces with different crystalline orientation. In some embodiments, air gaps may be formed in the trenches 250, being capped by the S/D features 260. In some embodiments, the S/D features 260 include more than one semiconductor layers with different compositions, different dopants, different doping concentrations or a combination thereof, to achieve strain effect or other advantages of the device performance. In the depicted example, the S/D features 260 further include an epitaxially grown semiconductor layer 260' having silicon doped with boron for both nFETs and pFETs.

At operation 118, the method 100 (FIG. 1B) forms a contact etch stop layer (CESL) 269 and an inter-layer dielectric (ILD) layer 270.

At operation 120, the method 100 (FIG. 1B) removes the dummy gates 240 and forms vertically stacked channels 272.

The resultant structure is shown in FIGS. 11A-11E according to an embodiment. FIG. 11A illustrates a top view of the device 200, and FIGS. 11B, 11C, 11D, and 11E illustrate cross-sectional views of the device 200, in portion, along the B-B line, the C-C line, the D-D line, and the E-E line in FIG. 11A, respectively.

Referring to FIGS. 11B, 11D and 11E, the operation 118 forms the CESL 269 and the ILD layer 270. The CESL 269 is deposited over the S/D features 260. The ILD layer 270 is deposited over the CESL 269. The CESL 269 includes a material that is different than ILD layer 270 to achieve etch selectivity and etch stop function. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may include tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods. Subsequent to the deposition of the CESL 269 and the ILD layer 270, a CMP process and/or other planarization process can be performed until reaching (exposing) a top portion (or top surface) of dummy gate stacks 240. In some embodiments, the planarization process removes hard mask of dummy gate stacks 240 to expose underlying dummy gate electrodes 245, such as polysilicon gate electrode layers.

Referring to FIGS. 11B and 11C, the operation 120 removes the dummy gate stacks 240 and forms suspended channels 272. First, the operation 120 includes a first etching process to remove the dummy gate stacks 240 (the dummy gate electrodes 245 and the dummy gate dielectric layer 235, see FIG. 6B) using one or more etching etchants. This forms a gate trench 271. The etching process may be a dry etching process, a wet etching process, other suitable etching process, or combinations thereof. In some embodiments, the etching process is a multi-step etch process. For example, the etching process may alternate etchants to separately remove various layers of dummy gate stacks 240. In some embodiments, the etching process is designed and formulated to selectively etch dummy gate stacks 240 with minimal (to no) etching of other features of the device 200, such as ILD layer 270, gate spacers 247, isolation features 230, cladding layer 231, and semiconductor layers 210.

The operation 120 further includes a second etching process to selectively remove the semiconductor layers 210 and the cladding semiconductor layer 231 exposed within the gate trench 271, leaving the semiconductor layers 215 suspended over the substrate 201 and connected with the S/D features 260. This process is also referred to as a channel release process and the semiconductor layers 215 are also referred to as channel layers. The second etching process selectively etches semiconductor layers 210 with minimal (to no) etching of semiconductor layers 215 and, in some embodiments, minimal (to no) etching of gate spacers 247 and/or inner spacers 255. The second etching process may first etch and remove the cladding layer 231, thus providing path to further etch and remove the semiconductor layers 210. In the depicted embodiment, both the cladding layer 231 and the semiconductor layers 210 include silicon germanium while the semiconductor layers 215 include silicon, the second etching process may be tuned to have etch selectivity between silicon germanium and silicon. In some embodiments, the silicon germanium may be selectively oxidized and then is selectively etched away. In embodiments where the device 200 is a FinFET, the channel release process is omitted because there is only a channel layer 215 and there are no semiconductor layers 210 in the channel region.

At operation 122, the method 100 (FIG. 1B) form functional gate stacks 240', such as metal gate stacks having high-k dielectric material as gate dielectric layer and metal as gate electrode. The resultant structure is shown in FIGS. 12A-12E according to an embodiment. FIG. 12A illustrates a top view of the device 200, and FIGS. 12B, 12C, 12D, and 12E illustrate cross-sectional views of the device 200, in portion, along the B-B line, the C-C line, the D-D line, and the E-E line in FIG. 12A, respectively.

The operation 122 forms a gate dielectric layer 349 that wraps around each of the semiconductor layers 215 and forms a gate electrode 350 over the gate dielectric layer 349. The functional gate stack 240' includes the gate dielectric layer 349 and the gate electrode 350. The gate dielectric layer 349 may include a high-k dielectric material such as $HfO_2$, $HfSiO$, $HfSiO_4$, $HfSiON$, $HfLaO$, $HfTaO$, $HfTiO$, $HfZrO$, $HfAlO_x$, $ZrO$, $ZrO_2$, $ZrSiO_2$, $AlO$, $AlSiO$, $Al_2O_3$, $TiO$, $TiO_2$, $LaO$, $LaSiO$, $Ta_2O_3$, $Ta_2O_5$, $Y_2O_3$, $SrTiO_3$, $BaZrO$, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). The gate dielectric layer 349 may be formed by chemical oxidation, thermal oxidation, atomic layer deposition (ALD), chemical vapor deposition (CVD), and/or other suitable methods. In some embodiments, the gate stack 240' further includes an interfacial layer between the gate dielectric layer 349 and the channels 272. The interfacial layer may include silicon dioxide, silicon oxynitride, or other suitable materials. In some embodiments, the gate electrode layer 350 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240' includes a high-k dielectric layer and metal layer(s), it is also referred to as a high-k metal gate.

The method 100 (FIG. 1B) performs various operations on the frontside of the device 200, including middle end of line (MEOL) process, back end of line (BEOL) process, bonding a carrier on the frontside of the device 200. The resultant structure is shown in FIGS. 13A, 13B, 13C, 13D, and 13E according to an embodiment. FIG. 13A illustrates a top view of the device 200, and FIGS. 13B, 13D, and 13E illustrate cross-sectional views of the device 200, in portion, along the B-B line, the D-D line, and the E-E line in FIG. 13A, respectively. Especially, FIGS. 13B, 13D, and 13E are illustrated in a flip view such that the frontside and backside of the device 200 are flipped.

At operation 124, the method 100 (FIG. 1B) forms frontside S/D contact features 354 landing on some of the S/D features 260. The operation 124 may include lithography process and etch to form S/D contact hole(s) to a subset of S/D features. The operation 124 includes one or more etching processes that are tuned selective to the materials of the ILD layer 270 with no (or minimal) etching to the dielectric layers 234 and 232 and CESL 269, thereby forming contact holes. The S/D features 260 may be partially etched in some embodiments. The etching processes can be dry etching, wet etching, reactive ion etching, or other etching methods. Further, the operation 124 may further includes an additional etch, such as wet etch, to open the CESL 269 such that those S/D features 260 are exposed within the contact holes. In some embodiments, the CESL 269 and the S/D features 260 form the bottom surfaces of the contact holes. In some embodiments, the CESL 269, the ILD layer 270, and the S/D features 260 form the bottom surfaces of the contact holes.

The operation 124 includes forming silicide features 352 over the S/D features 260 and forming S/D contacts (or vias) features 354 over the silicide features 352, such as illustrated in FIG. 13E. Since the silicide features 352 and the S/D contacts 354 are formed at the frontside of the device 200, they are also referred to as frontside silicide features 352 and frontside S/D contacts 354, respectively.

The processes of forming the silicide features 352 in the operation 124 includes depositing one or more metals into the contact holes, performing an annealing process to the device 200 to cause reaction between the one or more metals and the S/D features 260 to produce the silicide features 352, and removing un-reacted portions of the one or more metals, leaving the silicide features 352 in the contact holes. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide features 352 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

The S/D contact features 354 may include a conductive barrier layer and a metal fill layer over the conductive barrier layer. The conductive barrier layer functions to prevent metal materials of the metal fill layer from diffusing into the dielectric layers adjacent the S/D contact features 354. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contact features 354. The operation 124 may perform a CMP process to remove excessive materials of the S/D contact features 354.

The method 100 (FIG. 1B) also includes an operation 126 to performs mid-end-of-line (MEOL) processes and back-end-of-line (BEOL) processes at the frontside of the device 200, thereby forming an interconnect structure 360 on the frontside of the device 200. The interconnect structure 360 has various conductive features, such as via features and metal lines in different metal layers configured to couple various transistors and other IC units into a functional circuit. For example, the operation 126 may form gate via features connecting to the gate stacks 240', form S/D contact vias connecting to the S/D contact features 354, and form one or more interconnect layers with wires and vias embedded in dielectric layers. The one or more interconnect layers connects gate, source, and drain electrodes of various transistors, as well as other circuits in the device 200, to form an integrated circuit in part or in whole.

Particularly, the operation 126 includes forming gate via features 362 landing on the gate electrodes of the gate stacks 240', as illustrated in FIG. 13B. The formation of the gate via features 362 may include depositing an ILD layer 364 (and etch stop layer underlying the ILD layer 364); patterning an ILD layer 364 to form openings of the ILD layer 364 by lithography process and etching; and filling the openings with one or more conductive materials. In some embodiments, the formation of the gate via features 362 may include a damascene process, such as a single damascene process or a dual damascene process.

In some embodiments, the operation 126 includes forming conductive features 366 (such as metal lines in the first metal layer) landing on the gate via features 362, as illustrated in FIG. 13B. The formation of the conductive features 366 may include depositing an ILD layer 368; patterning an ILD layer 368 to form openings of the ILD layer 368 by lithography process and etching; and filling the openings with one or more conductive materials. In some embodiments, the formation of the conductive features 366 may include a damascene process, such as a single damascene process or a dual damascene process.

The operation 126 may also form passivation layer(s) over the interconnect structure 360. In the example shown in FIG. 13B, a layer 370 is used to denote various additional dielectric and metal layers (such as second metal layer, third metal layer and etc.) in the interconnect structure 360; and a layer 372 is used denote various passivation layers formed at the frontside of the device 200.

At operation 128, the method 100 (FIG. 1B) flips the device 200 upside down and attaches the frontside of the device 200 to a carrier 374, such as shown in FIG. 13B. This makes the device 200 accessible from the backside of the device 200 for further processing. The operation 128 may use any suitable attaching processes, such as direct bonding, hybrid bonding, using adhesive, or other bonding methods. The operation 128 may further include alignment, annealing, and/or other processes. The carrier 374 may be a silicon wafer in some embodiment. In FIGS. 13B-13E (as well as in other figures to be described below), the "z" direction points from the backside of the device 200 to the frontside of the device 200, while the "−z" direction points from the frontside of the device 200 to the backside of the device 200.

At operation 130, the method 100 (FIG. 1C) thins down the device 200 from the backside of the device 200 until the semiconductor layer 207 is exposed from the backside of the device 200. The resultant structure is shown in FIGS. 14A-14E according to an embodiment. FIG. 14A illustrates a top view of the device 200, and FIGS. 14B, 14C, 14D, and 14E illustrate cross-sectional views of the device 200, in portion, along the B-B line, the C-C line, the D-D line, and the E-E line in FIG. 14A, respectively. The isolation features 230 and the semiconductor layer 239 may or may not be exposed by the operation 132 in various embodiments. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201 and may remove the embedded insulator 203.

At operation 132, the method 100 (FIG. 1C) selectively etches the semiconductor layer 207 to form trenches 376 over the backside of the gate stacks 240' and the drain features 260. The resultant structure is shown in FIGS. 15A-15E according to an embodiment. FIG. 15A illustrates a top view of the device 200, and FIGS. 15B, 15C, 15D, and 15E illustrate cross-sectional views of the device 200, in portion, along the B-B line, the C-C line, the D-D line, and the E-E line in FIG. 15A, respectively. In the present embodiment, the operation 132 applies an etching process that is tuned to be selective to the materials of the semiconductor layer 207 (such as SiGe in an embodiment) and with no (or minimal) etching to the semiconductor layer 239 (such as silicon in an embodiment), the drain features 260, the gate stacks 240' (particularly the gate dielectric layer 349 and the gate interfacial layer if present), and the isolation features 230. It is noted that composition difference between the semiconductor layer 239 and the semiconductor layer 207 provides etch selectivity for self-alignment and open the drain side but not the source side. The etching process can be dry etching, wet etching, reactive ion etching, or other etching methods. Particularly, in the present embodiment, the etching of the semiconductor layer 207 is self-aligned. In other words, the operation 132 does not need to make an etch mask (e.g., an etch mask formed by photolithography processes) in order to etch the semiconductor layer 207. Rather, it relies on the etch selectivity of the materials in the semiconductor layer 207 and its surrounding layers.

At operation 134, the method 100 (FIG. 1C) forms a dielectric layer 378 to fill the trenches 376. The resultant structure is shown in FIGS. 16A-16E according to an embodiment. Fig. 16A illustrates a top view of the device 200, and FIGS. 16B, 16C, 16D, and 16E illustrate cross-sectional views of the device 200, in portion, along the B-B line, the C-C line, the D-D line, and the E-E line in FIG. 16A, respectively. In an embodiment, the dielectric layer 378 includes silicon oxide. In some embodiments, the dielectric layer 378 includes other dielectric materials such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). The dielectric layer 378 may have a substantially uniform thickness along the various surfaces of the trenches 376, and may be formed by CVD, PVD, ALD, or other suitable methods. In some embodiments, the dielectric layer 378 may include tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer 378 may be formed by PECVD (plasma enhanced CVD), FCVD (flowable CVD), or other suitable methods. The operation 134 may further perform a CMP process to planarize the backside of the device 200 and to expose the semiconductor layer 239 for further processing.

At operation 136, the method 100 (FIG. 1C) removes the semiconductor layer 239 from the backside of the device 200, thereby forming trenches 380 for backside vias. The resultant structure is shown in FIGS. 17A-17E according to an embodiment. FIG. 17A illustrates a top view of the device 200, and FIGS. 17B, 17C, 17D, and 17E illustrate cross-sectional views of the device 200, in portion, along the B-B line, the C-C line, the D-D line, and the E-E line in FIG. 17A, respectively. In the present embodiment, the operation 136 applies an etching process that is tuned to be selective to the materials of the semiconductor layer 239 (such as undoped silicon in an embodiment) and with no (or minimal) etching to the dielectric layer 378, the isolation features 230, and the inner spacers 255. The etching process may partially etch the source feature 260. The etching process results in a trench 380 that exposes the source feature 260 from the backside of the device 200. The etching process can be dry etching, wet etching, reactive ion etching, or other etching methods. Particularly, in the present embodiment, the etching of the semiconductor layer 239 is self-aligned. In other words, the operation 136 does not need to make an etch mask (e.g., an etch mask formed by photolithography processes) in order to etch the semiconductor layer 239. Rather, it relies on the etch selectivity of the materials in the semiconductor layer 239 and its surrounding layers. This beneficially forms the trenches 380 to be aligned with the underlying source feature 260 without misalignments such as those introduced by photolithography overlay shift. Using this process will result in a backside source contact (or source via) feature that is ideally aligned with the source feature 260, as will be discussed below.

At operation 138, the method 100 (FIG. 1C) forms a backside source silicide feature 382 and a backside source contact features 284. The resultant structure is shown in FIGS. 18A-18E according to an embodiment. FIG. 18A illustrates a top view of the device 200, and FIGS. 18B, 18C, 18D, and 18E illustrate cross-sectional views of the device 200, in portion, along the B-B line, the C-C line, the D-D line, and the E-E line in FIG. 18A, respectively. As illustrated in FIG. 18D, the silicide feature 382 is formed on the surface of the source feature 260. The backside source contact feature 384 is formed on the backside source silicide feature 382 with reduced contact resistance. Further, the backside source contact feature 384 may include a barrier layer 386 disposed on the sidewalls of the trenches 380. In some embodiments, the barrier layer 386 is a dielectric material, such as silicon nitride, silicon oxide, other suitable dielectric material, or a combination thereof. The backside source contact feature 384 is self-aligned to the source feature 260 as a result of the self-aligned etching processes discussed above with reference to FIG. 17D. Therefore, it is isolated from the nearby gate stacks 240' by the inner spacers 255 and the barrier layer 386 as shown in FIG. 18B. The self-aligned backside contact feature 384 minimizes the risks of short circuit between the source feature 260 and the nearby gate stacks 240'.

In some embodiments, the process of forming the backside source silicide feature 382 is similar to that for the frontside source silicide feature 352, and the process of forming the backside source contact feature 384 is similar to that for the frontside source contact 354. In an embodiment, the operation 138 includes depositing one or more metals into the trench 380, performing an annealing process to the device 200 to cause reaction between the one or more metals and the source feature 260 to produce the silicide feature 382, and removing un-reacted portions of the one or more metals, leaving the silicide features 382 on the surface of the source feature 260 in the trench 380. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 382 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In the depicted embodiment, the source contact feature 384 may include the barrier layer 386 and a metal fill layer 388 over the barrier layer 386. The barrier layer 386 functions to prevent metal materials of the metal fill layer from diffusing into the dielectric layers adjacent the source contact feature 384, such as the layers 230, and 378. The barrier layer 386 may be formed by deposition (such as CVD, or ALD) and anisotropic etch to expose the silicide feature 382. Alternatively, the barrier layer 386 may be formed by other suitable method, such as selective deposition so that the barrier layer 386 is selectively deposited on the sidewalls but not the bottom surface of the trench 380. In some embodiments, the barrier layer 386 may alternatively include conductive material, such as titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer 388 may include tungsten (W), cobalt (Co), molybdenum (Mo), ruthenium (Ru), copper (Cu), aluminum (Al), titanium (Ti), tantalum (Ta), or other metals, and may be formed by CVD, PVD, ALD, plating, or other suitable processes. The operation 138 may perform a CMP process to remove excessive materials of the source contact feature 384. As shown in FIGS. 18C and 18E, the gate stacks 240' and the drain features 260 are protected from the various deposition and etching processes in the operation 138.

Especially, the remaining semiconductor layer 208 (the undoped silicon layer in the present embodiment) on the drain feature 260 (FIG. 18E) has a first thickness $T_1$ and the remaining semiconductor layer 208 (the undoped silicon layer in the present embodiment) on the gate stack 240' (FIG. 18C) has a second thickness $T_2$ greater than the first thickness $T_1$. In some embodiments, the first thickness $T_1$ is greater than about 5 nm and the second thickness $T_2$ is greater than about 10 nm. In some embodiments, the first thickness $T_1$ ranges between 5 nm and 8 nm and the second thickness $T_2$ ranges between 10 nm and 15 nm. In some embodiments, the backside source contact feature 384 has a thickness greater than 20 nm. In some embodiments, the backside source contact feature 384 has a thickness ranging between 20 nm and 30 nm.

Figure 19B:
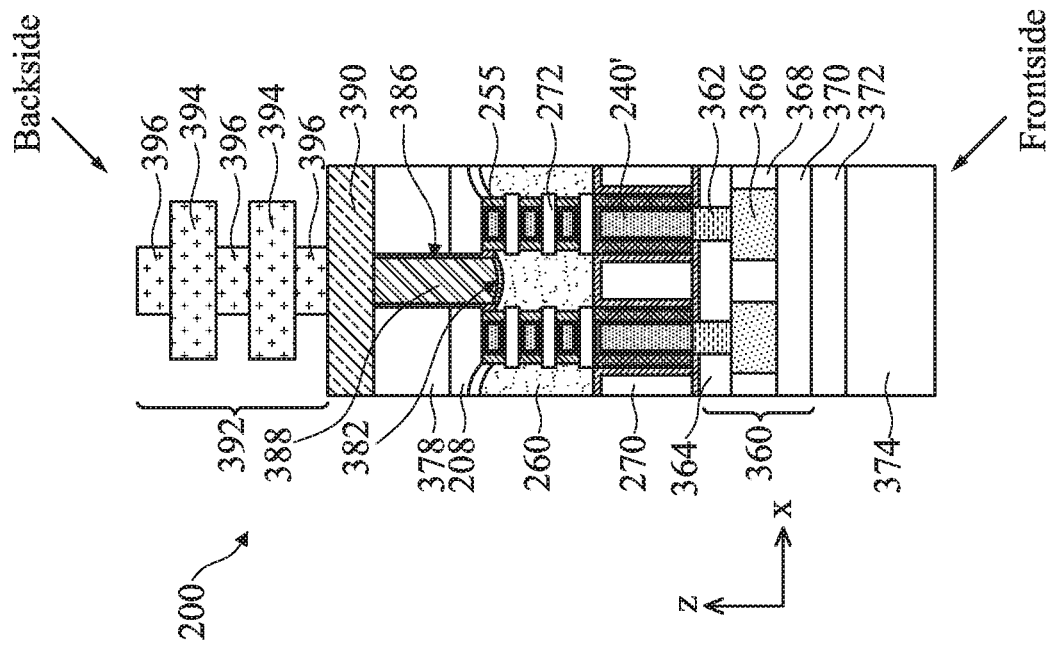
Figure 19A:
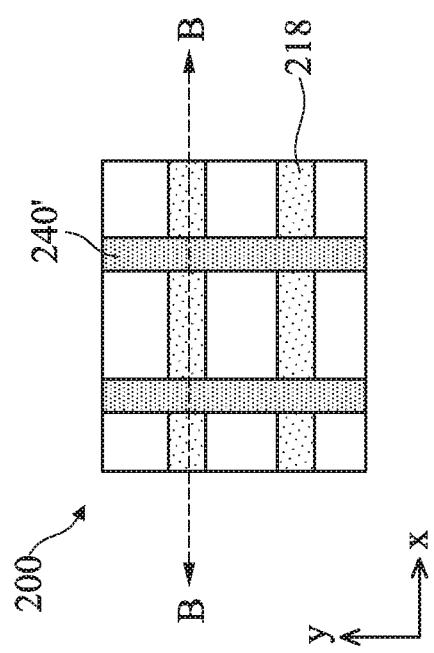
Figure 20A:
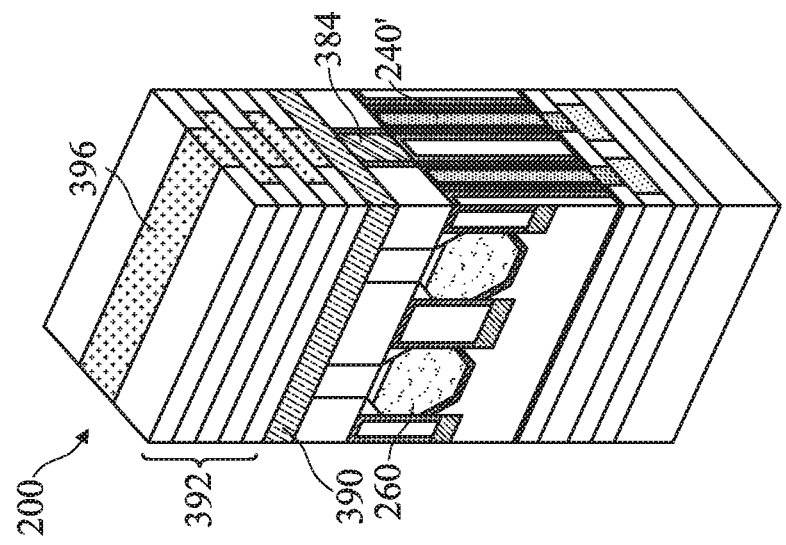
FIGS. 20A, 20B and 20C illustrate perspective views of a portion of a semiconductor device, according to some embodiments.
Figure 20B:
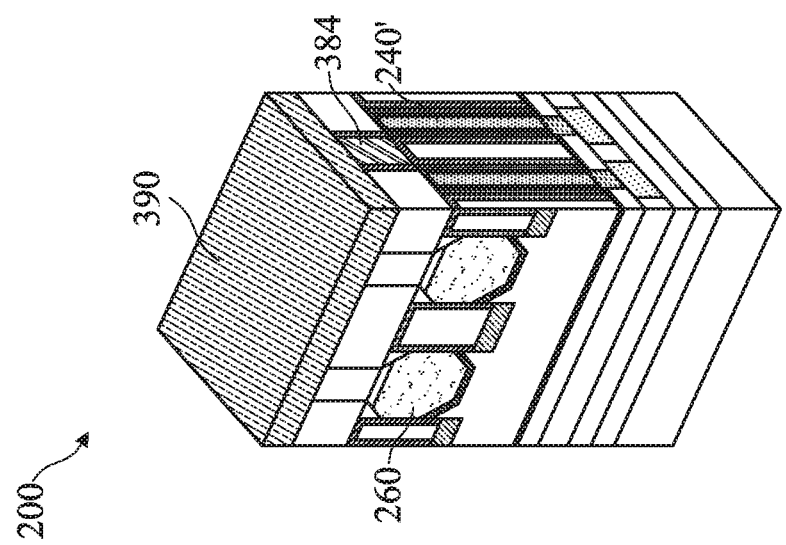
Figure 20C:
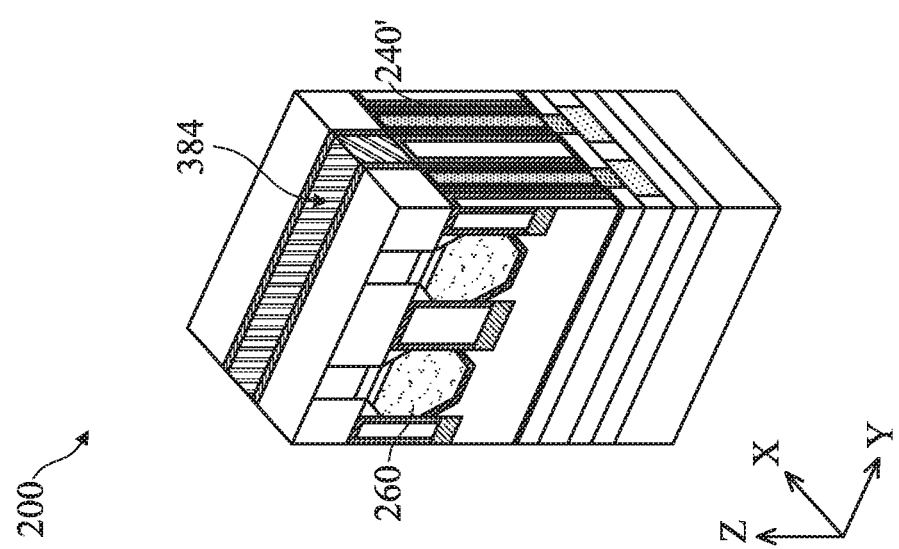

At operation 140, the method 100 (FIG. 1C) forms backside power rails 390 and a backside interconnect structure 392. The resultant structure is shown in FIGS. 19A-19B and FIGS. 20A–20C according to an embodiment. FIG. 19A illustrates a top view of the device 200, and FIG. 19B illustrates a cross-sectional view of the device 200, in portion, along the B-B line in FIG. 19A. FIGS. 20A–20C illustrate perspective views of the device 200 at various fabrication stages. As illustrated in FIG. 19B and FIG. 20B, the backside source contact feature 384 is electrically connected to the backside power rails 390. In an embodiment, the backside power rails 390 may be formed using a damascene process, a dual-damascene process, a metal patterning process, or other suitable processes. The backside power rails 390 may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes. Although not shown in FIG. 19B, the backside power rails 390 are embedded in one or more dielectric layers, and the backside interconnect structure 392 includes metal lines 394 and via features 396 embedded in one or more dielectric layers. The metal lines 394 are distributed in one or more metal layers and the via features 396 are configured between adjacent metal layers to provide vertical connection between corresponding metal lines in the adjacent metal layers. In some embodiment, the backside power rails 390 are considered part of the backside interconnect structure 392. Having backside power rails 390 beneficially increases the number of metal tracks available in the device 200 for directly connecting to source/drain contact features and via features. It also increases the gate density for greater device integration than other structures without the backside power rails 390. The backside power rails 390 may have wider dimension than the metal lines of the first metal layer (M1) on the frontside of the device 200, which beneficially reduces the backside power rail resistance.

At operation 142, the method 100 (FIG. 1C) performs further fabrication processes to the device 200. For example, it may form passivation layers on the backside of the device 200, remove the carrier 374, form through-silicon via (TSV) features to connect the frontside interconnect structure to the backside of the device 200, and perform other BEOL processes.

In the above embodiments, the device 200 includes a thick semiconductor layer 207 configured between the insulator 203 and the Si/SiGe stack 205. The semiconductor layer 207 is different from other semiconductor layers, such as 204 to provide etch selectivity. In some examples, the semiconductor layer 207 includes silicon germanium and the semiconductor layer 204 includes silicon. The semiconductor layer 207 has a thickness greater than any one of silicon layers and silicon germanium layers of the Si/SiGe stack 205. The semiconductor layer is substantially extending from the top surface to the bottom surface of the isolation feature 230, as illustrated in FIG. 5B. Further, the semiconductor layer 239, such as un-doped silicon, is formed underlying the source feature 260 and is substantially extended to the source feature 260. Thus, the selective etch to the semiconductor layer 207 and the selective etch the semiconductor layer 239 form a trench 380 self-aligned to the source feature 260 and the corresponding backside source contact feature 384 is self-aligned to the source feature 260.

In some embodiments, the source feature 260 is connected to the backside power rail 390 through the backside contact feature 384 while the drain feature 260 is connected to a frontside power rail through the frontside contact feature 354. In an alternative embodiment, the drain feature 260 is connected to the backside power rail 390 through the backside contact feature 384 while the source feature 260 is connected to a frontside power rail through the frontside contact feature 354. This may be achieved by switching the processes that are specifically applied to the source region with those that are specifically applied to the drain region in the above embodiment. For example, the semiconductor layer 239 may be provided in the drain region, but not in the source region.

Although not intended to be limiting, embodiments of the present disclosure provide one or more of the following advantages. For example, embodiments of the present disclosure form silicide features that fully wrap around a source feature, which advantageously reduces source resistance. Also, embodiments of the present disclosure form backside source contact using a self-aligned process, which minimize the risks of the shorting the source feature to nearby conductors including the gate stacks. Embodiments of the present disclosure can be readily integrated into existing semiconductor manufacturing processes.

The disclosed device and the method making the same have other embodiments. The device and the method are similar except for some variations and changes. The similar features and processes are eliminated in the following descriptions for simplicity. Only those different features and processes are described below.

A device 400 and the method 100 making the same are collectively described below according to some embodiments.

At operation 114, the method 100 (FIG. 1A) forms a semiconductor layer 402 in the source trenches 250. The resultant structure is shown in FIGS. 21A-21E according to an embodiment. FIG. 21A illustrates a top view of the device 400, and FIGS. 21B, 21C, 21D, and 21E illustrate cross-sectional views of the device 400, in portion, along the B-B line, the C-C line, the D-D line, and the E-E line in FIG. 21A, respectively.

The semiconductor layer 402 may be deposited using an epitaxial growth process or by other suitable processes. In some embodiments, epitaxial growth of semiconductor layers 402 is achieved by a molecular beam epitaxy (MBE) process, a chemical vapor deposition (CVD) process, a metalorganic chemical vapor deposition (MOCVD) process, other suitable epitaxial growth process, or combinations thereof. The semiconductor layer 402 includes a semiconductor material that is different than the semiconductor material included in the semiconductor layer 207 to achieve etching selectivity during subsequent processing. For example, semiconductor layers 402 and 207 (or additionally semiconductor layer 204) may include different materials, different constituent atomic percentages, different constituent weight percentages, and/or other characteristics to achieve desired etching selectivity during an etching process. In an embodiment, the semiconductor layer 207 includes silicon germanium and the semiconductor layer 402 includes silicon, such as silicon doped boron for both nFETs and pFETs, to enhance the etch selectivity during a wet etch to remove SiGe. In the depicted embodiment, the boron doping concentration ranges between $10^{20}/cm^3$ and $3*10^{21}/cm^3$. The doped silicon may be formed by epitaxial growth with in-situ doping. The dopant boron is introduced into the semiconductor layer 402 during the epitaxial grown and the precursor of the epitaxial growth includes both silicon-containing chemical and boron-containing chemical. The operation 114 may include an etching process that recesses the semiconductor layer 402 to the level shown in FIGS. 21B and 21D if the semiconductor layer 402 is initially grown taller than that. After the semiconductor layer 402 is deposited, the operation 114 removes the patterned hard mask layer 236 by one or more etching processes. As will be discussed below, the extra etching in the operation 112 and the growing of the semiconductor layer 402 in the operation 114 can be performed in source regions only, drain regions only, or both source and drain regions in various embodiments.

At operation 132, the method 100 (FIG. 1C) selectively etches the semiconductor layer 207 to form trenches 404 over the backside of the gate stacks 240' and the drain features 260. The resultant structure is shown in FIGS. 22A-22E according to an embodiment. FIG. 22A illustrates a top view of the device 400, and FIGS. 22B, 22C, 22D, and 22E illustrate cross-sectional views of the device 400, in portion, along the B-B line, the C-C line, the D-D line, and the E-E line in FIG. 22A, respectively. In the present embodiment, the operation 132 applies an etching process that is tuned to be selective to the materials of the semiconductor layer 207 (such as SiGe in an embodiment) and with no (or minimal) etching to the semiconductor layer 402 (such as silicon in an embodiment), the drain features 260, the gate stacks 240' (particularly the gate dielectric layer 349 and the gate interfacial layer if present), and the isolation features 230. It is noted that composition difference between the semiconductor layer 402 and the semiconductor layer 207 provides etch selectivity for self-alignment and open the drain side but not the source side. The etching process can be dry etching, wet etching, reactive ion etching, or other etching methods. Particularly, in the present embodiment, the etching of the semiconductor layer 207 is self-aligned. In other words, the operation 132 does not need to make an etch mask (e.g., an etch mask formed by photolithography processes) in order to etch the semiconductor layer 207. Rather, it relies on the etch selectivity of the materials in the semiconductor layer 207 and its surrounding layers. Furthermore, the etching process includes one or more etching steps with corresponding etchants to continue etch the semiconductor layer 208 such that the gate stack 240' is exposed within the corresponding trench 404 and the drain feature 260 is exposed within the corresponding trench 404. Especially, the semiconductor layer 260' (silicon doped with boron in the present embodiment) of the drain feature 260 is exposed.

At operation 134, the method 100 (FIG. 1C) forms a dielectric layer 406 to fill the trenches 404. With various features, including the frontside drain contact feature 354 and the backside source contact feature 384, being formed on the device 400 by the operations 136-140, the resultant structure is shown in FIGS. 23A-23E according to an embodiment. FIG. 23A illustrates a top view of the device 400, and FIGS. 23B, 23C, 23D, and 23E illustrate cross-sectional views of the device 400, in portion, along the B-B line, the C-C line, the D-D line, and the E-E line in FIG. 23A, respectively. The dielectric layer 406 directly contact the bottom surfaces of the gate stack 240' and the drain feature 260. More particularly, the dielectric layer 406 directly contact the semiconductor layer 260' of the drain feature 260. As illustrated in FIG. 23E, the semiconductor layer 260 underlying the dielectric layer 406 has a thickness less than 3 nm, such as ranging between 1 nm and 2 nm. In an embodiment, the dielectric layer 406 includes silicon oxide. In some embodiments, the dielectric layer 406 includes other dielectric materials such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). The dielectric layer 406 may have a substantially uniform thickness along the various surfaces of the trenches 404, and may be formed by CVD, PVD, ALD, or other suitable methods. In some embodiments, the dielectric layer 406 may include tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The operation 134 may further perform a CMP process to planarize the backside of the device 400 and to expose the semiconductor layer 402 for further processing. It is noted that the semiconductor layer 208 is not present in the device 400 in FIG. 23B since it is being removed and the dielectric layer 406 directly contacts the gate stack 240'.

Figure 25C:
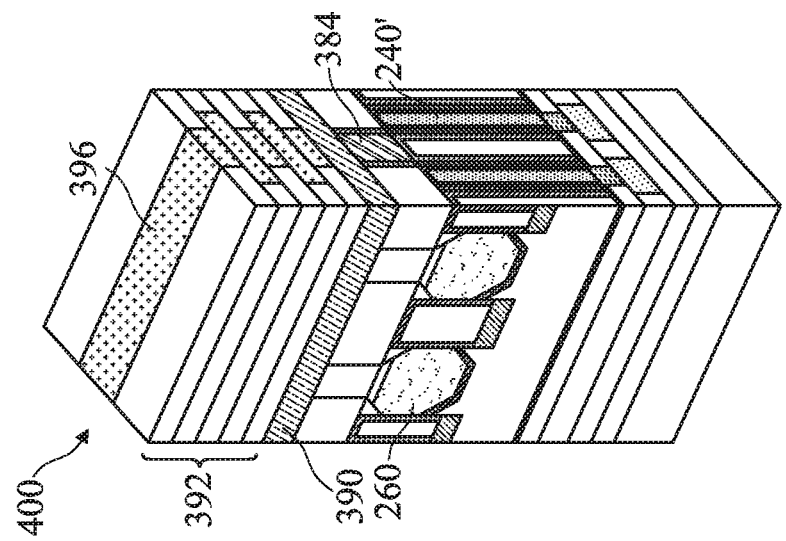
FIGS. 25A, 25B and 25C illustrate perspective views of a portion of a semiconductor device, according to some embodiments.
Figure 25B:
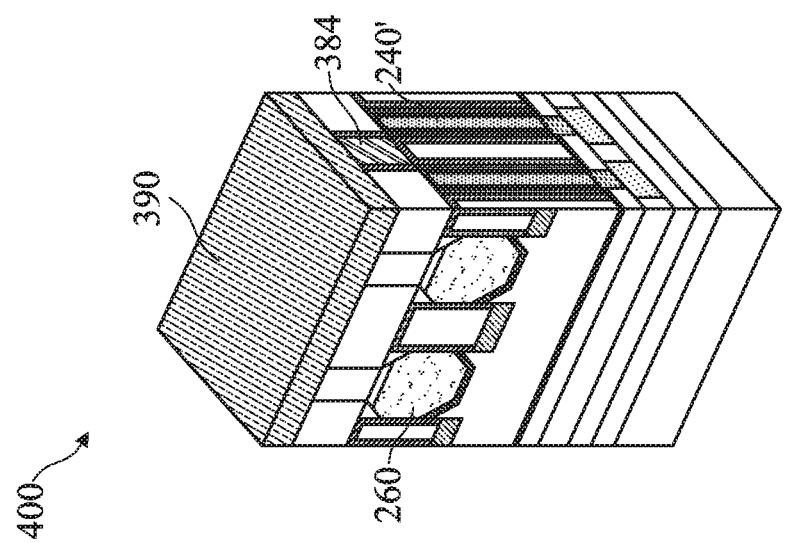
Figure 25A:
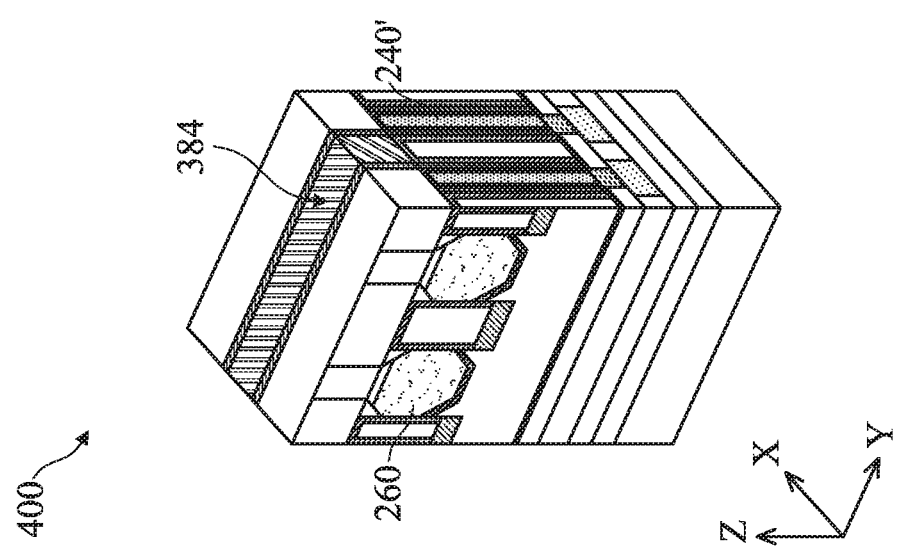

The structure of the device 400 is shown in FIGS. 24A-24B and FIGS. 25A-25C according to an embodiment. FIG. 24A illustrates a top view of the device 400, and FIG. 24B illustrates a cross-sectional view of the device 400, in portion, along the B-B line in FIG. 24A. FIGS. 25A-25C illustrate perspective views of the device 400 at various fabrication stages. As illustrated in FIG. 24B and FIG. 25B, the backside source contact feature 384 is electrically connected to the backside power rails 390. As shown in FIG. 24B, the backside interconnect structure 392 includes metal lines 394 and via features 396 embedded in one or more dielectric layers. The metal lines 394 are distributed in one or more metal layers and the via features 396 are configured between adjacent metal layers to provide vertical connection between corresponding metal lines in the adjacent metal layers. Having backside power rails 390 beneficially increases the number of metal tracks available in the device 400 for directly connecting to source/drain contact features and via features. It also increases the gate density for greater device integration than other structures without the backside power rails 390. The backside power rails 390 may have wider dimension than the metal lines of the first metal layer (M1) on the frontside of the device 400, which beneficially reduces the backside power rail resistance.

In the above embodiments, the device 400 includes a thick semiconductor layer 207 configured between the insulator 203 and the Si/SiGe stack 205. The semiconductor layer 207 is different from other semiconductor layers, such as 204 to provide etch selectivity. In some examples, the semiconductor layer 207 includes silicon germanium and the semiconductor layer 204 includes silicon. The semiconductor layer 207 has a thickness greater than any one of silicon layers and silicon germanium layers of the Si/SiGe stack 205. The semiconductor layer is substantially extending from the top surface to the bottom surface of the isolation feature 230. Further, the semiconductor layer 402, such as silicon doped with boron, is formed underlying the source feature 260 and is substantially extended to the source feature 260. Thus, the selective etch to the semiconductor layer 207 and the selective etch the semiconductor layer 239 form a trench 380 self-aligned to the source feature 260 and the corresponding backside source contact feature 384 is self-aligned to the source feature 260.

A device 500 and the method 100 making the same are collectively described below according to some embodiments.

Figures 26, 27:
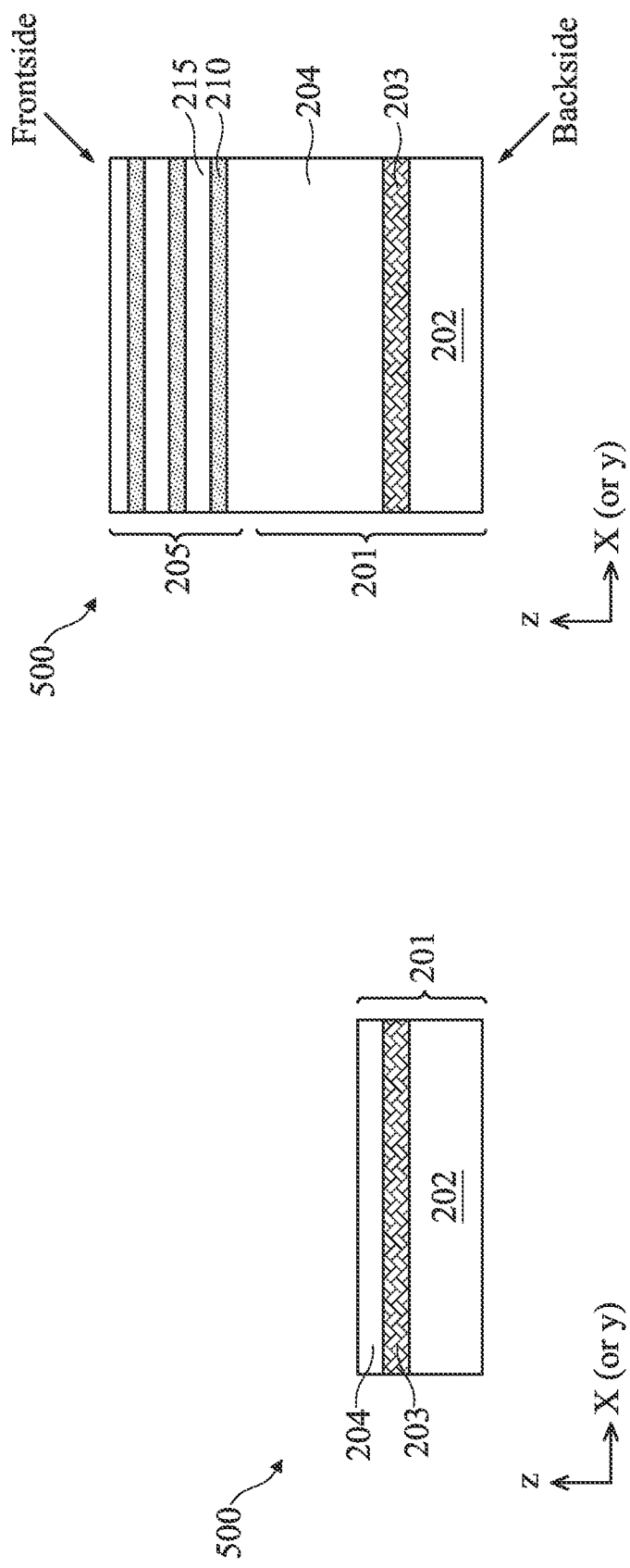
FIGS. 26 and 27 illustrate cross-sectional views of a portion of a semiconductor device, according to some embodiments, in intermediate steps of fabrication according to an embodiment of the method of FIGS. 1A-1C.
Figure 28B:
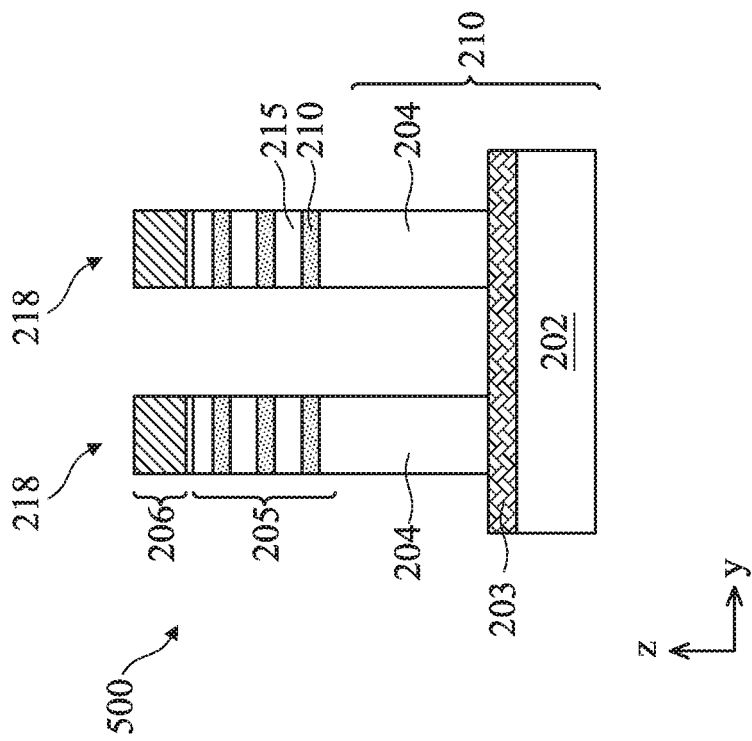
Figure 28A:
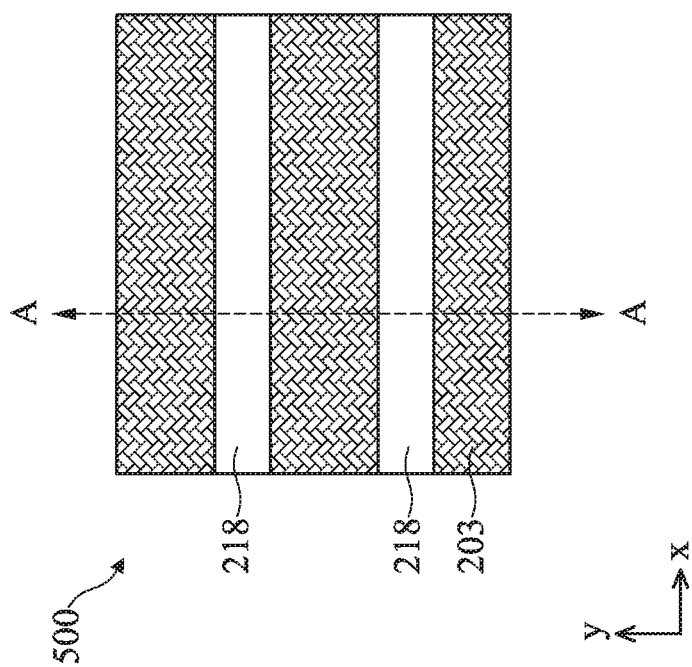
Figures 37A, 37B, 37C, 37D, 37E:
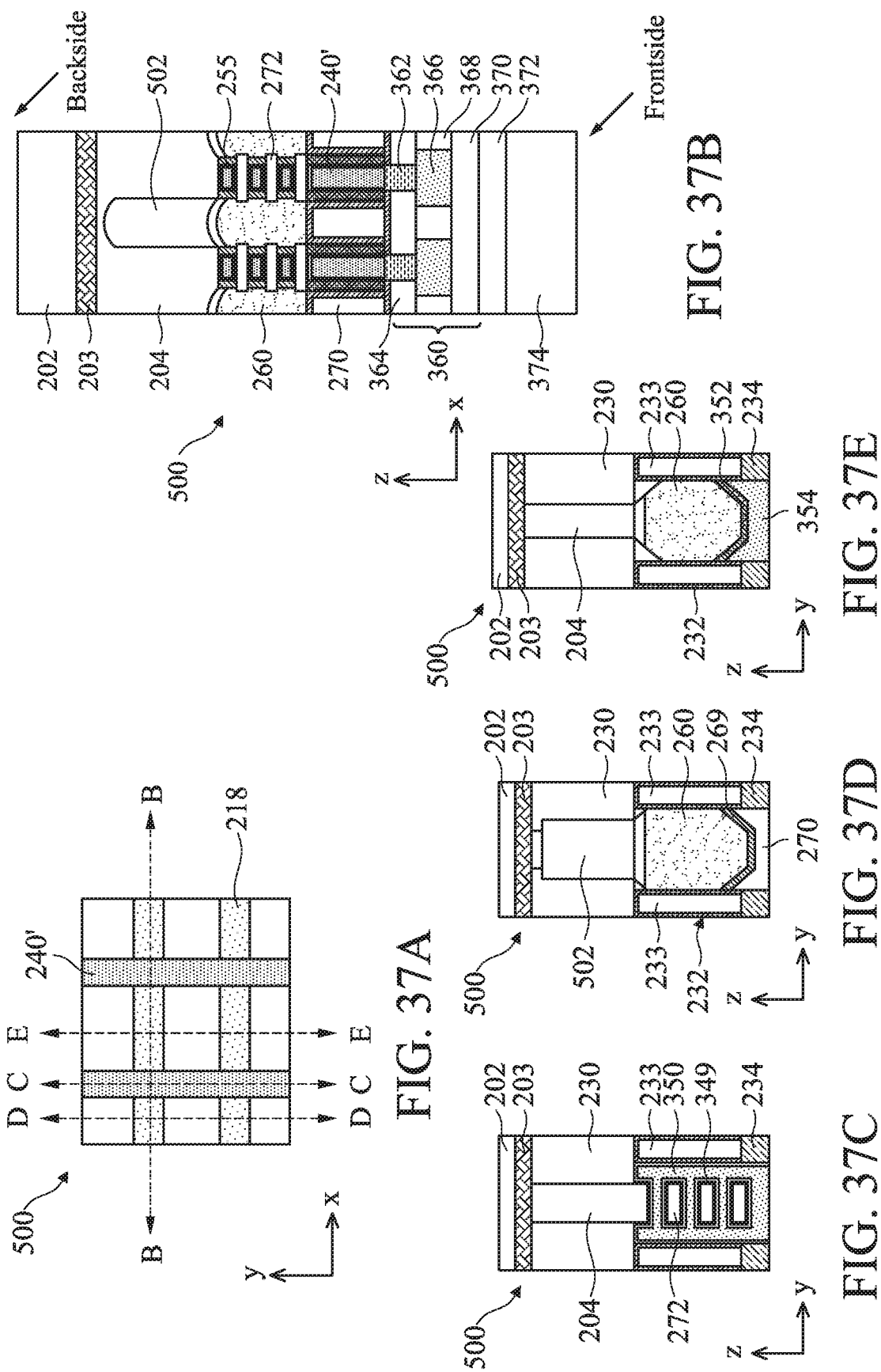
Figures 42A, 42B, 42C, 42D, 42E:
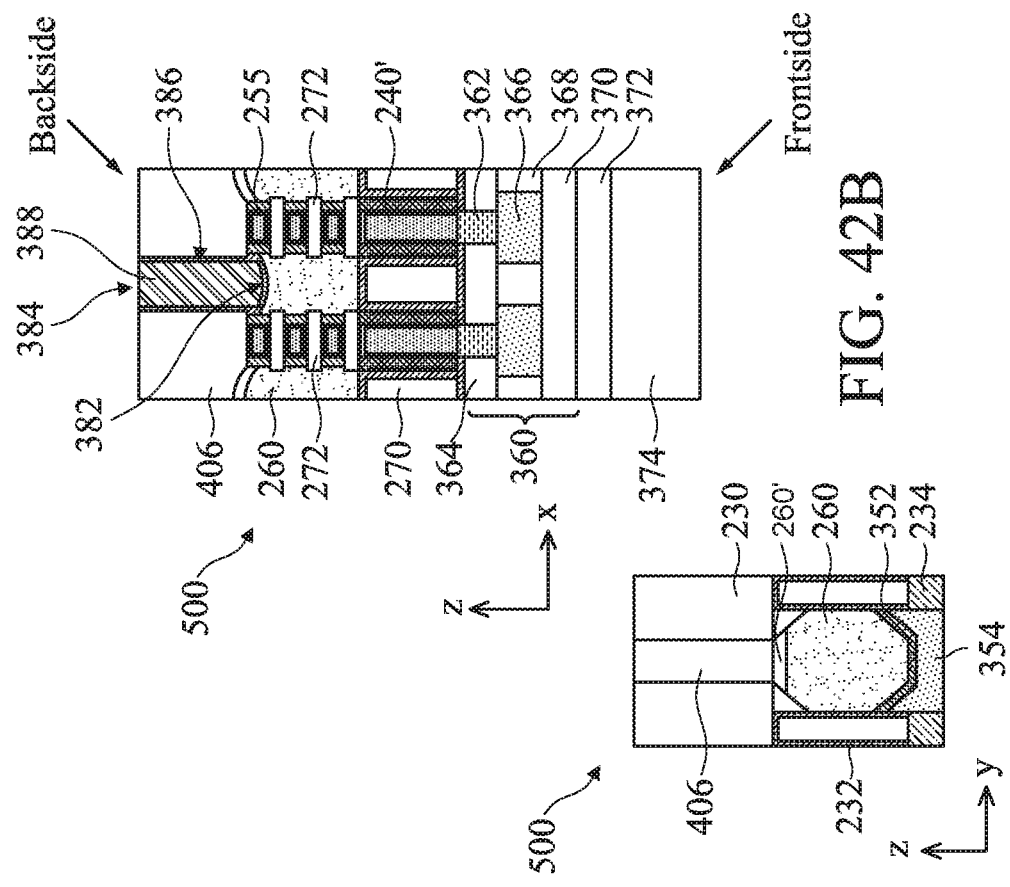

As illustrated in FIG. 26, in the device 500, the semiconductor layer 207 is eliminated. In the depicted embodiment, the substrate 201 includes a carrier 202, the insulator 203 and the semiconductor layer 204.

At operation 114, the method 100 (FIG. 1A) forms a semiconductor layer 502 in the source trenches 250. The resultant structure is shown in FIGS. 33A-33E according to an embodiment. FIG. 33A illustrates a top view of the device 500, and FIGS. 33B, 33C, 33D, and 33E illustrate cross-sectional views of the device 500, in portion, along the B-B line, the C-C line, the D-D line, and the E-E line in FIG. 33A, respectively.

The semiconductor layer 502 may be deposited using an epitaxial growth process or by other suitable processes. In some embodiments, epitaxial growth of semiconductor layers 502 is achieved by a molecular beam epitaxy (MBE) process, a chemical vapor deposition (CVD) process, a metalorganic chemical vapor deposition (MOCVD) process, other suitable epitaxial growth process, or combinations thereof. The semiconductor layer 502 includes a semiconductor material that is different than the semiconductor material included in the semiconductor layer 207 to achieve etching selectivity during subsequent processing. For example, semiconductor layers 502 and 207 (or additionally semiconductor layer 204) may include different materials, different constituent atomic percentages, different constituent weight percentages, and/or other characteristics to achieve desired etching selectivity during an etching process. In an embodiment, the semiconductor layer 207 includes doped silicon germanium and the semiconductor layer 502 includes undoped silicon germanium for both nFETs and pFETs. The semiconductor layer 502 includes SiGe to enhance etch selectivity during the etching process to etch silicon. In some embodiments, the germanium concentration of the semiconductor layer 502 ranges between 15% and 30% (atomic percentage). The undoped silicon germanium is implemented in the semiconductor layer 502 so it can be applied to both nFET regions and pFET regions. The undoped silicon germanium may be formed by epitaxial growth with in-situ doping. The precursor of the epitaxial growth includes both silicon-containing chemical and germanium-containing chemical. The germanium concentration of the semiconductor layer 502 may be controlled by the partial pressure or flow rate of the germanium-containing gas during the epitaxial grown. The operation 114 may include an etching process that recesses the semiconductor layer 502 to the level shown in FIGS. 26B and 26D if the semiconductor layer 502 is initially grown taller than that. After the semiconductor layer 502 is deposited, the operation 114 removes the patterned hard mask layer 236 by one or more etching processes. The extra etching in the operation 112 and the growing of the semiconductor layer 502 in the operation 114 can be performed in source regions only, drain regions only, or both source and drain regions in various embodiments.

At operation 132, the method 100 (FIG. 1C) selectively etches the semiconductor layer 204 to form trenches 404 over the backside of the gate stacks 240' and the drain features 260. The resultant structure is shown in FIGS. 39A-39E according to an embodiment. FIG. 39A illustrates a top view of the device 500, and FIGS. 39B, 39C, 39D, and 39E illustrate cross-sectional views of the device 500, in portion, along the B-B line, the C-C line, the D-D line, and the E-E line in FIG. 39A, respectively. In the present embodiment, the operation 132 applies an etching process that is tuned to be selective to the materials of the semiconductor layer 204 (such as silicon in an embodiment) and with no (or minimal) etching to the semiconductor layer 502 (such as undoped SiGe in an embodiment), the drain features 260, the gate stacks 240' (particularly the gate dielectric layer 349 and the gate interfacial layer if present), and the isolation features 230. It is noted that composition difference between the semiconductor layer 502 and the semiconductor layer 204 provides etch selectivity for self-alignment and open the drain side but not the source side. The etching process can be dry etching, wet etching, reactive ion etching, or other etching methods. Particularly, in the present embodiment, the etching of the semiconductor layer 204 is self-aligned. In other words, the operation 132 does not need to make an etch mask (e.g., an etch mask formed by photolithography processes) in order to etch the semiconductor layer 204. Rather, it relies on the etch selectivity of the materials in the semiconductor layer 204 and its surrounding layers. Furthermore, the etching process includes one or more etching steps with corresponding etchants to continue etch the semiconductor layer 208 such that the gate stack 240' is exposed within the corresponding trench 404 and the drain feature 260 is exposed within the corresponding trench 404. Especially, the semiconductor layer 260' (silicon doped with boron in the present embodiment) of the drain feature 260 is exposed.

At operation 134, the method 100 (FIG. 1C) forms a dielectric layer 406 to fill the trenches 402. With various features, including the frontside drain contact feature 354 and the backside source contact feature 384, being formed on the device 500 by the operations 136-140, the resultant structure is shown in FIGS. 40A-40E according to an embodiment. FIG. 40A illustrates a top view of the device 500, and FIGS. 40B, 40C, 40D, and 40E illustrate cross-sectional views of the device 500, in portion, along the B-B line, the C-C line, the D-D line, and the E-E line in FIG. 40A, respectively. The dielectric layer 406 directly contact the bottom surfaces of the gate stack 240' and the drain feature 260. More particularly, the dielectric layer 406 directly contact the semiconductor layer 208 of the drain feature 260. As illustrated in FIG. 40E, the semiconductor layer 208 underlying the dielectric layer 406 has a thickness less than 3 nm, such as ranging between 1 nm and 2 nm. In an embodiment, the dielectric layer 406 includes silicon oxide. In some embodiments, the dielectric layer 406 includes other dielectric materials such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). The dielectric layer 406 may have a substantially uniform thickness along the various surfaces of the trenches 404, and may be formed by CVD, PVD, ALD, or other suitable methods. In some embodiments, the dielectric layer 406 may include tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The operation 134 may further perform a CMP process to planarize the backside of the device 500 and to expose the semiconductor layer 502 for further processing. It is noted that the semiconductor layer 204 is not present in the device 500 in FIG. 40B since it is being removed and the dielectric layer 406 directly contacts the gate stack 240'.

Figure 43B:
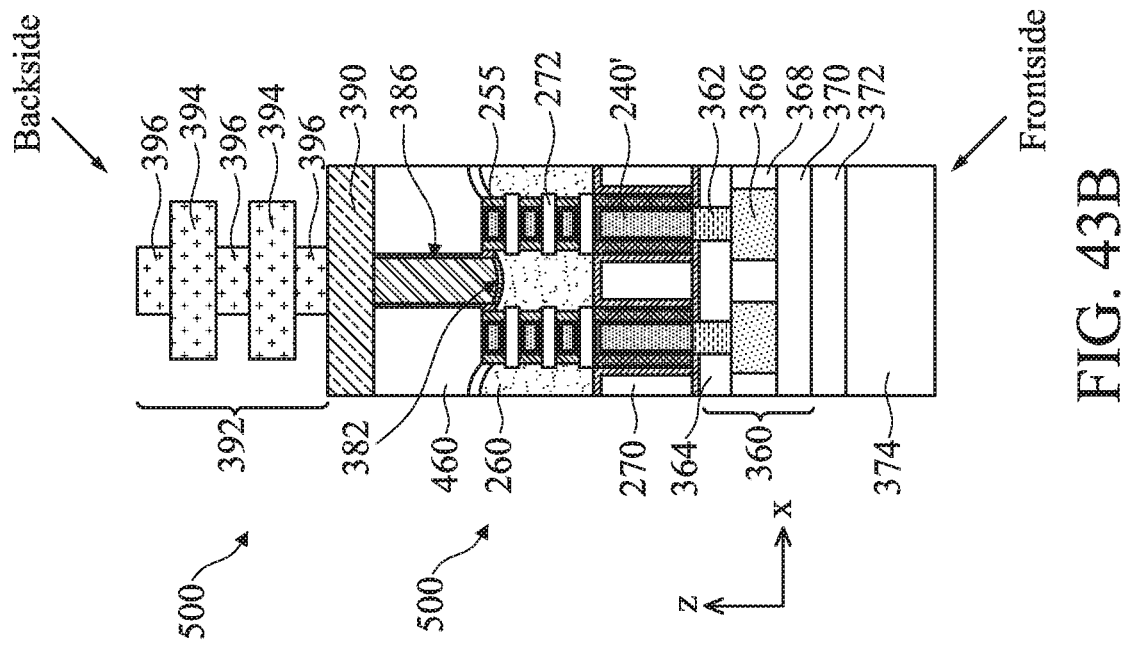
Figure 43A:
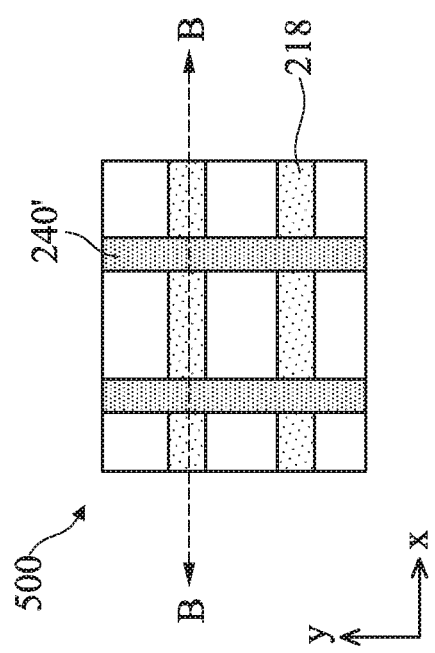
Figure 44C:
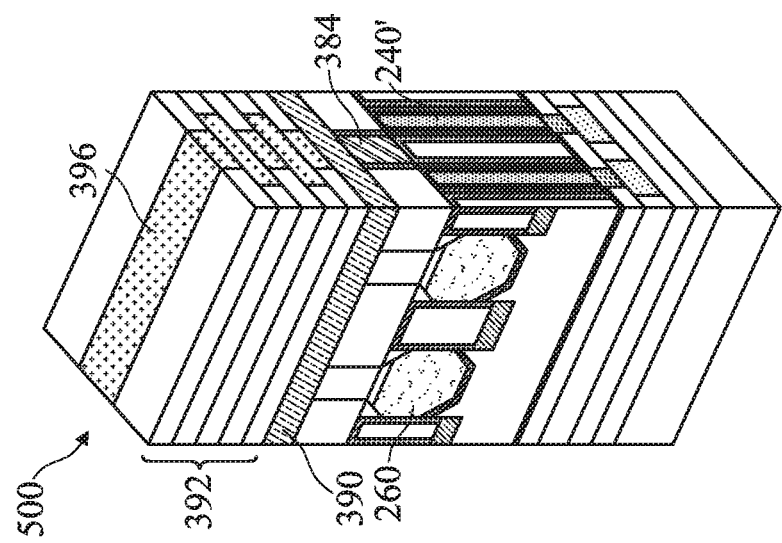
FIGS. 44A, 44B and 44C illustrate perspective views of a portion of a semiconductor device, according to some embodiments.
Figure 44B:
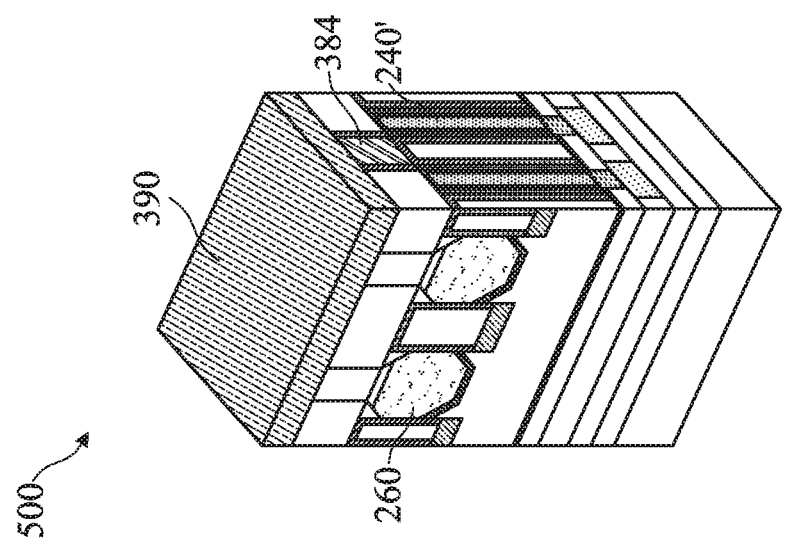
Figure 44A:
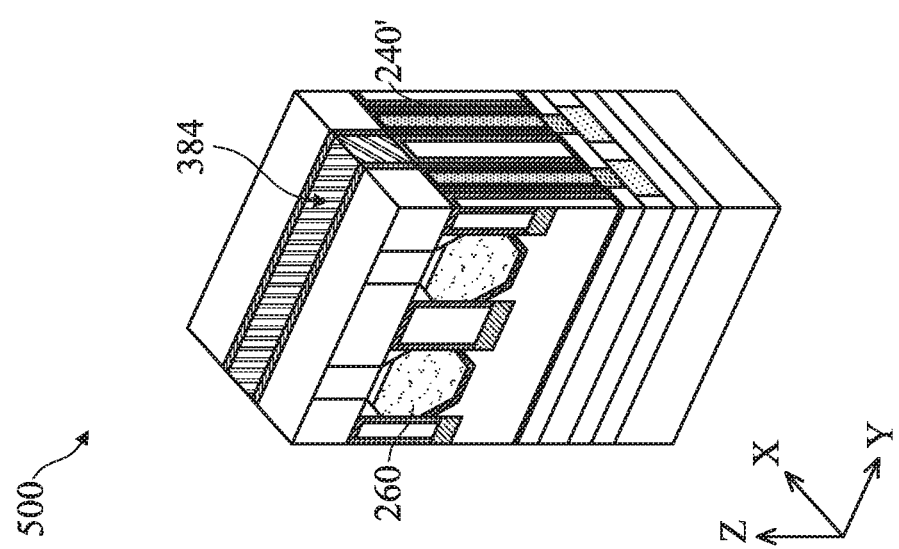

The structure of the device 500 is shown in FIGS. 43A-43B and FIGS. 44A-44C according to an embodiment. FIG. 43A illustrates a top view of the device 500, and FIG. 43B illustrates a cross-sectional view of the device 500, in portion, along the B-B line in FIG. 43A. FIGS. 44A-44C illustrate perspective views of the device 500 at various fabrication stages. As illustrated in FIG. 43B and FIG. 44B, the backside source contact feature 384 is electrically connected to the backside power rails 390. As shown in FIG. 43B, the backside interconnect structure 392 includes metal lines 394 and via features 396 embedded in one or more dielectric layers. The metal lines 394 are distributed in one or more metal layers and the via features 396 are configured between adjacent metal layers to provide vertical connection between corresponding metal lines in the adjacent metal layers. Having backside power rails 390 beneficially increases the number of metal tracks available in the device 500 for directly connecting to source/drain contact features and via features. It also increases the gate density for greater device integration than other structures without the backside power rails 390. The backside power rails 390 may have wider dimension than the metal lines of the first metal layer (M1) on the frontside of the device 500, which beneficially reduces the backside power rail resistance.

In the above embodiments, the device 500 eliminates the semiconductor layer 207 of SiGe. The self-aligned source contact feature 384 is still formed through a procedure that includes forming a deep trench in the source side by lithography patterning and etch, filling the deep trench with a semiconductor material with etch selectivity, and subsequent selective etchings The device 200 (or 400 or 500) and the method 100 making the same may have other alternative, extension or modification. For examples, the source feature 260 may be alternatively connected to the front metal line through front contact feature while the drain feature 260 is connected to the backside metal line 390 through the backside contact feature 384.

The present disclosure provides a device structure having the backside contact feature 384 self-aligned to the source feature 260. The self-aligned source contact feature 384 is formed through a procedure that includes forming a deep trench in the source side by lithography patterning and etch, filling the deep trench with a semiconductor material with etch selectivity, and subsequent selective etchings The disclosed structure reduces routing resistance, enlarges alignment margins, increases layout flexibility, and enhances packing density. The disclosed structure provides more flexibility to circuit design layout and greater process window of integrated circuit (IC) fabrication, making the disclosed structure suitable for advanced technology nodes. The disclosed structure can be used in various applications where FinFETs are incorporated for enhanced performance. For example, the FinFETs with multi-fin devices can be used to form static random-access memory (SRAM) cells. In other examples, the disclosed structure can be incorporated in various integrated circuits, such as logic circuit, dynamic random-access memory (DRAM), flash memory, or imaging sensor.

In one aspect, the present disclosure provides one embodiment of a method of forming an integrated circuit structure. The method includes receiving a substrate having a front surface and a back surface, wherein the substrate includes a first semiconductor layer of a first semiconductor material with a dielectric layer embedded underlying the first semiconductor layer; forming a stack of first semiconductor films and second semiconductor films interdigitated, the first semiconductor films and the second semiconductor films having different semiconductor materials; forming an isolation feature in the substrate and extending to the dielectric layer, thereby defining an active region surrounded by the isolation feature; forming a gate stack on the active regions and spanning between a first and a second source/drain (S/D) region associated with a first and second S/D features; forming a deep trench in the first S/D region from a frontside of the substrate and extending below a top surface of the isolation feature; filling a second semiconductor layer of a second semiconductor material in the deep trench, the second semiconductor material being different from the first semiconductor material; selectively removing the first semiconductor material underlying the second S/D feature from a backside of the substrate, resulting a trench; filling the trench with a dielectric material; and selectively removing the second semiconductor layer from the backside of the substrate, thereby forming a backside contact hole self-aligned with the first S/D feature.

In another aspect, the present disclosure provides one embodiment of a method of forming an integrated circuit structure. The method includes receiving a substrate having a front surface and a back surface, wherein the substrate includes a dielectric layer embedded therein, a first semiconductor layer of a first semiconductor material overlying the dielectric layer, and a stack of first semiconductor films and second semiconductor films over the first semiconductor layer, the first semiconductor films and the second semiconductor films having different semiconductor materials and being alternatively stacked; forming an isolation feature in the substrate and extending to the dielectric layer, thereby defining an active region surrounded by the isolation feature; forming a gate stack on the active regions and spanning between a first and a second source/drain (S/D) feature; forming a deep trench in the first S/D region from a frontside of the substrate and extending through the first semiconductor layer; filling a second semiconductor layer of a second semiconductor material in the deep trench, the second semiconductor material being different from the first semiconductor material; selectively removing the first semiconductor material underlying the second S/D feature from a backside of the substrate, resulting a trench; filling the trench with a dielectric material; selectively removing the second semiconductor layer from the backside of the substrate, thereby forming a backside contact hole self-aligned with the first S/D feature; and forming a backside contact feature in the backside contact hole.

In yet another aspect, the present disclosure provides a semiconductor structure that includes a substrate having a frontside and a backside; an active region extruded from the substrate and surrounded by an isolation feature; a gate stack formed on the front side of the substrate and disposed on the active region; a first and a second source/drain (S/D) feature formed on the active region and interposed by the gate stack; a frontside contact feature disposed on a top surface of the first S/D feature; a backside contact feature disposed on and electrically connected to a bottom surface of the second S/D feature; and a semiconductor layer disposed on a bottom surface of the first S/D feature with a first thickness and a bottom surface of the gate stack with a second thickness being greater than the first thickness.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming an integrated circuit structure, comprising:
receiving a substrate having a front surface and a back surface, wherein the substrate includes a first semiconductor layer of a first semiconductor material with a dielectric layer embedded underlying the first semiconductor layer;
forming a stack of first semiconductor films and second semiconductor films interdigitated, the first semiconductor films and the second semiconductor films having different semiconductor materials;

forming an isolation feature in the substrate and extending to the dielectric layer, thereby defining an active region surrounded by the isolation feature;

forming a gate stack on the active regions and spanning between a first and a second source/drain (S/D) region;

forming a deep trench in the first S/D region from a frontside of the substrate and extending below a top surface of the isolation feature;

filling a second semiconductor layer of a second semiconductor material in the deep trench, the second semiconductor material being different from the first semiconductor material;

forming a first and a second S/D feature in the first and second S/D region;

selectively removing the first semiconductor material underlying the second S/D feature from a backside of the substrate, resulting in a trench;

filling the trench with a dielectric material; and selectively removing the second semiconductor layer from the backside of the substrate, thereby forming a backside contact hole self-aligned with the first S/D feature.

2. The method of claim 1, further comprising forming a backside contact feature in the backside contact hole; and forming a frontside contact feature connected to a top surface of the second S/D feature.

3. The method of claim 2, further comprising forming a frontside interconnect structure on the gate stack, the first and second S/D features from the frontside, wherein the frontside interconnect structure connects to the second S/D feature through the frontside contact feature; and forming a backside interconnect structure on the backside of the substrate, wherein the backside interconnect structure connects to the first S/D feature through the backside contact feature.

4. The method of claim 1, wherein the second semiconductor layer is an undoped silicon layer.

5. The method of claim 1, wherein the substrate further includes a silicon germanium layer disposed over the dielectric layer, the selectively removing of the first semiconductor material includes performing an etching process that selectively removes silicon germanium.

6. The method of claim 1, wherein the second semiconductor layer is an undoped silicon germanium layer.

7. The method of claim 1, wherein the second semiconductor layer is a silicon layer doped with boron.

8. The method of claim 1, further comprising performing another etch to the isolation feature in the deep trench before the filling of the second semiconductor layer of the second semiconductor material in the deep trench.

9. The method of claim 1, wherein the selectively removing of the first semiconductor material underlying the second S/D region from the backside of the substrate includes selectively etching such that a bottom surface of the second S/D feature is exposed.

10. The method of claim 1, wherein the selectively removing of the first semiconductor material includes selectively etching the first semiconductor material such that the gate stack is exposed.

11. A method of forming an integrated circuit structure, comprising:

receiving a substrate having a front surface and a back surface, wherein the substrate includes a dielectric layer embedded therein, a first semiconductor layer of a first semiconductor material overlying the dielectric layer, and a stack of first semiconductor films and second semiconductor films over the first semiconductor layer, the first semiconductor films and the second semiconductor films having different semiconductor materials and being alternatively stacked;

forming an isolation feature in the substrate and extending to the dielectric layer, thereby defining an active region surrounded by the isolation feature;

forming a gate stack on the active regions and spanning between a first and a second source/drain (S/D) region;

forming a deep trench in the first S/D region from a frontside of the substrate and extending through the first semiconductor layer;

filling a second semiconductor layer of a second semiconductor material in the deep trench, the second semiconductor material being different from the first semiconductor material;

forming a first and a second S/D feature in the first and second S/D region;

selectively removing the first semiconductor material underlying the second S/D feature from a backside of the substrate, resulting in a trench;

filling the trench with a dielectric material;

selectively removing the second semiconductor layer from the backside of the substrate, thereby forming a backside contact hole self-aligned with the first S/D feature; and forming a backside contact feature in the backside contact hole.

12. The method of claim 11, further comprising forming a frontside contact feature connected to a top surface of the second S/D feature.

13. The method of claim 12, further comprising forming a frontside interconnect structure on the gate stack, the first and second S/D features from the frontside, wherein the frontside interconnect structure connects to the second S/D feature through the frontside contact feature; and forming a backside interconnect structure on the backside of the substrate, wherein the backside interconnect structure connects to the first S/D feature through the backside contact feature.

14. The method of claim 11, wherein the first semiconductor layer is a silicon germanium layer; and the second semiconductor layer is an undoped silicon layer.

15. The method of claim 11, wherein the selectively removing of the first semiconductor material includes performing an etching process that selectively removes silicon germanium.

16. The method of claim 11, further comprising:

bonding a carrier to the frontside of the substrate; and thinning down the substrate from the backside such that the isolation feature is exposed.

17. The method of claim 11, wherein the selectively removing of the first semiconductor material underlying the second S/D feature from the backside of the substrate includes selectively etching such that a bottom surface of the second S/D feature is exposed; and the selectively removing of the first semiconductor material includes selectively etching the first semiconductor material such that the gate stack is exposed.

18. A semiconductor structure, comprising:

a substrate having a frontside and a backside;

an active region extruded from the substrate and surrounded by an isolation feature;
a gate stack formed on a front side of the substrate and disposed on the active region;
a first and a second source/drain (S/D) feature formed on the active region and interposed by the gate stack;
a frontside contact feature disposed on a top surface of the first S/D feature;
a backside contact feature disposed on and electrically connected to a bottom surface of the second S/D feature;
a first semiconductor layer with a first thickness disposed on a bottom surface of the first S/D feature and a second semiconductor layer with a second thickness disposed on a bottom surface of the gate stack, the second thickness being greater than the first thickness; and
a dielectric layer disposed below and directly contacting the first and second semiconductor layers.

19. The semiconductor structure of claim 18, wherein the backside contact feature is surrounded by and directly contacts the isolation feature.

20. The semiconductor structure of claim 18, further comprising
a plurality of channels vertically stacked and formed in the active region;
inner spacers interposed between the gate stack and one of the first and second S/D features; and
the backside contact feature laterally contacting the semiconductor layer, the inner spacers and the isolation feature.

* * * * *